(12) United States Patent
Sotzing et al.

(10) Patent No.: US 11,932,813 B2
(45) Date of Patent: Mar. 19, 2024

(54) ELECTROCHROMIC MATERIALS; PREPARATION AND USE THEREOF

(71) Applicant: UNIVERSITY OF CONNECTICUT, Farmington, CT (US)

(72) Inventors: Gregory Allen Sotzing, Storrs, CT (US); Robert Adrian Daniels, Stafford Springs, CT (US)

(73) Assignee: UNIVERSITY OF CONNECTICUT, Farmington, CT (US)

( * ) Notice: Subject to any disclaimer, the term of this patent is extended or adjusted under 35 U.S.C. 154(b) by 0 days.

(21) Appl. No.: 17/748,392

(22) Filed: May 19, 2022

(65) Prior Publication Data

US 2022/0396728 A1    Dec. 15, 2022

Related U.S. Application Data

(60) Provisional application No. 63/190,950, filed on May 20, 2021.

(51) Int. Cl.
    *C09K 9/02*    (2006.01)
(52) U.S. Cl.
    CPC ........ *C09K 9/02* (2013.01); *C09K 2211/1416* (2013.01); *C09K 2211/1425* (2013.01)
(58) Field of Classification Search
    CPC .............. C09K 9/02; C09K 2211/1416; C09K 2211/1425; G02F 1/15165; G02F 2001/1517; H10K 50/135; H10K 85/151
    See application file for complete search history.

(56) References Cited

U.S. PATENT DOCUMENTS

| 5,326,830 A * | 7/1994 | Aharoni ................ C08G 81/00 525/181 |
| 5,895,807 A * | 4/1999 | Galko ................ C08G 63/189 528/307 |
| 6,552,107 B1 | 4/2003 | Paul et al. |

(Continued)

FOREIGN PATENT DOCUMENTS

| JP | 2011132408 A * | 7/2011 |
| KR | 20170025612 A * | 3/2017 | ............ C08L 101/00 |

(Continued)

OTHER PUBLICATIONS

Mengfang Li, Omer A. Yassin, Yumin Zhu, Michael T. Otley, Gregory A. Sotzing, Colorless to black electrochromic devices using subtractive color mixing of two electrochromes: A conjugated polymer with a small organic molecule, Organic Electronics 84 (2020) 105748 (Year: 2020).*

(Continued)

*Primary Examiner* — Bijan Ahvazi

(74) *Attorney, Agent, or Firm* — CANTOR COLBURN LLP

(57) ABSTRACT

Disclosed herein are new electrochromic materials, including small molecule, oligomeric, and polymeric electrochromic materials, and compositions comprising the electrochromic materials and a salt. Further disclosed are (Continued)

electrochromic devices prepared from the electrochromic materials and electrochromic material compositions. Also disclosed are melt processable polymeric electrochromic materials, melt processable compositions comprising the melt processable polymeric electrochromic material, and a salt; and devices prepared therefrom.

20 Claims, 20 Drawing Sheets

(56) References Cited

U.S. PATENT DOCUMENTS

| | | | |
|---|---|---|---|
| 9,975,989 | B2 | 5/2018 | Mei et al. |
| 2008/0275206 | A1 | 11/2008 | Kamps et al. |
| 2009/0239975 | A1* | 9/2009 | Jung ............... C08L 69/00 |
| | | | 524/506 |
| 2011/0147680 | A1 | 6/2011 | Percec et al. |
| 2012/0154890 | A1 | 6/2012 | Jeon et al. |
| 2013/0141916 | A1 | 6/2013 | Kobayashi et al. |
| 2013/0242369 | A1 | 9/2013 | Fukushima et al. |
| 2016/0377946 | A1* | 12/2016 | Baumann ............. C08K 5/3432 |
| | | | 359/265 |
| 2018/0100056 | A1* | 4/2018 | Wang .................. G02F 1/13439 |

FOREIGN PATENT DOCUMENTS

| | | |
|---|---|---|
| WO | 0051806 A2 | 3/2000 |
| WO | 0052085 A1 | 9/2000 |
| WO | 2012036291 A1 | 3/2012 |

OTHER PUBLICATIONS

Yuichi Watanabe et al., "Electrochromic properties of the polyethylene terephthalate derivative film-modified electrode", Polymers Advanced Technology, Speical Issue: Research Article, vol. 22, Jun. 15, 2011, pp. 1283-1285.

International Search Report/Written Opinion for Application No. PCT/US2022/029971; International Filing date: May 19, 2022; dated Oct. 4, 2022; 17 pages.

Li et al., Colorless to black electrochromic devices using subtractive color mixing of two electrochromes; A conjugated polymer with a small organic molecule, Organic Electronics, vol. 84, Apr. 18, 2020, pp. 1-5.

* cited by examiner

ELECTROCHROMIC MATERIALS; PREPARATION AND USE THEREOF

CROSS-REFERENCE TO RELATED APPLICATIONS

This application claims priority to U.S. Provisional Application No. 63/190,950, filed May 20, 2021, which is incorporated by reference in its entirety for all purposes.

BACKGROUND

The color switching accompanied with external bias is defined as electrochromism, where the external bias triggers either a change of molecular stack or electron transfer (redox process). Electrochromic materials that exhibit the necessary colors for RGB and CMYK color replication have been sought after by the display industry.

An electrochromic device is a self-contained, two-electrode (or more) electrolytic cell that includes an electrolyte and one or more electrochromic materials. Electrochromic materials can be organic or inorganic, and reversibly change visible color when oxidized or reduced in response to an applied electrical potential. Electrochromic devices are therefore constructed so as to modulate incident electromagnetic radiation via transmission, absorption, or reflection of the light upon the application of an electric field across the electrodes. The electrodes and electrochromic materials used in the devices are dependent on the type of device, i.e., absorptive/transmissive or absorptive/reflective.

Known electrochromic materials include inorganic materials such as indium-doped tin oxide (ITO) and fluorine-doped tin oxide ($SnO_2$:F), and organic conjugated polymers such as poly(3,4-ethylenedioxythiophene)-poly(styrene sulfonate) (PEDOT-PSS) and polyaniline.

Drawbacks of the electrochromic inorganic materials and conjugated polymers include processing limitations including their inability to be melt processed.

There remains a need in the art for new electrochromic materials that can be easily processed, including melt processed.

BRIEF SUMMARY

In one embodiment, an electrochromic material composition, comprises a salt; a small molecule organic electrochromic material of formula (I), (I-A), (II), (II-A), or (III), a polymer or copolymer electrochromic of formula (IV), (V), (V-A), (VI), or (VI-A), or a combination thereof; and optionally a plasticizer, a solvent, or a combination thereof; wherein

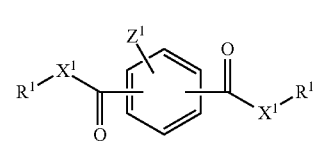

(I)

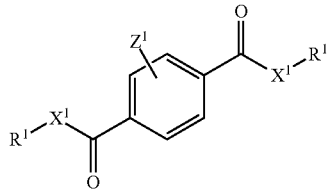

(I-A)

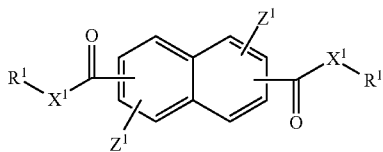

(II)

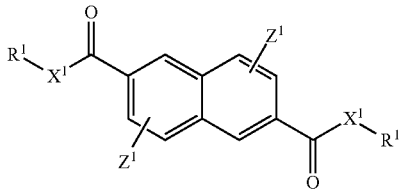

(II-A)

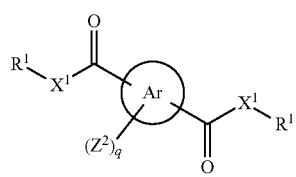

(III)

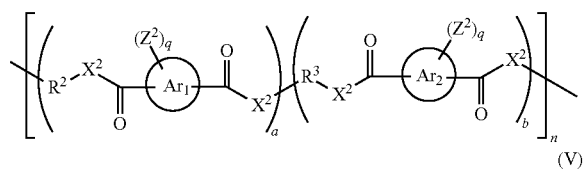

(IV)

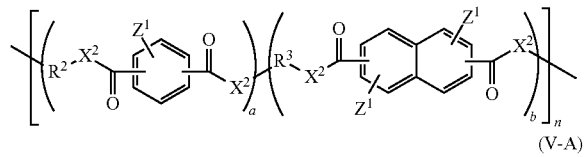

(V)

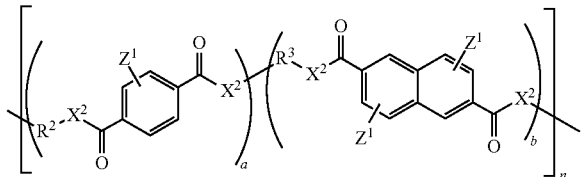

(V-A)

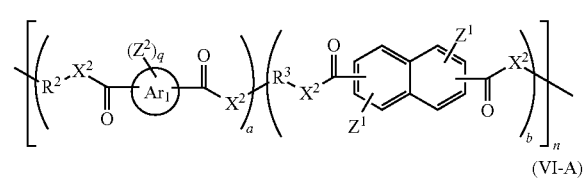

(VI)

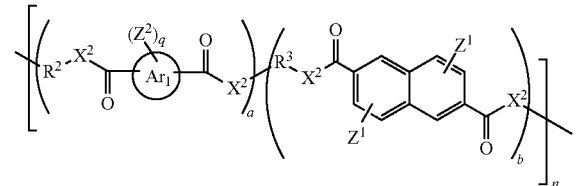

(VI-A)

wherein each $X^1$ independently is O, S, or NR; R is H, $C_{1-20}$ alkyl, specifically $C_{1-10}$ alkyl, more specifically $C_{1-6}$ alkyl, and yet more specifically methyl, ethyl, propyl, butyl, pentyl, hexyl, heptyl, or octyl;

each $R^1$ independently is $C_{1-20}$ alkyl, specifically $C_{1-10}$ alkyl, more specifically $C_{1-6}$ alkyl;

each $Z^1$ independently is H, $C_{1-20}$ alkyl, specifically $C_{1-10}$ alkyl, more specifically $C_{1-6}$ alkyl, halogen, nitro, cyano, hydroxyl, $C_6$-$C_{12}$ aryl, $C_3$-$C_{20}$ cycloalkyl, $C_1$-$C_{20}$ alkyl, $C_1$-$C_{20}$ alkoxy, $C_1$-$C_{20}$ alkylthio, $C_1$-$C_{20}$ haloalkyl, amino, $C_1$-$C_{12}$ alkylamino, or $C_1$-$C_{12}$ diaminoalkyl;

Ar is an aromatic group, specifically anthracene, benzophenone, 2,1,3-benzothiadiazole, biphenyl, dibenzofuran, dibenzothiophene, diphenylfulvene, 1,3-diphenylisobenzofuran, 2,2'-dipyridyl, 4,4'-dipyridyl, fluorene, fluorenone, naphthyl, 2-nitrobiphenyl, phenanthrene, phenyl, pyrene, terphenyl, or triphenylene;

each $Z^2$ independently is $C_{1-20}$ alkyl, specifically $C_{1-10}$ alkyl, more specifically $C_{1-6}$ alkyl, halogen, nitro, cyano, hydroxyl, $C_6$-$C_{12}$ aryl, $C_3$-$C_{20}$ cycloalkyl, $C_1$-$C_{20}$ alkyl, $C_1$-$C_{20}$ alkoxy, $C_1$-$C_{20}$ alkylthio, $C_1$-$C_{20}$ haloalkyl, amino, $C_1$-$C_{12}$ alkylamino, or $C_1$-$C_{12}$ diaminoalkyl;

q is 0, 1, 2, 3, or 4, specifically 0, 1, or 2;

Ar1 and Ar2 each independently is an aromatic group, specifically anthracene, benzophenone, 2,1,3-benzothiadiazole, biphenyl, dibenzofuran, dibenzothiophene, diphenylfulvene, 1,3-diphenylisobenzofuran, 2,2'-dipyridyl, 4,4'-dipyridyl, fluorene, fluorenone, naphthyl, 2-nitrobiphenyl, phenanthrene, phenyl, pyrene, pyridyl, terphenyl, or triphenylene;

each $X^2$ independently is O, S, or NR;

each $R^2$ and $R^3$ independently is
$C_{1-20}$ alkylene, specifically $C_{1-10}$ alkylene, more specifically $C_{1-6}$ alkylene, or
a poly(alkylene ether), a poly(alkylene glycol) comprising ethyleneoxy, propyleneoxy, and butyleneoxy repeating units containing 2-20 carbon atoms, specifically 2-10 carbon atoms, and more specifically 2-6 carbon atoms, or
a $C_{4-40}$ alkylene chain wherein the chain comprises 1, 2, 3, or 4 $Q^1$ groups within the backbone of the chain, specifically 1 or 2 $Q^1$ groups, wherein each $Q^1$ independently is O, S, —O(C=O)—, —(O=C)O—, —S(C=O)—, or —(O=C)S—;

a is about 1 to about 99 mol %, specifically about 5 to about 95 mol %, and more specifically about 40 to about 60 mol % (for color neutral);

b is about 1 to about 99 mol %, specifically about 5 to about 95 mol %, and more specifically about 40 to about 60 mol % (for color neutral); and n is about 10,000 to about 100,000 g/mol.

In another embodiment, a method comprises heating an electrochromic material composition to form a melt; and extruding or molding the melt to form a melt processed electrochromic material composition, wherein the molding is injection molding, blow molding, rotational molding, or compression molding and the extruding is cast film extrusion; the electrochromic material composition comprises a salt; a polymer or copolymer electrochromic of formula (IV), (V), (V-A), (VI), or (VI-A), or a combination thereof; and optionally a plasticizer; wherein

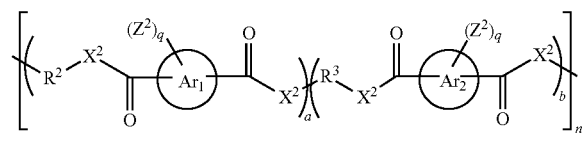
(IV)

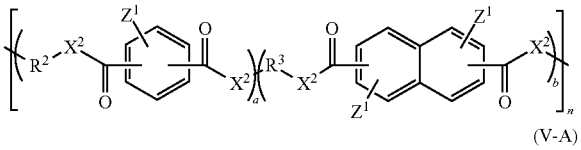
(V)

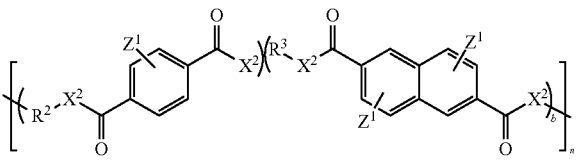
(V-A)

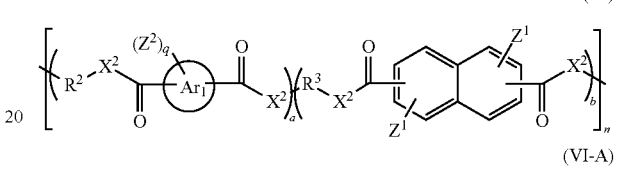
(VI)

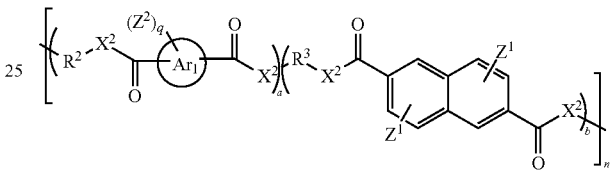
(VI-A)

wherein
each $Z^1$ independently is H, $C_{1-20}$ alkyl, specifically $C_{1-10}$ alkyl, more specifically $C_{1-6}$ alkyl, halogen, nitro, cyano, hydroxyl, $C_6$-$C_{12}$ aryl, $C_3$-$C_{20}$ cycloalkyl, $C_1$-$C_{20}$ alkyl, $C_1$-$C_{20}$ alkoxy, $C_1$-$C_{20}$ alkylthio, $C_1$-$C_{20}$ haloalkyl, amino, $C_1$-$C_{12}$ alkylamino, or $C_1$-$C_{12}$ diaminoalkyl;

each $Z^2$ independently is $C_{1-20}$ alkyl, specifically $C_{1-10}$ alkyl, more specifically $C_{1-6}$ alkyl, halogen, nitro, cyano, hydroxyl, $C_6$-$C_{12}$ aryl, $C_3$-$C_{20}$ cycloalkyl, $C_1$-$C_{20}$ alkyl, $C_1$-$C_{20}$ alkoxy, $C_1$-$C_{20}$ alkylthio, $C_1$-$C_{20}$ haloalkyl, amino, $C_1$-$C_{12}$ alkylamino, or $C_1$-$C_{12}$ diaminoalkyl;

q is 0, 1, 2, 3, or 4, specifically 0, 1, or 2;

Ar1 and Ar2 each independently is an aromatic group, specifically anthracene, benzophenone, 2,1,3-benzothiadiazole, biphenyl, dibenzofuran, dibenzothiophene, diphenylfulvene, 1,3-diphenylisobenzofuran, 2,2'-dipyridyl, 4,4'-dipyridyl, fluorene, fluorenone, naphthyl, 2-nitrobiphenyl, phenanthrene, phenyl, pyrene, pyridyl, terphenyl, or triphenylene;

each $X^2$ independently is O, S, or NR, R is H, $C_{1-20}$ alkyl, specifically $C_{1-10}$ alkyl, more specifically $C_{1-6}$ alkyl, and yet more specifically methyl, ethyl, propyl, butyl, pentyl, hexyl, heptyl, or octyl;

each $R^2$ and $R^3$ independently is
$C_{1-20}$ alkylene, specifically $C_{1-10}$ alkylene, more specifically $C_{1-6}$ alkylene, or
a poly(alkylene ether), a poly(alkylene glycol) comprising ethyleneoxy, propyleneoxy, and butyleneoxy repeating units containing 2-20 carbon atoms, specifically 2-10 carbon atoms, and more specifically 2-6 carbon atoms, or
a $C_{4-40}$ alkylene chain wherein the chain comprises 1, 2, 3, or 4 $Q^1$ groups within the backbone of the chain, specifically 1 or 2 $Q^1$ groups, wherein each $Q^1$ independently is O, S, —O(C=O)—, —(O=C)O—, —S(C=O)—, or —(O=C)S—;

a is about 1 to about 99 mol %, specifically about 5 to about 95 mol %, and more specifically about 40 to about 60 mol %;

b is about 1 to about 99 mol %, specifically about 5 to about 95 mol %, and more specifically about 40 to about 60 mol %; and n is about 10,000 to about 100,000 g/mol.

In another embodiment, a method of forming an electrochromic film, comprises providing a solution or homogeneous suspension comprising a salt; a solvent; a small molecule organic electrochromic material of formula (I), (I-A), (II), (II-A), or (III), a polymer or copolymer electrochromic of formula (IV), (V), (V-A), (VI), or (VI-A), or a combination thereof and optionally a plasticizer; and forming an electrochromic film from the solution or suspension, wherein the small molecule organic electrochromic material of formula (I), (I-A), (II), (II-A), (III), and polymer or copolymer electrochromic of formula (IV), (V), (V-A), (VI), (VI-A) have the structures:

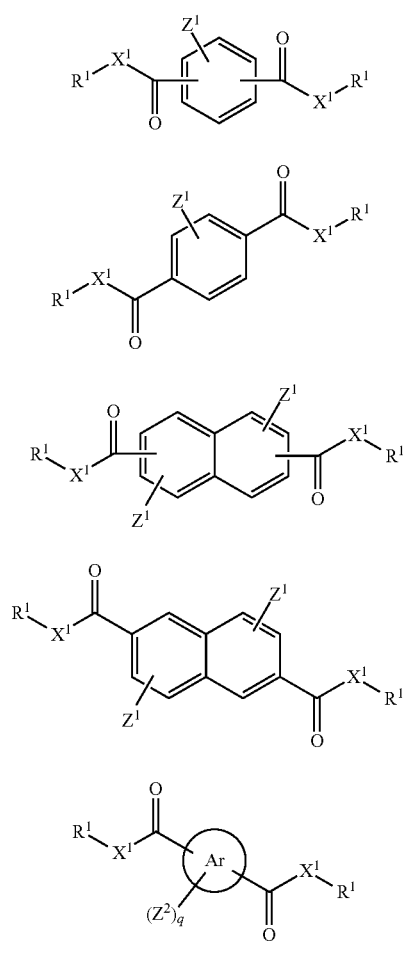
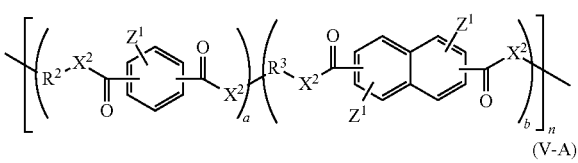
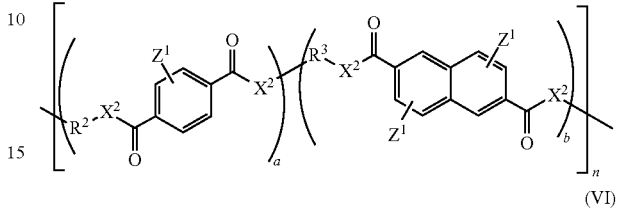
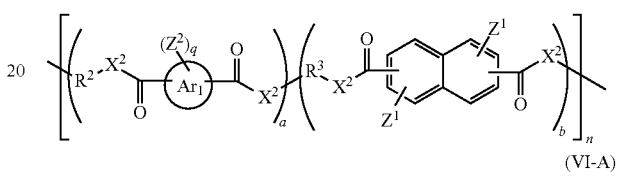
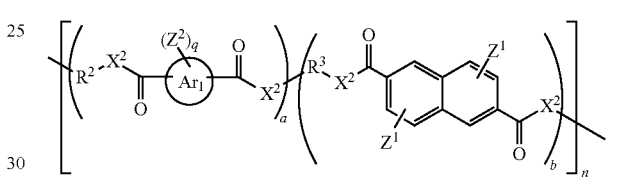

each $X^1$ independently is O, S, or NR; R is H, $C_{1-20}$ alkyl, specifically $C_{1-10}$ alkyl, more specifically $C_{1-6}$ alkyl, and yet more specifically methyl, ethyl, propyl, butyl, pentyl, hexyl, heptyl, or octyl;

each $R^1$ independently is $C_{1-20}$ alkyl, specifically $C_{1-10}$ alkyl, more specifically $C_{1-6}$ alkyl;

each $Z^1$ independently is H, $C_{1-20}$ alkyl, specifically $C_{1-10}$ alkyl, more specifically $C_{1-6}$ alkyl, halogen, nitro, cyano, hydroxyl, $C_6$-$C_{12}$ aryl, $C_3$-$C_{20}$ cycloalkyl, $C_1$-$C_{20}$ alkyl, $C_1$-$C_{20}$ alkoxy, $C_1$-$C_{20}$ alkylthio, $C_1$-$C_{20}$ haloalkyl, amino, $C_1$-$C_{12}$ alkylamino, or $C_1$-$C_{12}$ diaminoalkyl;

Ar is an aromatic group, specifically anthracene, benzophenone, 2,1,3-benzothiadiazole, biphenyl, dibenzofuran, dibenzothiophene, diphenylfulvene, 1,3-diphenylisobenzofuran, 2,2'-dipyridyl, 4,4'-dipyridyl, fluorene, fluorenone, naphthyl, 2-nitrobiphenyl, phenanthrene, phenyl, pyrene, terphenyl, or triphenylene;

each $Z^2$ independently is $C_{1-20}$ alkyl, specifically $C_{1-10}$ alkyl, more specifically $C_{1-6}$ alkyl, halogen, nitro, cyano, hydroxyl, $C_6$-$C_{12}$ aryl, $C_3$-$C_{20}$ cycloalkyl, $C_1$-$C_{20}$ alkyl, $C_1$-$C_{20}$ alkoxy, $C_1$-$C_{20}$ alkylthio, $C_1$-$C_{20}$ haloalkyl, amino, $C_1$-$C_{12}$ alkylamino, or $C_1$-$C_{12}$ diaminoalkyl;

q is 0, 1, 2, 3, or 4, specifically 0, 1, or 2;

Ar1 and Ar2 each independently is an aromatic group, specifically anthracene, benzophenone, 2,1,3-benzothiadiazole, biphenyl, dibenzofuran, dibenzothiophene, diphenylfulvene, 1,3-diphenylisobenzofuran, 2,2'-dipyridyl, 4,4'-dipyridyl, fluorene, fluorenone, naphthyl, 2-nitrobiphenyl, phenanthrene, phenyl, pyrene, pyridyl, terphenyl, or triphenylene;

each $X^2$ independently is O, S, or NR;
each $R^2$ and $R^3$ independently is
$C_{1-20}$ alkylene, specifically $C_{1-10}$ alkylene, more specifically $C_{1-6}$ alkylene, or a poly(alkylene ether), a poly(alkylene glycol) comprising ethyleneoxy, propyleneoxy, and butyleneoxy repeating units containing 2-20 carbon atoms, specifically 2-10 carbon atoms, and more specifically 2-6 carbon atoms, or a $C_{4-40}$ alkylene chain wherein the chain comprises 1, 2, 3, or 4 $Q^1$ groups within the backbone of the chain, specifically 1 or 2 $Q^1$ groups, wherein each $Q^1$ independently is O, S, —O(C=O)—, —(O=C)O—, —S(C=O)—, or —(O=C)S—;

a is about 1 to about 99 mol %, specifically about 5 to about 95 mol %, and more specifically about 40 to about 60 mol % (for color neutral);

b is about 1 to about 99 mol %, specifically about 5 to about 95 mol %, and more specifically about 40 to about 60 mol % (for color neutral); and n is about 10,000 to about 100,000 g/mol.

In a further embodiment, a method of preparing a copolymer electrochromic material, comprises reacting a first polyester with a second polyester in a transesterification process to form a copolymer electrochromic material, wherein the copolymer electrochromic material is of formula (IV), (V), (V-A), (VI), or (VI-A)

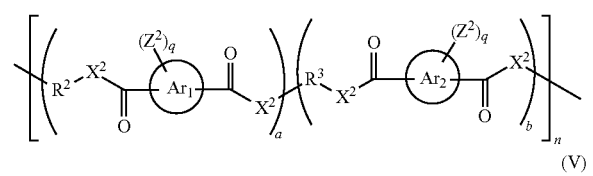

(IV)

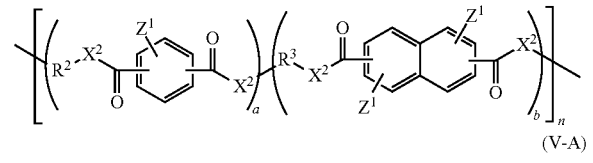

(V)

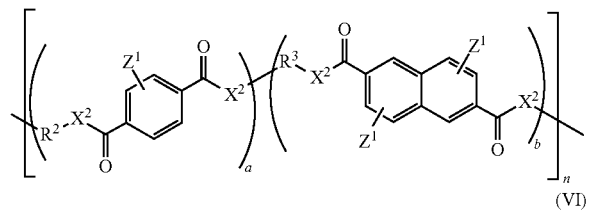

(V-A)

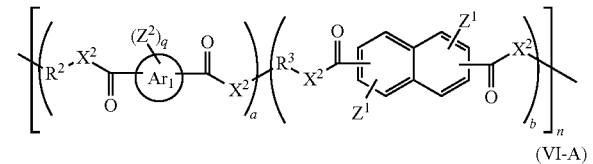

(VI)

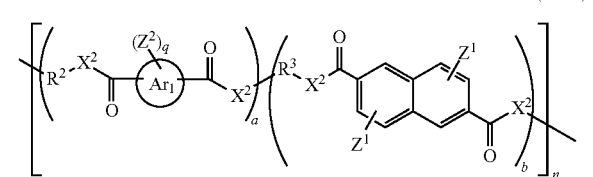

(VI-A)

wherein each $Z^1$ independently is H, $C_{1-20}$ alkyl, specifically $C_{1-10}$ alkyl, more specifically $C_{1-6}$ alkyl, halogen, nitro, cyano, hydroxyl, $C_6$-$C_{12}$ aryl, $C_3$-$C_{20}$ cycloalkyl, $C_1$-$C_{20}$ alkyl, $C_1$-$C_{20}$ alkoxy, $C_1$-$C_{20}$ alkylthio, $C_1$-$C_{20}$ haloalkyl, amino, $C_1$-$C_{12}$ alkylamino, or $C_1$-$C_{12}$ diaminoalkyl;

each $Z^2$ independently is $C_{1-20}$ alkyl, specifically $C_{1-10}$ alkyl, more specifically $C_{1-6}$ alkyl, halogen, nitro, cyano, hydroxyl, $C_6$-$C_{12}$ aryl, $C_3$-$C_{20}$ cycloalkyl, $C_1$-$C_{20}$ alkyl, $C_1$-$C_{20}$ alkoxy, $C_1$-$C_{20}$ alkylthio, $C_1$-$C_{20}$ haloalkyl, amino, $C_1$-$C_{12}$ alkylamino, or $C_1$-$C_{12}$ diaminoalkyl;

q is 0, 1, 2, 3, or 4, specifically 0, 1, or 2;

Ar1 and Ar2 each independently is an aromatic group, specifically anthracene, benzophenone, 2,1,3-benzothiadiazole, biphenyl, dibenzofuran, dibenzothiophene, diphenylfulvene, 1,3-diphenylisobenzofuran, 2,2'-dipyridyl, 4,4'-dipyridyl, fluorene, fluorenone, naphthyl, 2-nitrobiphenyl, phenanthrene, phenyl, pyrene, pyridyl, terphenyl, or triphenylene;

each $X^2$ independently is O, S, or NR, R is H, $C_{1-20}$ alkyl, specifically $C_{1-10}$ alkyl, more specifically $C_{1-6}$ alkyl, and yet more specifically methyl, ethyl, propyl, butyl, pentyl, hexyl, heptyl, or octyl, wherein at least one $X^2$ is O;

each $R^2$ and $R^3$ independently is $C_{1-20}$ alkylene, specifically $C_{1-10}$ alkylene, more specifically $C_{1-6}$ alkylene, or a poly(alkylene ether), a poly(alkylene glycol) comprising ethyleneoxy, propyleneoxy, and butyleneoxy repeating units containing 2-20 carbon atoms, specifically 2-10 carbon atoms, and more specifically 2-6 carbon atoms, or a $C_{4-40}$ alkylene chain wherein the chain comprises 1, 2, 3, or 4 $Q^1$ groups within the backbone of the chain, specifically 1 or 2 $Q^1$ groups, wherein each $Q^1$ independently is O, S, —O(C=O)—, —(O=C)O—, —S(C=O)—, or —(O=C)S—;

a is about 1 to about 99 mol %, specifically about 5 to about 95 mol %, and more specifically about 40 to about 60 mol %;

b is about 1 to about 99 mol %, specifically about 5 to about 95 mol %, and more specifically about 40 to about 60 mol %; and n is about 10,000 to about 100,000 g/mol.

Electrochromic devices and articles prepared from the electrochromic material composition are disclosed.

In a further embodiment, an electrochromic device comprises an electrochromic layer comprising an electrochromic material composition, and an electrolyte layer, wherein the electrochromic layer is adjacent to the electrolyte layer; wherein the electrochromic material composition is a small molecule organic electrochromic material of formula (I), (I-A), (II), (II-A), or (III), a polymer or copolymer electrochromic of formula (IV), (V), (V-A), (VI), or (VI-A), or a combination thereof; wherein

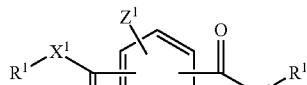

(I)

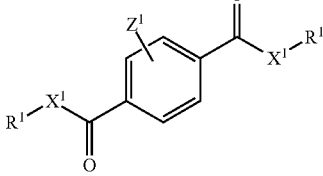

(I-A)

-continued

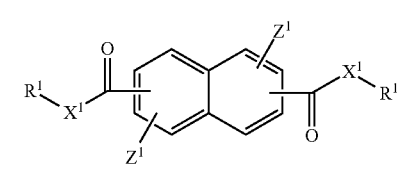
(II)

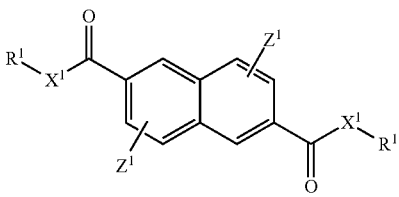
(II-A)

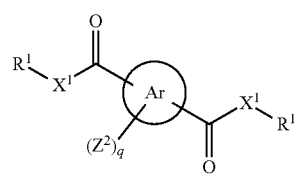
(III)

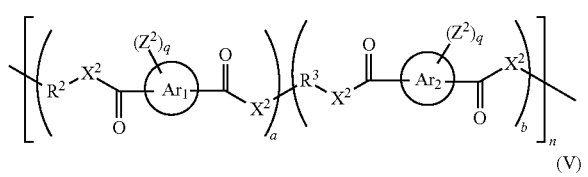
(IV)

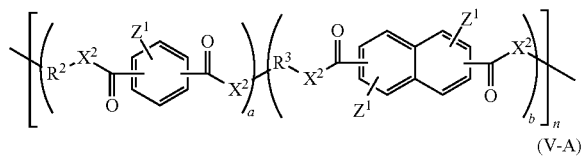
(V)

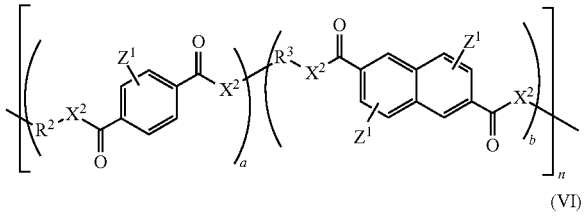
(V-A)

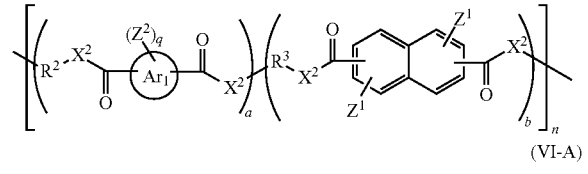
(VI)

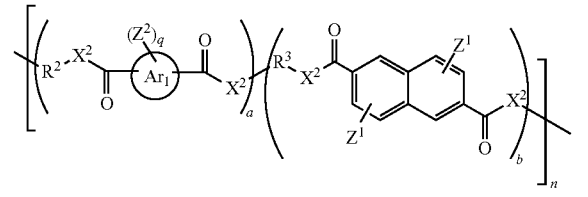
(VI-A)

wherein each $X^1$ independently is O, S, or NR; R is H, $C_{1-20}$ alkyl, specifically $C_{1-10}$ alkyl, more specifically $C_{1-6}$ alkyl, and yet more specifically methyl, ethyl, propyl, butyl, pentyl, hexyl, heptyl, or octyl;

each $R^1$ independently is $C_{1-20}$ alkyl, specifically $C_{1-10}$ alkyl, more specifically $C_{1-6}$ alkyl;

each $Z^1$ independently is H, $C_{1-20}$ alkyl, specifically $C_{1-10}$ alkyl, more specifically $C_{1-6}$ alkyl, halogen, nitro, cyano, hydroxyl, $C_6$-$C_{12}$ aryl, $C_3$-$C_{20}$ cycloalkyl, $C_1$-$C_{20}$ alkyl, $C_1$-$C_{20}$ alkoxy, $C_1$-$C_{20}$ alkylthio, $C_1$-$C_{20}$ haloalkyl, amino, $C_1$-$C_{12}$ alkylamino, or $C_1$-$C_{12}$ diaminoalkyl;

Ar is an aromatic group, specifically anthracene, benzophenone, 2,1,3-benzothiadiazole, biphenyl, dibenzofuran, dibenzothiophene, diphenylfulvene, 1,3-diphenylisobenzofuran, 2,2'-dipyridyl, 4,4'-dipyridyl, fluorene, fluorenone, naphthyl, 2-nitrobiphenyl, phenanthrene, phenyl, pyrene, terphenyl, or triphenylene;

each $Z^2$ independently is $C_{1-20}$ alkyl, specifically $C_{1-10}$ alkyl, more specifically $C_{1-6}$ alkyl, halogen, nitro, cyano, hydroxyl, $C_6$-$C_{12}$ aryl, $C_3$-$C_{20}$ cycloalkyl, $C_1$-$C_{20}$ alkyl, $C_1$-$C_{20}$ alkoxy, $C_1$-$C_{20}$ alkylthio, $C_1$-$C_{20}$ haloalkyl, amino, $C_1$-$C_{12}$ alkylamino, or $C_1$-$C_{12}$ diaminoalkyl;

q is 0, 1, 2, 3, or 4, specifically 0, 1, or 2;

Ar1 and Ar2 each independently is an aromatic group, specifically anthracene, benzophenone, 2,1,3-benzothiadiazole, biphenyl, dibenzofuran, dibenzothiophene, diphenylfulvene, 1,3-diphenylisobenzofuran, 2,2'-dipyridyl, 4,4'-dipyridyl, fluorene, fluorenone, naphthyl, 2-nitrobiphenyl, phenanthrene, phenyl, pyrene, pyridyl, terphenyl, or triphenylene;

each $X^2$ independently is O, S, or NR;

each $R^2$ and $R^3$ independently is $C_{1-20}$ alkylene, specifically $C_{1-10}$ alkylene, more specifically $C_{1-6}$ alkylene, or a poly(alkylene ether), a poly(alkylene glycol) comprising ethyleneoxy, propyleneoxy, and butyleneoxy repeating units containing 2-20 carbon atoms, specifically 2-10 carbon atoms, and more specifically 2-6 carbon atoms, or a $C_{4-40}$ alkylene chain wherein the chain comprises 1, 2, 3, or 4 $Q^1$ groups within the backbone of the chain, specifically 1 or 2 $Q^1$ groups, wherein each $Q^1$ independently is O, S, —O(C=O)—, —(O=C)O—, —S(C=O)—, or —(O=C)S—;

a is about 1 to about 99 mol %, specifically about 5 to about 95 mol %, and more specifically about 40 to about 60 mol % (for color neutral);

b is about 1 to about 99 mol %, specifically about 5 to about 95 mol %, and more specifically about 40 to about 60 mol % (for color neutral); and n is about 10,000 to about 100,000 g/mol; and wherein the electrochromic material composition optionally further comprises a plasticizer, a solvent, or a combination thereof.

DETAILED DESCRIPTION

Figure 1:
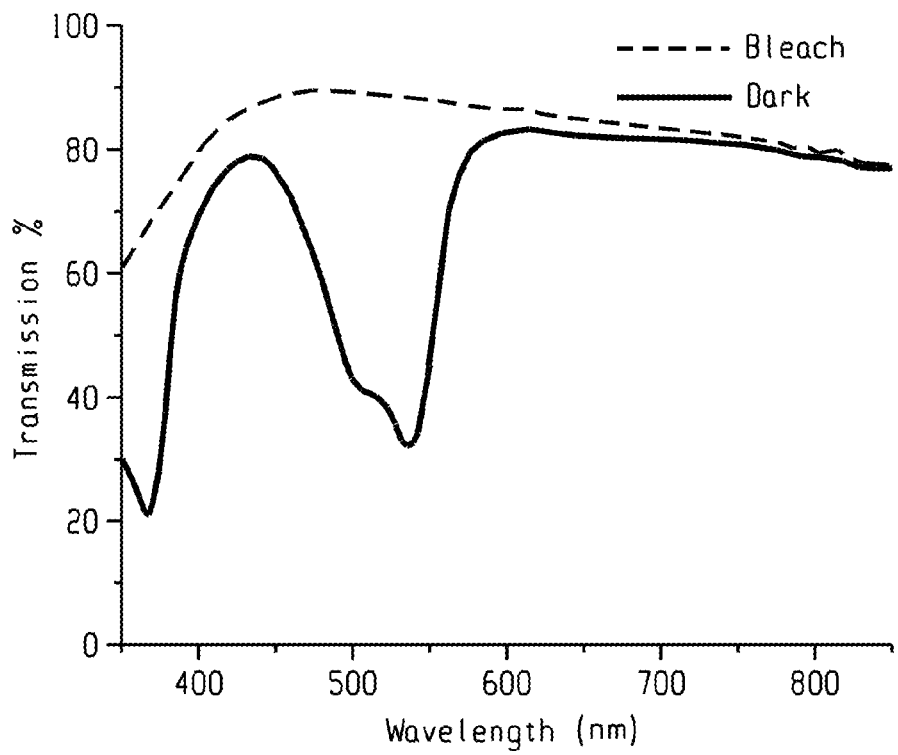
FIG. 1 illustrates transmission data in bleach state (0 V) and dark state (−4.5 V) versus ground potential for an electrochromic device using benzenedicarboxylic acid, 1,4-dihexyl ester as a chromophore.

Disclosed herein are new electrochromic materials, including small molecule, oligomeric, and polymeric electrochromic materials, and compositions comprising the electrochromic materials and a salt. Further disclosed are electrochromic devices prepared from the electrochromic materials and electrochromic material compositions. Also disclosed are melt processable polymeric electrochromic materials, melt processable compositions comprising the melt processable polymeric electrochromic material and a salt in a homogeneous mixture; and devices prepared therefrom. Being able to be melt processed allows for solvent free processing into a variety of shapes, sizes, and contours including films, structures, fiber for various applications.

Electrochromic Materials

Small Molecule Organic (SMO) Electrochromic Dyes:

SMO electrochromic material includes phenyl compounds of formula (I) and (I-

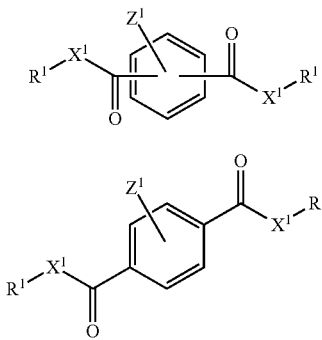

wherein each $X^1$ independently is O, S, or NR; R is H, $C_{1-20}$ alkyl, specifically $C_{1-10}$ alkyl, more specifically $C_{1-6}$ alkyl, and yet more specifically methyl, ethyl, propyl, butyl, pentyl, hexyl, heptyl, or octyl; each $R^1$ independently is $C_{1-20}$ alkyl, specifically $C_{1-10}$ alkyl, more specifically $C_{1-6}$ alkyl, and yet more specifically methyl, ethyl, propyl, butyl, pentyl, hexyl, heptyl, or octyl; each $Z^1$ independently is H, $C_{1-20}$ alkyl, specifically $C_{1-10}$ alkyl, more specifically $C_{1-6}$ alkyl, halogen, nitro, cyano, hydroxyl, $C_6$-$C_{12}$ aryl, $C_3$-$C_{20}$ cycloalkyl, $C_1$-$C_{20}$ alkyl, $C_1$-$C_{20}$ alkoxy, $C_1$-$C_{20}$ alkylthio, $C_1$-$C_{20}$ haloalkyl, amino, $C_1$-$C_{12}$ alkylamino, or $C_1$-$C_{12}$ diaminoalkyl.

SMO electrochromic material includes naphthyl compounds of formula (II) and (II-A)

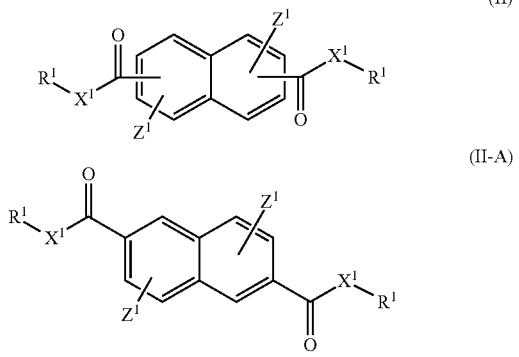

wherein each $X^1$ independently is O, S, or NR; R is H, $C_{1-20}$ alkyl, specifically $C_{1-10}$ alkyl, more specifically $C_{1-6}$ alkyl, and yet more specifically methyl, ethyl, propyl, butyl, pentyl, hexyl, heptyl, or octyl; each $R^1$ independently is $C_{1-20}$ alkyl, specifically $C_{1-10}$ alkyl, more specifically $C_{1-6}$ alkyl; each $Z^1$ independently is H, $C_{1-20}$alkyl, specifically $C_{1-10}$ alkyl, more specifically $C_{1-6}$ alkyl, halogen, nitro, cyano, hydroxyl, $C_6$-$C_{12}$ aryl, $C_3$-$C_{20}$ cycloalkyl, $C_1$-$C_{20}$ alkyl, $C_1$-$C_{20}$ alkoxy, $C_1$-$C_{20}$ alkylthio, $C_1$-$C_{20}$ haloalkyl, amino, $C_1$-$C_{12}$ alkylamino, or $C_1$-$C_{12}$ diaminoalkyl.

SMO electrochromic material includes aromatic compounds of formula (III)

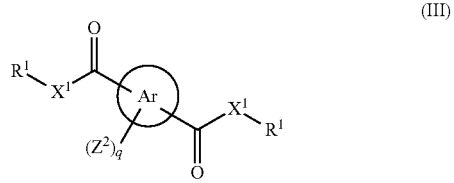

wherein Ar is an aromatic group, specifically anthracene, benzophenone, 2,1,3-benzothiadiazole, biphenyl, dibenzofuran, dibenzothiophene, diphenylfulvene, 1,3-diphenylisobenzofuran, 2,2'-dipyridyl, 4,4'-dipyridyl, fluorene, fluorenone, naphthyl, 2-nitrobiphenyl, phenanthrene, phenyl, pyrene, terphenyl, or triphenylene; each $X^1$ independently is O, S, or NR; R is H, $C_{1-20}$ alkyl, specifically $C_{1-10}$ alkyl, more specifically $C_{1-6}$ alkyl, and yet more specifically methyl, ethyl, propyl, butyl, pentyl, hexyl, heptyl, or octyl; each $R^1$ independently is $C_{1-20}$ alkyl, specifically $C_{1-10}$ alkyl, more specifically $C_{1-6}$ alkyl; each $Z^2$ independently is $C_{1-20}$ alkyl, specifically $C_{1-10}$ alkyl, more specifically $C_{1-6}$ alkyl, halogen, nitro, cyano, hydroxyl, $C_6$-$C_{12}$ aryl, $C_3$-$C_{20}$ cycloalkyl, $C_1$-$C_{20}$ alkyl, $C_1$-$C_{20}$ alkoxy, $C_1$-$C_{20}$ alkylthio, $C_1$-$C_{20}$ haloalkyl, amino, $C_1$-$C_{12}$ alkylamino, or $C_1$-$C_{12}$ diaminoalkyl; and q is 0, 1, 2, 3, or 4, specifically 0, 1, or 2.

Compositions comprising a salt and a SMO electrochromic material of formula (I), (I-A), (II), (II-A), (III), or a combination thereof, are described further herein.

The compounds of formula (I), (I-A), (II), (II-A), and (III) can be prepared by esterification, thioesterification, or amidation of the starting dicarboxylic acid of the corresponding aromatic group, e.g., terephthalic acid (benzene-1,4-dicarboxylic acid), benzene-1,3-dicarboxylic acid, pyridine-2,5-dicarboxylic acid, naphthalene-2,6-dicarboxylic acid, 1,4-naphthalenedicarboxylic acid, and the like. Alternatively, the compounds can be prepared starting from an activated dicarboxylic acid of the corresponding aromatic group, including acid chlorides. In yet another alternative, the starting material can be a dicarboxylic acid ester group. Selection of the particular synthetic route can be made by one having ordinary skill in the art without undue experimentation.

Polymer and Copolymer Electrochromic Materials:

Polymer and Copolymer electrochromic materials include the polymers and copolymers of formula (IV), (V), (V-A), (VI), or (VI-A).

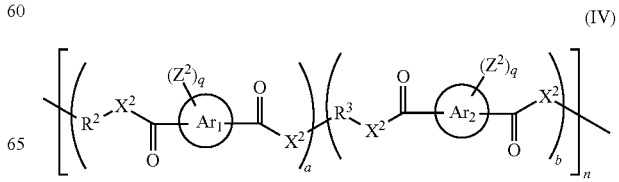

-continued

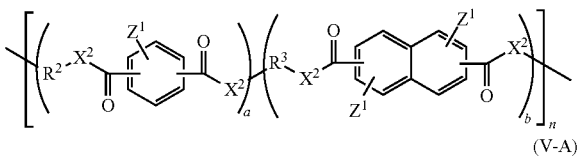

(V)

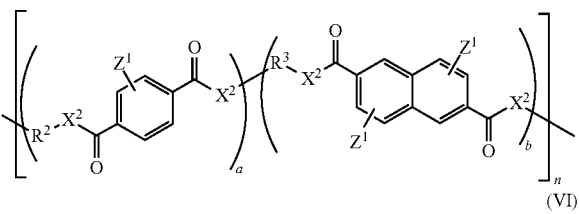

(V-A)

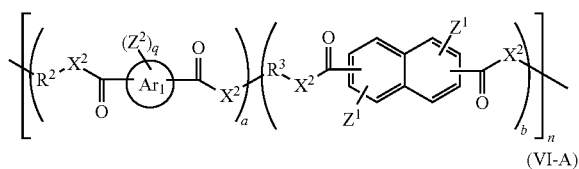

(VI)

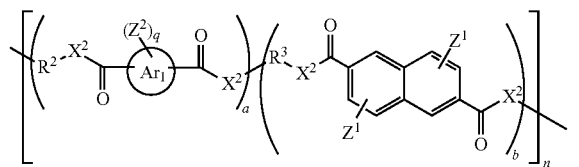

(VI-A)

wherein Ar1 and Ar2 each independently is an aromatic group; each $X^2$ independently is O, S, or NR; R is H, $C_{1-20}$ alkyl, specifically $C_{1-10}$ alkyl, more specifically $C_{1-6}$ alkyl, and yet more specifically methyl, ethyl, propyl, butyl, pentyl, hexyl, heptyl, or octyl; each $R^2$ and $R^3$ independently is $C_{1-20}$ alkylene, specifically $C_{1-10}$ alkylene, more specifically $C_{1-6}$ alkylene, or a poly(alkylene ether), a poly(alkylene glycol) comprising ethyleneoxy, propyleneoxy, and butyleneoxy repeating units containing 2-20 carbon atoms, specifically 2-10 carbon atoms, and more specifically 2-6 carbon atoms, or a $C_{4-40}$ alkylene chain wherein the chain comprises 1, 2, 3, or 4 $Q^1$ groups within the backbone of the chain, specifically 1 or 2 $Q^1$ groups, wherein each $Q^1$ independently is O, S, —O(C=O)—, —(O=C)O—, —S(C=O)—, or —(O=C)S—; each $Z^1$ independently is H, $C_{1-20}$ alkyl, specifically $C_{1-10}$ alkyl, more specifically $C_{1-6}$ alkyl, halogen, nitro, cyano, hydroxyl, $C_6$-$C_{12}$ aryl, $C_3$-$C_{20}$ cycloalkyl, $C_1$-$C_{20}$ alkyl, $C_1$-$C_{20}$ alkoxy, $C_1$-$C_{20}$ alkylthio, $C_1$-$C_{20}$ haloalkyl, amino, $C_1$-$C_{12}$ alkylamino, $C_1$-$C_{12}$ diaminoalkyl; each $Z^2$ independently is $C_{1-20}$ alkyl, specifically $C_{1-10}$ alkyl, more specifically $C_{1-6}$ alkyl, halogen, nitro, cyano, hydroxyl, $C_6$-$C_{12}$ aryl, $C_3$-$C_{20}$ cycloalkyl, $C_1$-$C_{20}$ alkyl, $C_1$-$C_{20}$ alkoxy, $C_1$-$C_{20}$ alkylthio, $C_1$-$C_{20}$ haloalkyl, amino, $C_1$-$C_{12}$ alkylamino, or $C_1$-$C_{12}$ diaminoalkyl; a is about 1 to about 99 mol %, specifically about 5 to about 95 mol %, and more specifically about 40 to about 60 mol % (for color neutral); b is about 1 to about 99 mol %, specifically about 5 to about 95 mol %, and more specifically about 40 to about 60 mol % (for color neutral); n is about 10,000 to about 100,000 g/mol; and q is 0, 1, 2, 3, or 4, specifically q is 0, 1, or 2. Each Ar1 and Ar2 group independently is an aromatic group, specifically anthracene, benzophenone, 2,1,3-benzothiadiazole, biphenyl, dibenzofuran, dibenzothiophene, diphenylfulvene, 1,3-diphenylisobenzofuran, 2,2'-dipyridyl, 4,4'-dipyridyl, fluorene, fluorenone, naphthyl, 2-nitrobiphenyl, phenanthrene, phenyl, pyrene, pyridyl, terphenyl, or triphenylene. In an embodiment, each $R^2$ and $R^3$ independently is $C_{2-8}$ alkylene, specifically $C_2$ alkylene, $C_3$ alkylene, $C_4$ alkylene, $C_5$ alkylene, $C_6$ alkylene, $C_7$ alkylene, or $C_8$ alkylene. In another embodiment, each $R^2$ and $R^3$ independently is a $C_{4-40}$ alkylene chain wherein the chain comprises 1, 2, 3, or 4 $Q^1$ groups within the backbone of the chain, specifically 1 or 2 $Q^1$ groups, wherein each $Q^1$ independently is O, S, —O(C=O)—, —(O=C)O—, —S(C=O)—, or —(O=C)S—, specifically —O(C=O)—, —(O=C)O—, —S(C=O)—, or —(O=C)S—, more specifically —O(C=O)— or —(O=C)O—. In all embodiments of $R^2$ and $R^3$ comprising more than one $Q^1$, the $Q^1$ groups are not adjacent to one another, rather they are separated by one or more carbons in the chain (e.g., —(CH$_2$)$_6$-Q$^1$-(CH$_2$)$_4$-Q$^1$-(CH$_2$)$_6$—). In an embodiment, each $R^2$ and $R^3$ for formula (V) and (V-A) is $C_2$ alkylene. Each aromatic group listed provides a unique color and by combing with another will provide another unique color.

The polymers and copolymers of formula (IV), (V), (V-A), (VI), or (VI-A) may optionally be end-capped with a polymerizable end groups. The polymerizable end group can included, for example, alkenyl, alkenethioate, alkynyl, allyl, acrylate, methacrylate, norbornenyl, vinyl, and the like.

The copolymer electrochromic materials including copolymers of formula (IV), (V), and (V-A) include copolymers prepared by transesterification. In an embodiment, PET and PEN are transesterified.

In an embodiment, the copolymer electrochromic material is according to formula (V) or (V-A) wherein $X^2$ is O, $R^2$ and $R^3$ are ethylene (i.e., $C_2$ alkylene), each $Z^1$ is H, a+b=1 where a=0.57 and b=0.43, and n greater than or equal to 20.

The polymers and copolymers of formula (IV), (V), (V-A), (VI), or (VI-A) can be prepared by known polymerization techniques to prepare polyesters, polythioesters, and polyamides. The polyester and copolyesters can be prepared by a polycondensation reaction starting from the appropriate diol and dicarboxylic acid. Combinations of different diols or dicarboxylic acids, or activated dicarboxylic acids, can result in a copolymer. The polythioester and copolythioesters can also be prepared via a polycondensation reaction starting with dithiols and dicarboxylic acids or activated dicarboxylic acids. Polyamides and copolyamides can be prepared by a polycondensation reaction starting with diamines and dicarboxylic acids or activated dicarboxylic acids. Selection of the particular synthetic route can be made by one having ordinary skill in the art without undue experimentation. In the polycondensation reactions, the polymer/copolymer may be end-capped, specifically end-capped with a polymerizable end group as described herein.

When combinations of polymers are used as the electrochromic material, it is advantageous to have them transesterified in order to avoid phase segregation as phase segregation can lead to significant haze and distortions in the electrochromic devices.

Transesterification of polyesters and polythioesters generate copolymers that can be used to form electrochromic coatings by a solution process or a melt process. The transesterification process produces a material that can form a homogeneous film that is not phase segregated. The transesterification product exhibits a different color than the individual starting polymers exhibit. By varying the ratio of the different starting polymers used in the transesterification reaction, different colors can be achieved and devices demonstrate different color neutrality along with a large change in photopic contrast.

PEN give a green electrochromic transition. Using other aromatic structures as comonomers during the melt polymerization of PEN can alter the PEN structure and change the color transition. For example, transesterified PET with PEN generates a combination of pink with green resulting in brownish type colors lying within the color neutral region of the CIE color coordinate. Electrochromic functionality can be achieved from two polyester polymers, PET and PEN, to generate a colorless to neutral color (meaning the color will not lead to color distortion). Color neutrality is suitable for applications such as privacy windows for buildings and automobiles, as well as eyewear. In such applications, the color neutrality does not skew the color perception of the observer.

"Color neutrality" as used herein means a color not associated with any hue such as white, grey, black; within the color neutral region of CIE 1931 XYZ. "Military neutrality" as used herein is as defined by MIL-PRF-32432A (11 Sep. 2018) section 4.9.3 Neutrality test "If a configuration providing bright sunlight (sunglass) protection or transition lens capability (Style T only) is offered as part of the system, the spectral transmittance of the eyewear shall be measured by a spectrophotometer having a monochromator band width of ten nanometers or less and a reproduction of ±1 percent. The neutrality shall be calculated, using the average spectral transmittance over the 520-580 nm band (Tc) for comparison. CIE Illuminant C shall be used." With a neutrality value less than 12% to be defined as military neutral.

Color spaces (CIE 1931 RGB, CIE 1931 XYZ, CIE L*a*b* (CIELAB) color spaces are published by the International Commission on Illumination (Commission Internationale de L'éclairage) to numerically express color perceptions. CIE L*a*b* (CIELAB) is a color space that describes all the colors visible to the human eye and was created to serve as a device-independent model to be used as a reference. As a* and b* in CIE L*a*b* reaches (0, 0) (white point), the saturation of color is even, therefore the color is close to black. Close to black when L<50 and white when L>50. L=50 is gray.

Acid catalyzed transesterification reactions can be conducted at temperatures ranging from about 80 to about 120° C. for time periods between about 4 and about 8 hours using an acid catalyst such as trifluoroacetic acid, para-toluene sulfonic acid, phosphoric acid, and sulfuric acid in combination with a solvent such as ortho-chlorophenol, hexafluoroisopropanol (HFIP), mixed solvents such as 60:40 (wt/wt) phenol/1,1,2,2-tetrachloroethylene, or 7/3 (v/v) p-chlorophenol/tetrachloroethane; or may be conducted in an acidic solvent, comprising trifluoroacetic acid, hexafluoroisopropanol, and the like.

In an embodiment, the electrochromic material is a combination of a copolymer electrochromic material and a SMO electrochromic material, specifically a combination of i) a copolymer of formula (IV), (V), (V-A), (VI), (VI-A), or a combination thereof and ii) a SMO compound of formula (I), (I-A), (II), (II-A), (III), or a combination thereof. The combination can be in the form of a blend of a combination prepared through a melt of the materials.

Compounds are described using standard nomenclature. For example, any position not substituted by any indicated group is understood to have its valency filled by a bond as indicated, or a hydrogen atom. A dash ("-") that is not between two letters or symbols is used to indicate a point of attachment for a substituent. For example, "—CHO" is attached through carbon of the carbonyl group.

Unless otherwise indicated, the term "substituted" as used herein means replacement of one or more hydrogens with one or more substituents. Suitable substituents include, for example, hydroxyl, $C_6$-$C_{12}$ aryl, $C_3$-$C_{20}$ cycloalkyl, $C_1$-$C_{20}$ alkyl, halogen, $C_1$-$C_{20}$ alkoxy, $C_1$-$C_{20}$ alkylthio, $C_1$-$C_{20}$ haloalkyl, $C_6$-$C_{12}$ haloaryl, pyridyl, cyano, thiocyanato, nitro, amino, $C_1$-$C_{12}$ alkylamino, $C_1$-$C_{12}$ diaminoalkyl, acyl, sulfoxyl, sulfonyl, amido, or carbamoyl.

As used herein, "alkyl" includes straight chain, branched, and cyclic saturated aliphatic hydrocarbon groups, having the specified number of carbon atoms, generally from 1 to about 20 carbon atoms, greater than 3 for the cyclic. Alkyl groups described herein typically have from 1 to about 20, specifically 3 to about 18, and more specifically about 6 to about 12 carbons atoms. Examples of alkyl include, but are not limited to, methyl, ethyl, n-propyl, isopropyl, n-butyl, 3-methylbutyl, t-butyl, n-pentyl, and sec-pentyl. As used herein, "cycloalkyl" indicates a monocyclic or multicyclic saturated or unsaturated hydrocarbon ring group, having the specified number of carbon atoms, usually from 3 to about 10 ring carbon atoms. Monocyclic cycloalkyl groups typically have from 3 to about 8 carbon ring atoms or from 3 to about 7 carbon ring atoms. Multicyclic cycloalkyl groups may have 2 or 3 fused cycloalkyl rings or contain bridged or caged cycloalkyl groups. Examples of cycloalkyl groups include cyclopropyl, cyclobutyl, cyclopentyl, or cyclohexyl as well as bridged or caged saturated ring groups such as norbornane or adamantane.

As used herein "haloalkyl" indicates both branched and straight-chain alkyl groups having the specified number of carbon atoms, substituted with 1 or more halogen atoms, generally up to the maximum allowable number of halogen atoms ("perhalogenated"). Examples of haloalkyl include, but are not limited to, trifluoromethyl, difluoromethyl, 2-fluoroethyl, and penta-fluoroethyl.

As used herein, "alkoxy" includes an alkyl group as defined above with the indicated number of carbon atoms attached through an oxygen bridge (—O—). Examples of alkoxy include, but are not limited to, methoxy, ethoxy, n-propoxy, i-propoxy, n-butoxy, 2-butoxy, t-butoxy, n-pentoxy, 2-pentoxy, 3-pentoxy, isopentoxy, neopentoxy, n-hexoxy, 2-hexoxy, 3-hexoxy, and 3-methylpentoxy.

As used herein, the term "aryl" indicates aromatic groups containing only carbon in the aromatic ring or rings. Such aromatic groups may be further substituted with carbon or non-carbon atoms or groups. Typical aryl groups contain 1 or 2 separate, fused, or pendant rings and from 6 to about 12 ring atoms, without heteroatoms as ring members. Where indicated aryl groups may be substituted. Such substitution may include fusion to a 5 to 7-membered saturated cyclic group that optionally contains 1 or 2 heteroatoms independently chosen from N, O, and S, to form, for example, a 3,4-methylenedioxy-phenyl group. Aryl groups include, for example, phenyl, naphthyl, including 1-naphthyl and 2-naphthyl, and bi-phenyl.

As used herein, "halo" or "halogen" refers to fluoro, chloro, bromo, or iodo.

Compositions comprising a salt and a polymer or copolymer of formula (IV), (V), (V-A), (VI), (VI-A), or a combination thereof, are described further herein.

Electrochromic Material Compositions

Electrochromic material compositions comprising a SMO electrochromic material, a polymer electrochromic material, a copolymer electrochromic material, or a combination thereof, as discussed herein, can further comprise a salt, and optionally one or more of a solvent, a plasticizer, an acid, or a combination thereof. Specifically, compositions comprising a salt and a SMO electrochromic material of formula (I), (I-A), (II), (II-A), or (III), a polymer or copolymer electrochromic material of formula (IV), (V), (V-A), (VI), or (VI-A)), or a combination thereof. In an aspect, the electrochromic material composition comprises a salt and a SMO electrochromic material, a polymer electrochromic material, a copolymer electrochromic material, or a combination thereof, wherein the electrochromic material comprises a naphthalene group as a chromophore.

The salt can be present for electron transfer types of electrochromics. The salt of the electrochromic material composition may be a metal salt, an organic salt (e.g., ionic liquids), an inorganic salt, and the like, or a combination thereof. In an embodiment, the salt comprise an alkali metal ion of Li, Na, or K. Exemplary salts, where M represents an alkali metal ion, include $MClO_4$, $MPF_6$, $MBF_4$, $MAsF_6$, $MSbF_6$, $MCF_3SO_3$, $MCF_3CO_2$, $M_2C_2F_4(SO_3)_2$, $MN(CF_3SO_2)_2$, $MN(C_2F_5SO_2)_2$, $MC(CF_3SO_2)_3$, $MC_nF_{2n+1}SO_3$ (2≤n≤3), $MN(RfOSO_2)_2$ (wherein Rf is a fluoroalkyl group), or a combination thereof. Exemplary lithium salts include lithium trifluoromethanesulfonate. Other suitable salts include tetra-n-butylammonium tetrafluoroborate ($TBABF_4$); tetra-n-butylammonium hexafluorophosphate ($TBAPF_6$); or a combination thereof.

The salt of the electrochromic material composition can be an ionic liquid. Ionic liquids are organic salts with melting points under about 100° C. Other ionic liquids have melting points of less than room temperature (~22° C.). Examples of ionic liquids that may be used in the electrochromic material composition include imidazolium, pyridinium, phosphonium or tetralkylammonium based compounds, for example, 1-ethyl-3-methylimidazolium tosylate, 1-butyl-3-methylimidazolium octyl sulfate; 1-butyl-3-methylimidazolium 2-(2-methoxyethoxy)ethyl sulfate; 1-ethyl-3-methylimidazolium bis(pentafluoroethylsulfonyl)imide; 1-ethyl-3-methylimidazolium bis(trifluoromethylsulfonyl)imide; 1-ethyl-3-methylimidazolium bromide; 1-ethyl-3-methylimidazolium hexafluorophosphate; 1-butyl-3-methylimidazolium bromide; 1-butyl-3-methylimidazolium trifluoromethane sulfonate; 1,2-dimethyl-3-propylimidazolium tris(trifluoromethylsulfonyl)methide; 1,2-dimethyl-3-propylimidazolium bis(trifluoromethylsulfonyl)imide; 3-methyl-1-propylpyridinium bis(trifluormethylsulfonyl)imide; 1-butyl-3-methylpyridinium bis(trifluormethylsulfonyl)imide; 1-butyl-4-methylpyridinium chloride; 1-butyl-4-methylpyridinium hexafluorophosphate; 1-butyl-4-methylpyridinium tetrafluoroborate; 1-n-butyl-3-methylimidazolium hexafluorophosphate (n-BMIM $PF_6$); 1-butyl-3-methylimidazolium tetrafluoroborate (BMIM $BF_4$); phosphonium dodecylbenzenesulfonate; phosphonium methanesulfonate; or a combination thereof.

The salt may be present in the electrochromic material composition in an amount of about 5 to about 40 wt % of the total weight of salt, electrochromic material, and if used, plasticizer; specifically about 10 wt % to about 30 wt %, and more specifically 12 to about 17 wt % of salt, electrochromic material, and if used, plasticizer.

The electrochromic material composition may optionally further comprise a solvent or plasticizer. These may be high boiling organic liquids such as dialkyl phthalate for example dimethyl phthalate or diethyl phthalate, carbonates for example alkylene and alkylyne carbonates such as dimethyl carbonate, ethylmethyl carbonate, methylpropyl carbonate, methylbutyl carbonate, methylpentyl carbonate, diethyl carbonate, ethylpropyl carbonate, ethylbutyl carbonate, dipropyl carbonate, propylene carbonate, ethylene carbonate, propylyne carbonate, or a combination thereof; or other materials like dimethylformamide (DMF).

The amount of solvent/plasticizer added to the electrochromic material composition can range from about 1 to about 50 wt. % based on the total weight of the composition, specifically about 5 to about 30 wt. %, and more specifically about 10 to about 20 wt. %.

Melt Processable Electrochromic Material and Melt Processable Electrochromic Material Compositions The polymer electrochromic materials and copolymer electrochromic materials, as well as the electrochromic material compositions comprising the same with a salt, have been found to be melt processable. The salt may function as both an electrolyte and a plasticizer. As the electrochromic materials and compositions with a salt can be melt processed, preparation of the materials into electrochromic devices can proceed through a high throughput, less costly and less toxic way to generate flexible displays, not only as films, but to any number of shapes owing to the melt processing capabilities. It was surprisingly, and advantageously, found that the polymer and copolymer electrochromic materials and compositions with a salt are able to be both melt processed and have electrochromic functionality.

Melt processability avoids the use of solvent and greatly reduces the cost of production due to it being a low waste, solventless method with a very high throughput.

It has been found that polyesters such as a poly(ethylene terephthalate) (PET), a poly(naphthalene terephthalate) (PEN), blends and copolymers thereof, and the like can be melt processed with a salt and exhibit electrochromic functionality. PET, when processed with an electrolyte, such as an ionic liquid, is an electrochromic polymer transitioning between colorless (neutral, zero charge) and pink (reduced state, radical anion). PEN exhibits better mechanical and thermal properties than PET. PEN, when processed with an electrolyte, such as an ionic liquid, is an electrochromic polymer transitioning between colorless (neutral, zero charge) and green (reduced state, radical anion). Green is an important color for displays.

This colorless to green transition serves a much larger role as an electrochromic especially in meeting the demands of going between clear and absorbing states by which color neutrality is maintained. This is a highly useful property for applications including personal, transportation, and buildings electrochromic technology. PEN provides a very good oxygen barrier, which is a property that is advantageous for an electrochromic device since oxygen is detrimental to displays (devices with color change functionality). To generate a color neutral device, a transesterification process was employed to generate a copolymer of PET and PEN in starting from pure PET and PEN. The result was that different compositions of the two polymers resulted in different reduced color transitions, many of which fell in the color neutral space of the CIE. The insertion of aromatics into the copolymerization will result in color changes to neutralize the spectrum for privacy and energy types of color change applications.

Electrochromic devices can be constructed from a melt processable electrochromic polymer/copolymer, or a combination thereof. Combinations of melt processable polyesters containing electrochromophores can result in a copolymer comprising multiple chromophores that will result in a different color transition depending upon the copolymer composition make up. Melt processability avoids the use of solvent and greatly reduces the cost of production due to it being a low waste, solventless method with a very high throughput. Polyesters such as PET and PEN, are recyclable polymers and other chromophores incorporated will have the same polyester recyclability potential.

It has now been discovered that electrochromic polymer film can be made by the procedure of melt processing. Melt processing incorporates semi-crystallinity within the polymer matrix. Semi-crystallinity imparts mechanical properties to the polymer; however, the electrochromic functionality of the chromophore in the semicrystalline regions will be null due to restricted movement. The amorphous regions of the polymer will be the regions responsible for where the electrochromic color change will take place, and it is where the electrolyte will reside.

Melt processing is used for large scale manufacture of inexpensive common goods such as plastic wrap, plasticware (bottles, food containers, storage vessels, etc.), common molded parts, etc. As opposed to coating a substrate with an electrochromic, a substrate prepared from the polymer electrochromic material composition or copolymer electrochromic material composition itself could serve as the electrochromic. Easy to synthesize polymers such as these would significantly lower cost in comparison to other electrochromics such as conjugated polymers. Polyesters, in their neutral state, are approved optical materials for flexible displays and can be used as the chromophore. This greatly increases the simplicity. Known melt processing techniques in the industry, such as known melt processing techniques for PET and PEN type polymers, can be used. Exemplary melt processing techniques include extrusion and molding. In extrusion, solid polymer is melted and then shaped in a continuous part of a defined cross section by screw-conveying and forcing the melt to flow through a die. Die forming can be used to prepare pipe and tubing, film, sheet, wire, fiber, and the like. Molding can also involve non-continuous processes such as injection molding, blow molding, rotational molding, and compression molding, in which three-dimensional parts are made in a closed mold, or by thermoforming, transfer molding, dip molding, and the like. The melt processable electrochromic polymer materials can be 3-D printed using an appropriate 3-D printing device. The melt processable electrochromic polymer materials can be processed using Roll-to-roll (R2R) techniques for the formation of films.

Solvent Processable Electrochromic Material and Solvent Processable Electrochromic Material Compositions The electrochromic materials and compositions described herein can be solvent processable. In an embodiment, the electrochromic materials and compositions can be formed into a layer by combining the electrochromic material, salt, and a solvent to form a mixture in the form of a dispersion or solution, and applying the mixture to a substrate via conventional processes including flow coating, ink jet printing, screen printing, roll to roll printing processes, reel to reel processing, spin coating, meniscus and dip coating, spray coating, brush coating, doctor blade application, curtain casting, drop casting, and the like. The mixture can optionally further comprise a plasticizer.

Suitable solvents may include a liquid aprotic polar solvent such as propylene carbonate, ethylene carbonate, butyrolactone, acetonitrile, benzonitrile, nitromethane, nitrobenzene, sulfolane, dimethylformamide, N-methylpyrrolidone, or the like, or a combination thereof. If appropriate, polar protic solvents include, for example, water, methanol, ethanol, propanol, isopropanol, butanol, or the like, or a combination thereof. Other non-polar solvents such benzene, toluene, methylene chloride, carbon tetrachloride, hexane, diethyl ether, tetrahydrofuran, or the like, or a combination thereof may also be used.

Electrochromic Devices

The electrochromic materials and compositions can be used to prepare an electrochromic device comprising the electrochromic material or composition thereof, an electrolyte, and two or more electrodes. The electrochromic device can be any type, e.g., absorptive/transmissive or absorptive/reflective.

The electrolyte compositions for use in the electrochromic device include those known for use in electrochromic devices. The electrolyte composition may include metal salts, organic salts (e.g., ionic liquids), inorganic salts, and the like, and a combination thereof.

In one embodiment the electrolyte composition is a gel electrolyte, specifically a crosslinked gel electrolyte. The gel electrolyte can be prepared from a gel electrolyte precursor mixture comprising a gel electrolyte precursor and a solvent. The gel electrolyte precursor can be monomeric or polymeric. In particular, the gel precursor is a crosslinkable polymer. The crosslinkable polymer can comprise polymerizable end groups, polymerizable side-chain groups, or a combination thereof attached to a polymer backbone. Exemplary polymer backbones include polyamides, polyimides, polycarbonates, polyesters, polyethers, polymethacrylates, polyacrylates, polysilanes, polysiloxanes, polyvinylacetates, polymethacrylonitriles, polyacrylonitriles, polyvinylphenols, polyvinylalcohols, polyvinylidenehalides, co-polymers thereof, or a combination thereof. More specifically, the gel precursor is a cross-linkable polyether. Exemplary polyethers include poly(alkylene ethers) and poly(alkylene glycol)s comprising ethyleneoxy, propyleneoxy, and butyleneoxy repeating units. Hydroxyl end groups of poly(alkylene glycols) can be capped with polymerizable vinyl groups including (meth)acrylate and styryl vinyl groups to form a crosslinkable polyether. In particular, the crosslinkable polymer is poly (ethylene glycol) methyl ether acrylate (PEG-MA), poly(ethylene glycol) diacrylate (PEG-DA), poly(propylene glycol) diacrylate (PPG-DA), poly(butylene glycol) diacrylate (PBG-DA), poly(ethylene oxide) (PEO), poly(propylene oxide) (PPO), poly(butylene oxide) (PBO), or a combination thereof. The crosslinkable polymer can also be a copolymer or a block copolymer comprising ethyleneoxy, propylenoxy, or butyleneoxy repeating units. In one embodiment, the gel precursor is PEG-MA. In one embodiment, the gel precursor is PEO and is crosslinked thermally. In one embodiment, the gel precursor is PEO and is crosslinked using UV radiation. In one embodiment, the gel precursor is crosslinkable polymer comprising a mixture of PEG-DA and PEO, wherein the PEO:PEG-DA weight ratio is from 95:5 to 5:95, more specifically 90:10 to 10:90, and even more specifically 60:40 to 40:60 or 50:50.

The electrolyte composition can comprise an alkali metal ion of Li, Na, or K. Exemplary electrolytes, where M represents an alkali metal ion, include $MClO_4$, $MPF_6$, $MBF_4$, $MAsF_6$, $MSbF_6$, $MCF_3SO_3$, $MCF_3CO_2$, $M_2C_2F_4(SO_3)_2$, $MN(CF_3SO_2)_2$, $MN(C_2F_5SO_2)_2$, $MC(CF_3SO_2)_3$, $MC_nF_{2n+1}SO_3$ ($2 \leq n \leq 3$), $MN(RfOSO_2)_2$ (wherein Rf is a fluoroalkyl group), MOH, or a combination thereof. In particular, the electrolyte composition comprises a lithium salt. More particularly, the lithium salt is lithium trifluoromethanesulfonate. Other suitable salts include tetra-n-butylammonium tetrafluoroborate ($TBABF_4$); tetra-n-butylammonium hexafluorophosphate ($TBAPF_6$); or a combination thereof. When a gel electrolyte is used, the concentration of the electrolyte salt may be about 0.01 to about 30 wt. % of the gel electrolyte precursor, specifically about 5 to about 20 wt. %, and yet more specifically about 10 to about 15 wt. % of the gel electrolyte precursor.

The gel electrolyte precursor mixture can also comprise a solvent or plasticizer to enhance the ionic conductivity of the electrolyte. These may be high boiling organic liquids such as carbonates, their blends or other materials like dimethylformamide (DMF). In particular the solvent can be a carbonate, for example alkylene and alkylyne carbonates such as dimethyl carbonate, ethylmethyl carbonate, methylpropyl carbonate, methylbutyl carbonate, methylpentyl carbonate, diethyl carbonate, ethylpropyl carbonate, ethylbutyl carbonate, dipropyl carbonate, propylene carbonate, ethylene carbonate, propylyne carbonate, or a combination thereof. The amount of solvent added to the gel electrolyte precursor mixture can range from about 1 to about 50 wt. % of the gel electrolyte precursor mixture, specifically about 10 to about 40 wt. %, and more specifically about 20 to about 30 wt. % of the gel electrolyte precursor mixture.

The gel electrolyte precursor mixture can further comprise other additives such as photochemical sensitizers, free radical initiators, and diluent polymers, providing the desired properties of the electrochromic device are not significantly adversely affected; for example, the ionic conductivity of the gel electrolyte, the switching speed of the electrochromic response, color contrast of the electrochromic response, adhesion of the gel electrolyte to the substrate, and flexibility of the electrodes.

The electrolyte composition may contain an ionic liquid. Ionic liquids are organic salts with melting points under about 100° C. Other ionic liquids have melting points of less than room temperature (~22° C.). Examples of ionic liquids that may be used in the electrolyte composition include imidazolium, pyridinium, phosphonium or tetralkylammonium based compounds, for example, 1-ethyl-3-methylimidazolium tosylate, 1-butyl-3-methylimidazolium octyl sulfate; 1-butyl-3-methylimidazolium 2-(2-methoxyethoxy) ethyl sulfate; 1-ethyl-3-methylimidazolium bis (pentafluoroethylsulfonyl)imide; 1-ethyl-3-methylimidazolium bis(trifluoromethylsulfonyl)imide; 1-ethyl-3-methylimidazolium bromide; 1-ethyl-3-methylimidazolium hexafluorophosphate; 1-butyl-3-methylimidazolium bromide; 1-butyl-3-methylimidazolium trifluoromethane sulfonate; 1,2-dimethyl-3-propylimidazolium tris(trifluoromethylsulfonyl)methide; 1,2-dimethyl-3-propylimidazolium bis(trifluoromethylsulfonyl)imide; 3-methyl-1-propylpyridinium bis(trifluormethylsulfonyl)imide; 1-butyl-3-methylpyridinium bis(trifluormethylsulfonyl) imide; 1-butyl-4-methylpyridinium chloride; 1-butyl-4-methylpyridinium hexafluorophosphate; 1-butyl-4-methylpyridinium tetrafluoroborate; 1-n-butyl-3-methylimidazolium hexafluorophosphate (n-BMIM $PF_6$); 1-butyl-3-methylimidazolium tetrafluoroborate (BMIM $BF_4$); phosphonium dodecylbenzenesulfonate; phosphonium methanesulfonate; or a combination thereof.

The amount of ionic liquid that can be used in the gel electrolyte precursor mixture can range from about 10% to about 80 wt. %, specifically about 20% to about 70 wt. %, more specifically about 30% to about 60 wt. %, and yet more specifically about 40% to about 50 wt. % of the gel electrolyte precursor mixture.

The gel electrolyte precursor can be converted to a gel via radical crosslinking initiated by thermal methods, or in particular by exposure to ultraviolet (UV) radiation. In an exemplary embodiment, the wavelength of UV irradiation is about 365 nm although other wavelengths can be used.

The gel electrolyte precursor mixture may comprise a thermal initiator or a photoinitiator. Photoinitiators may be used to promote the photochemical crosslinking of the gel electrolyte precursors. Any suitable photoinitiator known in the art can be used, including for example, phosphine oxide photoinitiators, ketone-based photoinitiators, such as hydroxy- and alkoxyalkyl phenyl ketones, and thioalkylphenyl morpholinoalkyl ketones; and benzoin ether photoinitiators. Exemplary photoinitiators include benzophenone, 2,2-dimethoxy-2-phenylacetophenone (DMPAP), dimethoxyacetophenone, xanthone, and thioxanthone. In one embodiment the initiator may include 2,2-dimethoxy-2-phenyl-acetophenone (DMPAP). The exact range of amounts of photoinitiator may be selected by those skilled in the art.

Crosslinking may also be thermally induced at about 40° C. to about 70° C., specifically about 50° C. using a thermal initiator. Exemplary thermal initiators include peroxide initiators such as benzyl peroxide (BPO), or azo bis isobutylnitrile (AIBN).

In one embodiment, the gel electrolyte precursor mixture comprises the electrolyte salt (e.g. metal salts, organic salts (e.g., ionic liquids), inorganic salts, or a combination thereof) and the gel precursor in a weight ratio of 1 to 10, with a 0.002 to 1 to 10 ratio of initiator to electrolyte to gel precursor, by weight.

Exemplary gel polymer electrolytes include those described in U.S. Pat. Nos. 7,586,663 and 7,626,748, both to Radmard et al., both incorporated herein by reference in their entirety.

The electrolyte may optionally include an additional additive. The additive may be chosen so that it does not, unless desired, interfere with oxidative polymerization, interfere with color/contrast/switching, interfere with electrodes or other components in a degradative way. Exemplary additional additives may also be used in the combination of electrolyte and dyes including standard dye, conductive fillers such as particulate copper, silver, nickel, aluminum, carbon black, graphene, carbon nanotubes, buckminister fullerene, and the like; non-conductive fillers such as talc, mica, wollastonite, silica, clay, pigments (zeolites), a standard dye, and the like, or a combination thereof.

The electrolyte or electrochromic material composition can optionally further comprise a standard dye to tune optical and colorimetric properties of the resulting electrochromic device. Suitable standard dye does not undergo redox (reduction or oxidation) processes within the potential window for operation of the electrochromic device, does not react with the electrochromic material, and optionally appropriately compliments or accentuates the electrochromic material in the bleached state, the colored state, or both. In a specific embodiment, both the electrochromic material and the standard dye are disposed between at least two electrodes.

Exemplary standard dyes that can be used include quinoline dyes (e.g. Solvent yellow 114), azo dyes (including monoazo, diazo, triazo, and polyazo dyes), anthraquinone dyes, nitroso dyes, nitro dyes, azoic dyes, stilbene dyes, carotenoid dyes, diphenylmethane dyes, triarylmethane dyes, xanthene dyes, acridene dyes, quinoline dyes, methine dyes, indamine/indophenol dyes, azine dyes, oxazine dyes, thiazine dyes, sulphur dyes, lactone dyes, aminoketone dyes, hydroxykentone dyes, indigoid dyes, phthalocyanine dyes, and other dyes that meet the requirement of organic solvent solubility, redox properties, and chemical reactivity discussed in the previous paragraph.

| C.I. Generic name | C.I. NO. |
|---|---|
| Solvent Black 27 | — |
| Solvent Black 29 | — |
| Solvent Black 45 | — |
| Solvent blue 104 | 61568 |
| Solvent blue 122 | 60744 |
| Solvent blue 35 | 61554 |
| Solvent blue 36 | 51551 |
| Solvent Blue 4 | 45045:1 |
| Solvent blue 59 | 61552 |
| Solvent blue 78 | 61500 |
| Solvent blue 97 | 615290 |
| Solvent Brown 1 | 11285 |
| Solvent Brown 2 | 11330 |
| Solvent Brown 3 | 11360 |
| Solvent Brown 4 | 12000 |
| Solvent Brown 5 | 12020 |
| Solvent green 28 | 625580 |
| Solvent Green 3 | 61565 |
| Solvent green 5 | 59075 |
| Solvent Green 7 | 59040 |
| Solvent orange 107 | — |
| Solvent Orange 3 | 11270B; 11270:1 |
| Solvent orange 60 | 564100 |
| Solvent Orange 62 | — |
| Solvent orange 63 | 68550 |
| Solvent Orange 7 | 12140 |
| Solvent Orange 99 | - - - |
| Solvent Red 1 | 12150 |
| Solvent Red 111 | 60505 |
| Solvent Red 122 | — |
| Solvent Red 132 | — |
| Solvent red 135 | 564120 |
| Solvent red 149 | 674700 |
| Solvent Red 168 | — |
| Solvent red 179 | 564150 |
| Solvent red 196 | 505700 |
| Solvent red 197 | 505720 |
| Solvent red 207 | 617001 |
| Solvent Red 23 | 26100 |
| Solvent Red 24 | 26105 |
| Solvent red 242 | 73300 |
| Solvent red 27 | 26125 |
| Solvent Red 4 | 12170 |
| Solvent Red 49 | 45170B; 45170:1 |
| Solvent Red 52 | 68210 |
| Solvent Red 8 | 12715 |
| Solvent Red 91 | — |
| Solvent violet 13 | 60725 |
| Solvent Violet 14 | 61705 |
| Solvent violet 31 | 61102 |
| Solvent violet 36 | — |
| Solvent Violet 58 | — |
| Solvent violet 59 | 62025 |
| Solvent Violet 8 | CI No 42535:1 |
| Solvent Violet 9 | CI No 42555:1 |
| Solvent Yellow 1 | 11000 |
| Solvent yellow 114 | 47020 |
| Solvent Yellow 14 | 12055 |
| Solvent Yellow 16 | 12700 |
| Solvent yellow 163 | 58840 |
| Solvent yellow 176 | 47023 |
| Solvent Yellow 18 | 12740 |
| Solvent Yellow 2 | 11020 |
| Solvent Yellow 21 | 18690 |
| Solvent Yellow 3 | 11160 |
| Solvent Yellow 33 | 47000 |
| Solvent Yellow 34 | 41000:1 |
| Solvent Yellow 56 | 11021 |
| Solvent Yellow 62 | — |
| Solvent Yellow 7 | 11800 |
| Solvent Yellow 72 | — |
| Solvent Yellow 82 | — |
| Solvent Yellow 93 | 48160 |
| Solvent yellow 98 | 56238 |

The standard dye, as used herein, excludes viologens.

The standard dye can be used in an amount of about 1 wt. % to about 50 wt. % based on the combined weight of the standard dye and electrochromic material.

A suitable standard dye can be determined using techniques known to one having ordinary skill in the art without the need for undue experimentation. For example, to determine if any specific dye would undergo any redox (reduction or oxidation) processes within the potential window for operation of the electrochromic material, the dye would be prepared with the components of the electrochromic device, such as solvent, salt, etc. but in the absence of the electrochromic material, to form a "blank" device. The blank device would then be tested within the voltage window that will be used for the electrochromic device to determine if the dye changes color or is otherwise unaffected. If the dye does not undergo any redox processes within the potential window for operation, then a full device including the electrochromic material can be prepared and tested to determine if there is any reactivity between the standard dye and the electrochromic material.

The electrochromic devices may optionally further include a variety of substrate materials (flexible or rigid) used to house the electrolyte/electrochromic material composition combination. Exemplary substrate materials include glass, plastic, silicon, a mineral, a semiconducting material, a ceramic, a metal, and the like, as well as a combination thereof. The substrate may be inherently conductive. Flexible substrate layers can be made from plastic. Exemplary plastics include polyethylene terephthalate (PET), poly(arylene ether), polyamide, polyether amide, etc. It is to be understood that these plastic substrates do not function as an electrochromophore as they do not contain a salt and/or plasticizer within the PET/PEN layer yielding no/lower ionic conductivity.

Electrochromic PET/PEN compositions include PET/PEN, a salt, and optionally a plasticizer to result in a more porous film morphology with an increased ionic conductivity as the porous film morphology allows for ionic mobility.

The substrate may include mirrored or reflective substrate material.

Exemplary electrode materials for use in the electrochromic devices can include inorganic materials such as glass-indium doped tin oxide (glass-ITO), doped silicon, metals such as silver, gold, platinum, aluminum, and the like, metal alloys such as stainless steel ("SS"), SS 316, SS316L, nickel and/or cobalt alloys such as Hastelloy-B® (Ni62/Mo28/Fe5/Cr/Mn/Si), Hastelloy-C®, and the like; and organic materials such as a conjugated polymer such as poly(3,4-ethylenedioxythiophene)-polystyrene sulfonate (PEDOT-PSS), conjugated polymers, carbon black, carbon nanotubes, graphene, and the like.

In one embodiment, all of the electrodes are polyethylene terephthalate (PET)/indium-doped tin oxide (ITO) substrates.

The electrochromic device can generally be fabricated by encasing a layer of the combination of electrolyte composition and a layer of electrochromic material composition between at least two electrodes, wherein the electrodes are in electrical communication with the layers of electrolyte composition and electrochromic material composition.

The electrochromic material composition can be formed into a layer by mixing the electrochromic material and salt components with an appropriate solvent to form a mixture in the form of a dispersion or solution, and applying the mixture to a substrate by solvent processes including ink jet printing, screen printing, roll to roll printing processes, reel to reel processing, spin coating, meniscus and dip coating, spray coating, brush coating, flow coating, doctor blade application, solution casting, curtain casting, drop casting, film casting, and the like.

In an embodiment, the electrochromic material composition layer can be prepared by heating the electrochromic material and salt components to form a melt in the absence of a solvent, and formed by extrusion, e.g. cast film extrusion, or molding. The ability to melt process the polymer and copolymer electrochromic materials described herein has clear advantages over alternative methods of forming electrochromic devices. For example, vacuum depositing metal oxide onto a substrate to generate an electrochromic for electrochromic window technology is expensive. Processes using solution casting of electrochromic polymer films onto a substrate can involve large quantities of solvent requiring expensive disposal requirements. Furthermore, solution casting can only prepare films. Melt processing does not require a substrate and leads to very different morphologies compared to solution casting. The melt processed polymer can be a film or both the film and the substrate. Melt processing offers not only films as a product but electrochromic materials that can be shaped in many different ways. For example, the melt processable electrochromic material can be blow molded into bottles or containers. Further, the melt processable electrochromic material can be melt spun into fibers. In addition to the various shapes that the melt processable polymers can take, melt processability also offers a pathway to recyclability.

Melt processing of electrochromic materials allows for the preparation of a film that can be produced and sold as a roll. An optically transparent conductor can be coated on this roll to form the electrochromic device. In an alternate embodiment, the melt processed film can be pressure encapsulated by laminating ITO coated substrate (e.g. PET) on each side of the melt processable electrochromic material. Other melt processing techniques may be used to form the electrochromic material into any number of shapes, as described herein. Melt processing can be conducted on a very large scale and leads to high throughput, cost-effective processes that are less toxic due to the avoidance of solvent use in the process.

The electrochromic materials and devices described herein find use in personal, household, transportation, and building sectors. Automotive applications include rear view mirrors, sunroofs, wind-shields, windows and the like; eyewear applications including eyeglasses, goggles, sunglasses, visors, and the like; architectural windows; smart glass; windows; displays (e.g., billboards and signs, video monitors, flat panel displays, flexible displays, and the like); sensors; OLEDs; solar cells; electrochromic (color change) fabrics and textiles; adaptive camouflage; electrochromic plastic wrap for food, household goods, packaging, and the like; and containers and packaging, including bottles, and the like. Electrochromic devices that exhibit neutral color transitions are of special interest in the eyewear industry. For example, neutral grey lenses for use in military and consumer applications provide an unmitigated view of the environment without distorting original colors or affecting contrast. Their low brightness minimizes eye fatigue and develops a calm, non-distractive atmosphere.

It was surprisingly found that electrochromic devices comprising a copolymer of PET/PEN as the electrochromic go from an 87% photopic transmission bleached state to about 12% photopic transmission colored state while maintaining color neutrality. Photopic transmission at 87% is acceptable not just for optical applications (sun glasses) but also ophthalmic applications (prescription eyewear). The bleached state looks like a normal polyester film, and polyester films can be used for optical applications.

The following illustrative examples are provided to further describe the invention and are not intended to limit the scope of the claimed invention.

EXAMPLES

Figure 2:
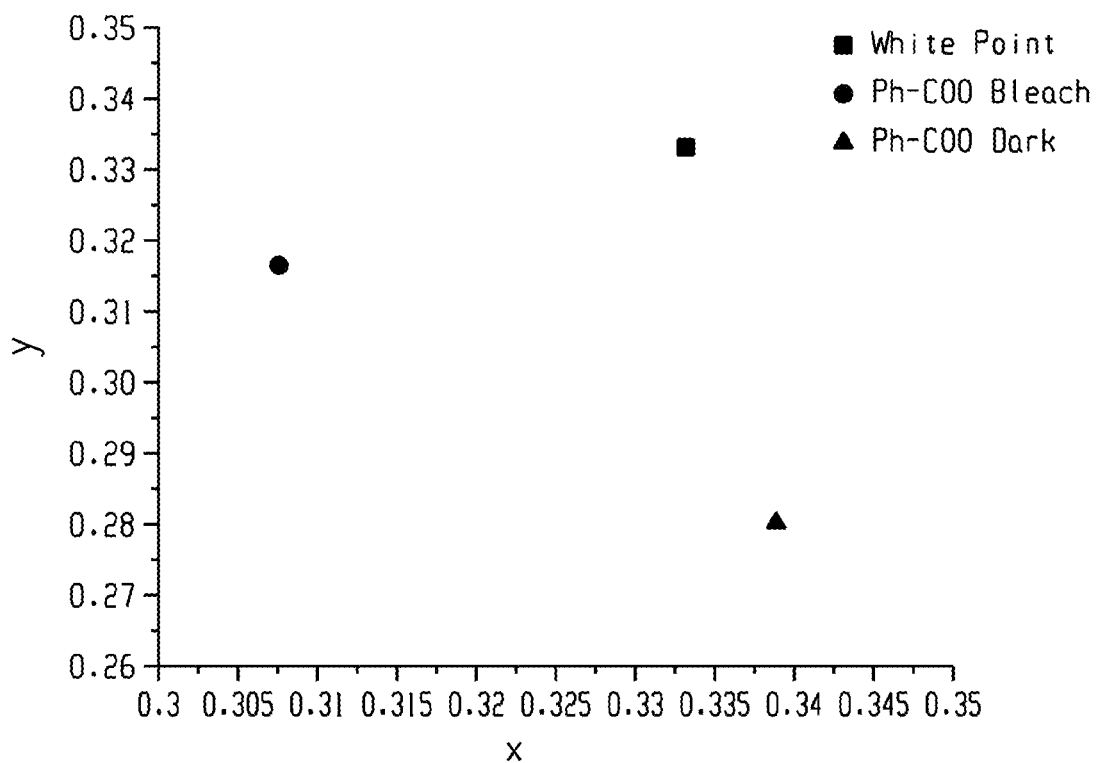
FIG. 2 illustrates a 1931 CIE plot showing the dark and bleach state values for an electrochromic device using benzenedicarboxylic acid, 1,4-dihexyl ester as a chromophore.

Example 1. Small Molecule Organic (SMO) Electrochromic Dye—Benzenedicarboxylic Acid, 1,4-dihexyl Ester as Chromophore A copper tape electrode was applied on the edge of an indium doped tin oxide glass slide with a rubber gasket of 0.8 mm thickness placed along the edges to form a square reservoir. A gel solution containing 10.0 mg benzenedicarboxylic acid, 1,4-dihexyl ester and 0.488 g propylene carbonate, 0.856 g poly(ethylene glycol) methyl ether acrylate (Mn=480 g/mol), 0.284 g poly(ethylene glycol) dimethacrylate (Mn=550 g/mol), 0.08 g tetrabutylammonium hexafluorophosphate, and 2.5 mg bis(2,4,6-trimethylbenzoyl)phenylphosphine oxide was sonicated for 10 minutes. The gel solution was then added to the reservoir on the glass slide until it was filled completely. Another indium doped tin oxide glass slide with copper tape attached was placed on top of the other glass slide and ultra-violet light cured for 10 minutes. Electrical leads were then placed on the copper electrodes. The resulting device was than activated using Chronocoulometry with a pulse of −4.5 Volts versus ground potential to observe the color change. Bleach state values (x,y) (0.3075,0.3165) Tp 87.55; Dark state values (x,y) (0.339, 0.279) Tp 60.62; TP contrast=26.9; and Delta E=35.43. FIG. 1 shows transmission data in bleach state (0 V) and dark state (−4.5 V) versus ground potential. White point is x=0.33, y=0.33. FIG. 2 shows 1931 CIE plot showing the dark and bleach state values.

Figure 3:
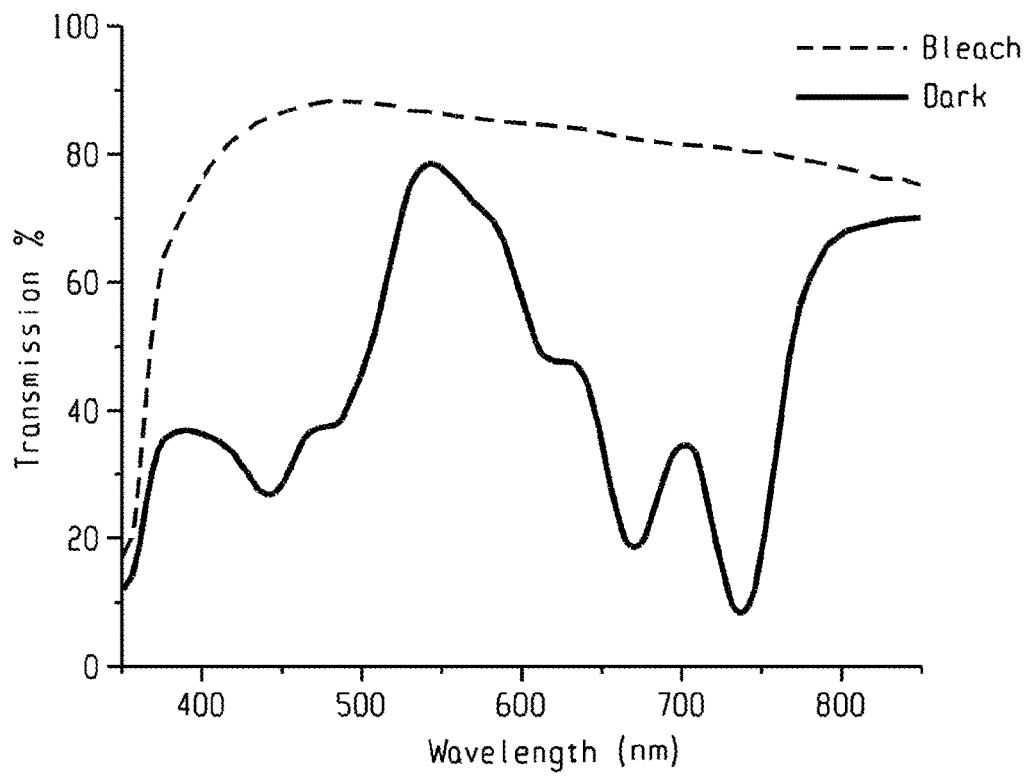
FIG. 3 illustrates transmission data in bleach state (0 V) and dark state (−4.5 V) versus ground potential for an electrochromic device using dimethyl 2,6-naphthalenedicarboxylate as a chromophore.
Figure 4:
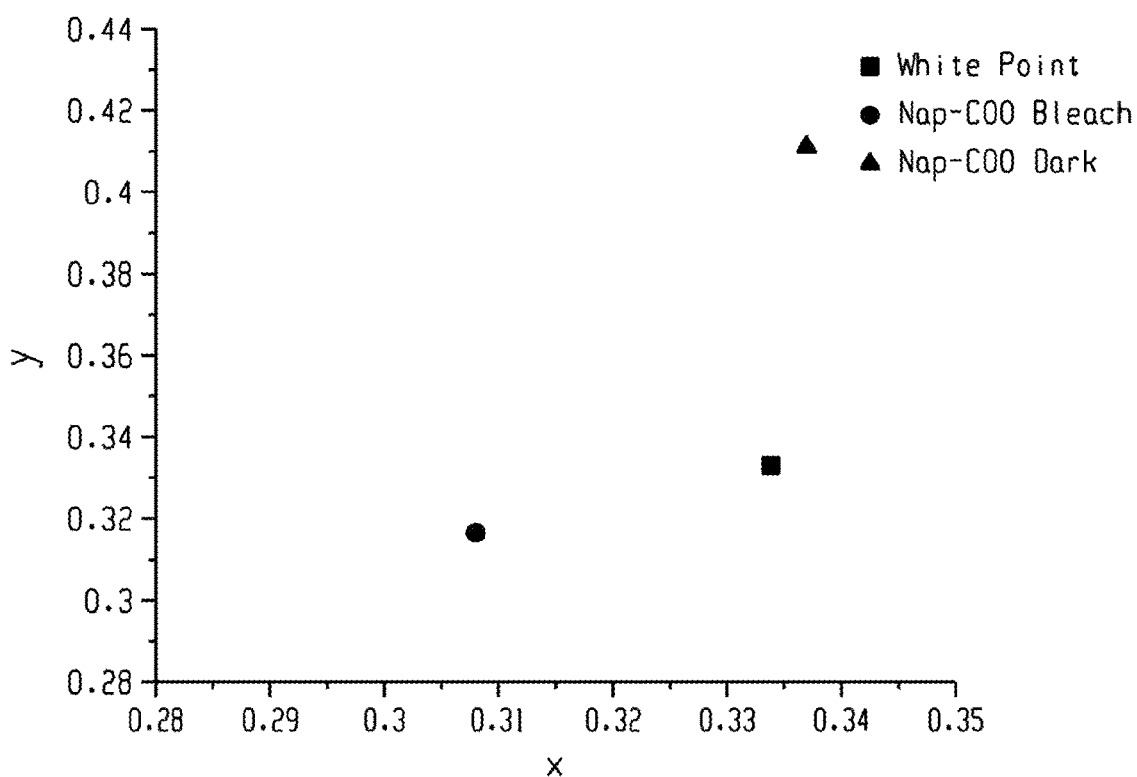
FIG. 4 illustrates a 1931 CIE plot showing the dark and bleach state values for an electrochromic device using dimethyl 2,6-naphthalenedicarboxylate as a chromophore.

Example 2. Small Molecule Organic (SMO) Electrochromic Dye—Dimethyl 2,6-naphthalenedicarboxylate as Chromophore A copper tape electrode was applied on the edge of an indium doped tin oxide glass slide with a rubber gasket of 0.8 mm thickness placed along the edges to form a square reservoir. A gel solution containing 10.0 mg Dimethyl 2,6-naphthalenedicarboxylate, 0.488 g propylene carbonate, 0.856 g poly(ethylene glycol) methyl ether acrylate (Mn=480 g/mol), 0.284 g poly(ethylene glycol) dimethacrylate (Mn=550 g/mol), 0.08 g tetrabutylammonium hexafluorophosphate, and 2.5 mg bis(2,4,6-trimethylbenzoyl)phenylphosphine oxide was sonicated for 10 minutes. The gel solution was then added to the reservoir on the glass slide until it was filled completely. Another indium doped tin oxide glass slide with copper tape attached was placed on top of the other glass slide and ultra-violet light cured for 10 minutes. Electrical leads were then placed on the copper electrodes. The resulting device was than activated using Chronocoulometry with a pulse of −4.5 Volts versus ground potential to observe the color change. Bleach state values (x,y) (0.307, 0.3166) Tp=86.09; Dark state values (x,y) (0.3359, 0.4109) Tp=64.64; Tp contrast=21.458; and Delta E=44.34. FIG. 3 shows transmission data in bleach state (0 V) and dark state (−4.5 V) versus ground potential. FIG. 4 shows 1931 CIE plot showing the dark and bleach state values.

Figure 5:
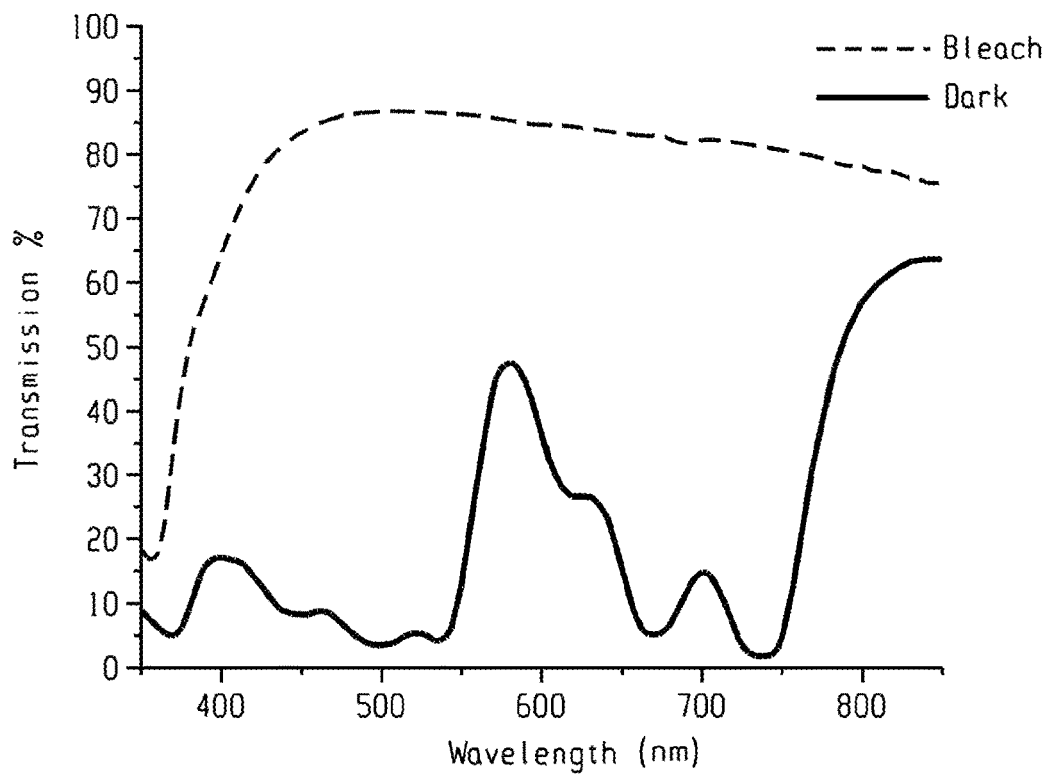
FIG. 5 illustrates transmission data in bleach state (0 V) and dark state (−4.5 V) versus ground potential for an electrochromic device using dimethyl 2,6-naphthalenedicarboxylate and benzenedicarboxylic acid, 1,4-dihexyl ester as chromophores.
Figure 6:
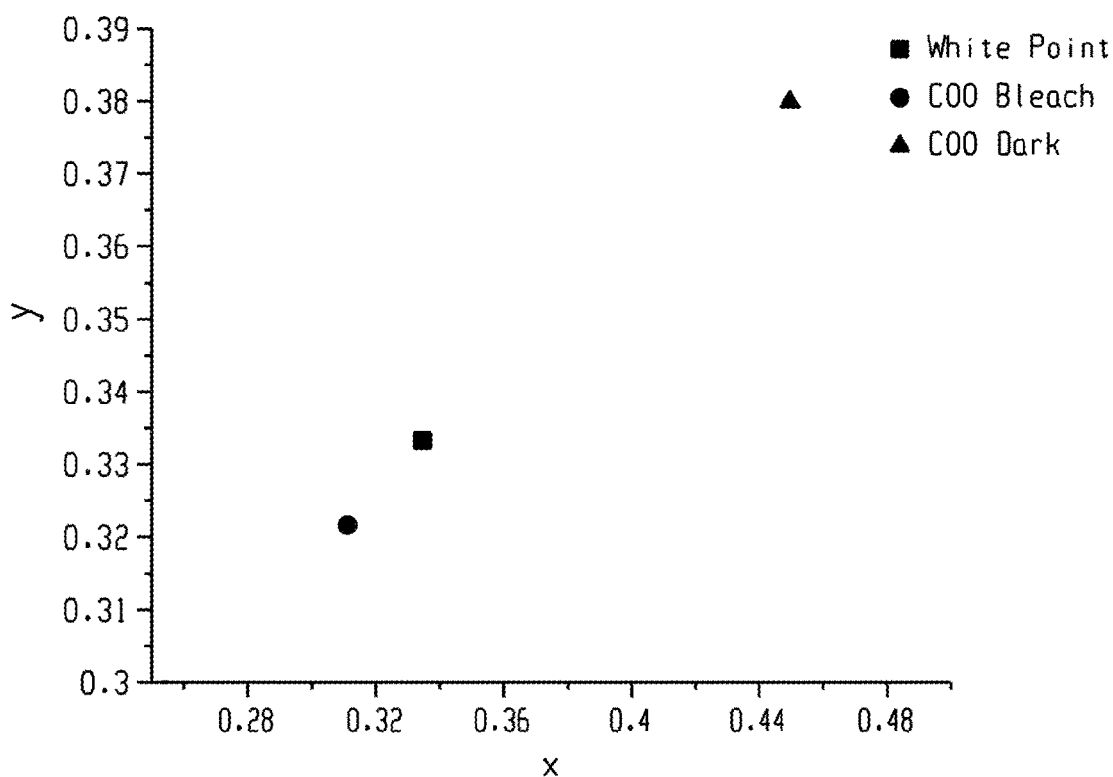
FIG. 6 illustrates a 1931 CIE plot showing the dark and bleach state values for an electrochromic device using dimethyl 2,6-naphthalenedicarboxylate and benzenedicarboxylic acid, 1,4-dihexyl ester as chromophores.

Example 3. Small Molecule Organic (SMO) Electrochromic Dye—Dimethyl 2,6-naphthalenedicarboxylate and Benzenedicarboxylic Acid, 1,4-dihexyl Ester as Chromophores A copper tape electrode was applied on the edge of a indium doped tin oxide glass slide with a rubber gasket of 0.8 mm thickness placed along the edges to form a square reservoir. A gel solution containing 10.6 mg Dimethyl 2,6-naphthalenedicarboxylate, 26.3 mg Benzenedicarboxylic acid, 1,4-dihexyl ester and 0.488 g propylene carbonate, 0.856 g poly(ethylene glycol) methyl ether acrylate (Mn=480 g/mol), 0.284 g poly(ethylene glycol) dimethacrylate (Mn=550 g/mol), 0.08 g tetrabutylammonium hexafluorophosphate, and 2.5 mg bis(2,4,6-trimethylbenzoyl)phenylphosphine oxide was sonicated for 10 minutes. The gel solution was then added to the reservoir on the glass slide until it was filled completely. Another indium doped tin oxide glass slide with copper tape attached was placed on top of the other glass slide and ultra-violet light cured for 10 minutes. Electrical leads were then placed on the copper electrodes. The resulting device was than activated using Chronocoulometry with a pulse of −4.5 Volts versus ground potential to observe the color change. Bleach state values (x,y) (0.3106, 0.3217) Tp=85.87; Dark state values (x,y) (0.4457, 0.3799) Tp=21.795; Tp contrast=64.07 and Delta E=55.69. FIG. 5 shows transmission data in bleach state (0 V) and dark state (−4.5 V) versus ground potential. FIG. 6 shows 1931 CIE plot showing the dark and bleach state values.

Figure 7:
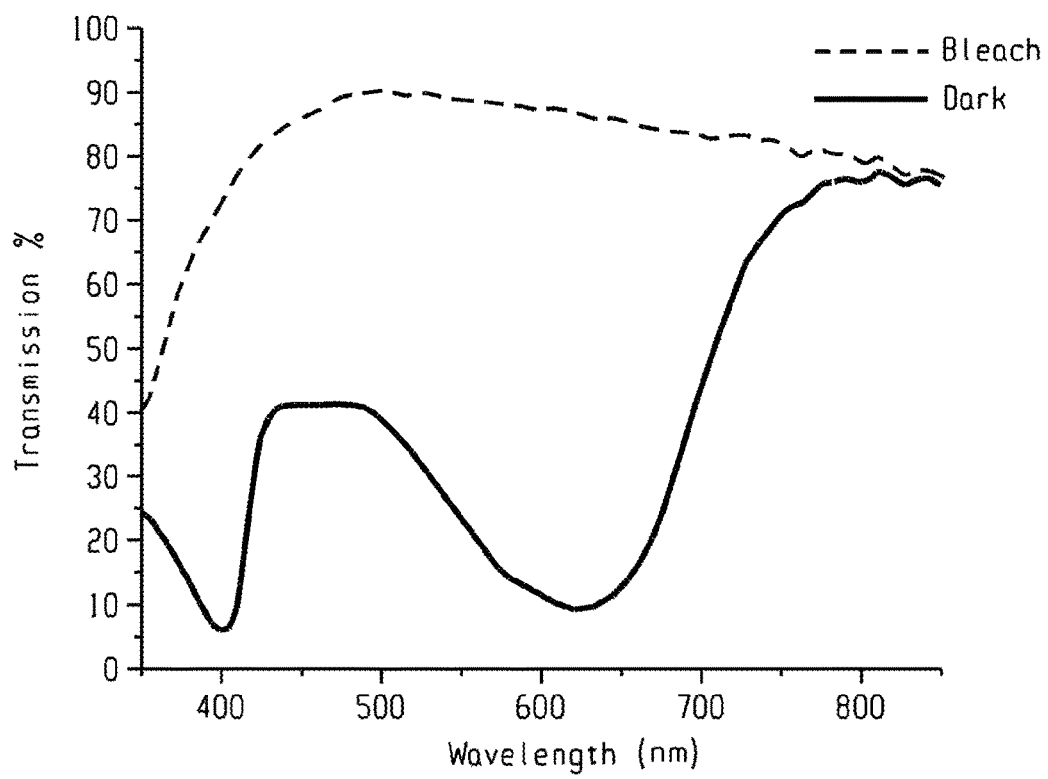
FIG. 7 illustrates transmission data in bleach state (0 V) and dark state (−4.5 V) versus ground potential for an electrochromic device using 1,4-benzenedicarbothioic acid, 1,4-diethyl ester as chromophore.
Figure 8:
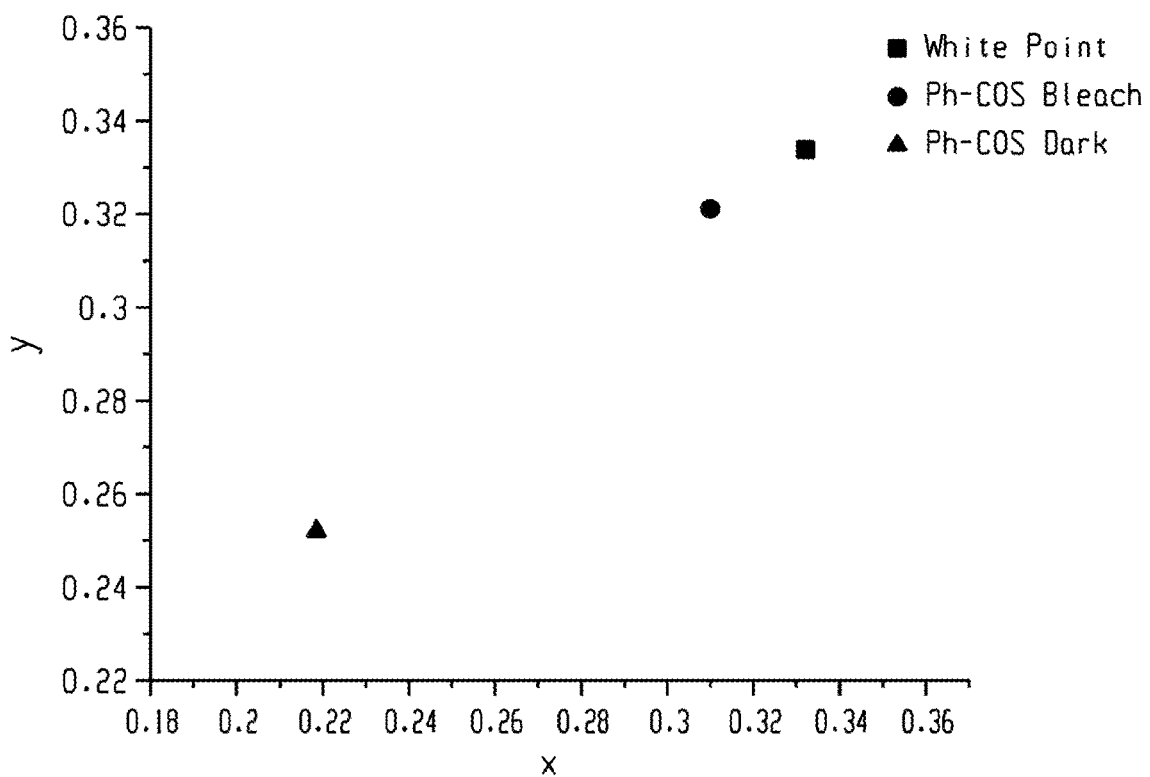
FIG. 8 illustrates a 1931 CIE plot showing the dark and bleach state values for an electrochromic device using 1,4-benzenedicarbothioic acid, 1,4-diethyl ester as chromophore.

Example 4. Small Molecule Organic (SMO) Electrochromic Dye—1,4-Benzenedicarbothioic Acid, 1,4-diethyl Ester as Chromophore A copper tape electrode was applied on the edge of a indium doped tin oxide glass slide with a rubber gasket of 0.8 mm thickness placed along the edges to form a square reservoir. A gel solution containing 10.0 mg 1,4-Benzenedicarbothioic acid, 1,4-diethyl ester and 0.488 g propylene carbonate, 0.856 g poly(ethylene glycol) methyl ether acrylate (Mn=480 g/mol), 0.284 g poly(ethylene glycol) dimethacrylate (Mn=550 g/mol), 0.08 g tetrabutylammonium hexafluorophosphate, and 2.5 mg bis(2,4,6-trimethylbenzoyl)phenylphosphine oxide was sonicated for 10 minutes. The gel solution was then added to the reservoir on the glass slide until it was filled completely. Another indium doped tin oxide glass slide with copper tape attached was placed on top of the other glass slide and ultra-violet light cured for 10 minutes. Electrical leads were then placed on the copper electrodes. The resulting device was than activated using Chronocoulometry with a pulse of −4.5 Volts versus ground potential to observe the color change. Bleach state values (x,y) (0.3097, 0.3204) Tp=88.5; Dark state values (x,y) 0.2187, 0.2513) Tp=22.66; Tp contrast=65.845; and Delta E=49.8939. FIG. 7 shows transmission data in bleach state (0 V) and dark state (−4.5 V) versus ground potential. FIG. 8 shows 1931 CIE plot showing the dark and bleach state values.

Figure 9:
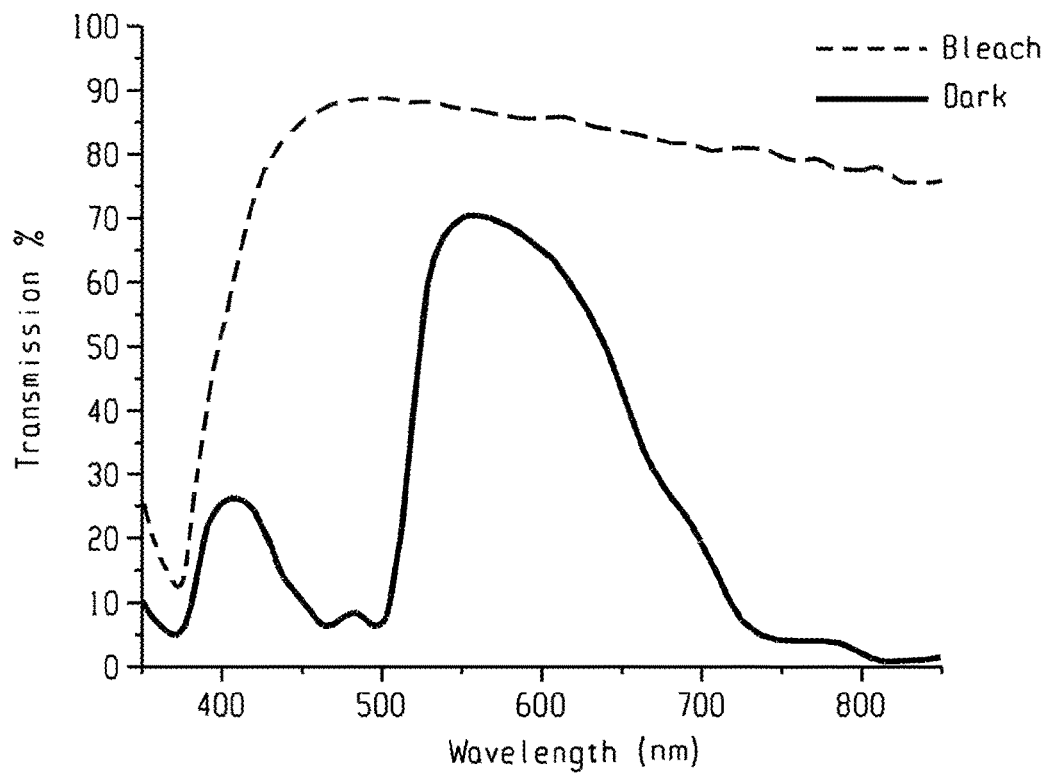
FIG. 9 illustrates transmission data in bleach state (0 V) and dark state (−4.5 V) versus ground potential for an electrochromic device using 2,6-naphthalenedicarbothioc acid, 2,6-diethyl ester as chromophore.
Figure 10:
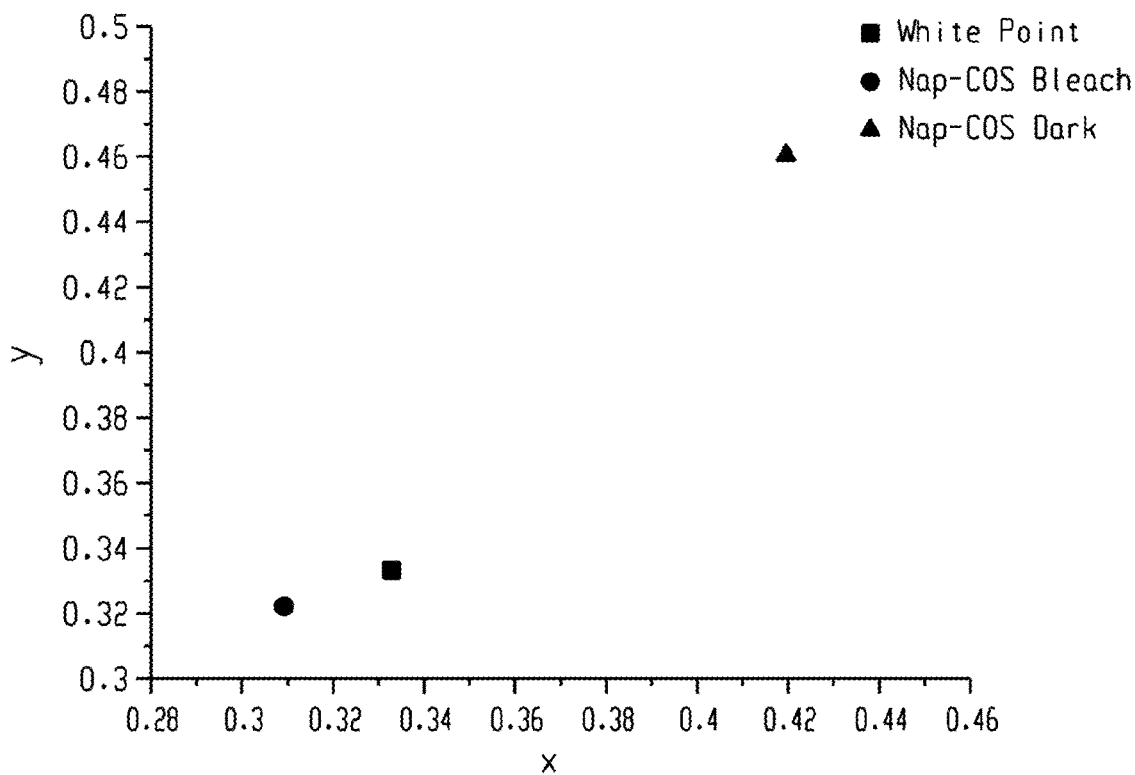
FIG. 10 illustrates a 1931 CIE plot showing the dark and bleach state values for an electrochromic device using 2,6-naphthalenedicarbothioc acid, 2,6-diethyl ester as chromophore.

Example 5. Small Molecule Organic (SMO) Electrochromic Dye—2,6-naphthalenedicarbothioc Acid, 2,6-diethyl Ester as Chromophore A copper tape electrode was applied on the edge of a indium doped tin oxide glass slide with a rubber gasket of 0.8 mm thickness placed along the edges to form a square reservoir. A gel solution containing 10.0 mg 2,6-naphthalenedicarbothioc acid, 2,6-diethyl ester, 0.488 g propylene carbonate, 0.856 g poly(ethylene glycol) methyl ether acrylate (Mn=480 g/mol), 0.284 g poly(ethylene glycol) dimethacrylate (Mn=550 g/mol), 0.08 g tetrabutylammonium hexafluorophosphate, and 2.5 mg bis(2,4,6-trimethylbenzoyl)phenylphosphine oxide was sonicated for 10 minutes. The gel solution was then added to the reservoir on the glass slide until it was filled completely. Another indium doped tin oxide glass slide with copper tape attached was placed on top of the other glass slide and ultra-violet light cured for 10 minutes. Electrical leads were then placed on the copper electrodes. The resulting device was than activated using Chronocoulometry with a pulse of −4.5 Volts versus ground potential to observe the color change. Bleach state values (x,y) (0.309, 0.3218) tp=87.09; Dark state values (x,y) (0.4215, 0.4607) tp=55.9; TP contrast=31.15; Delta E=68.56. FIG. 9 shows transmission data in bleach state (0 V) and dark state (−4.5 V) versus ground potential. FIG. 10 shows 1931 CIE plot showing the dark and bleach state values.

Figure 11:
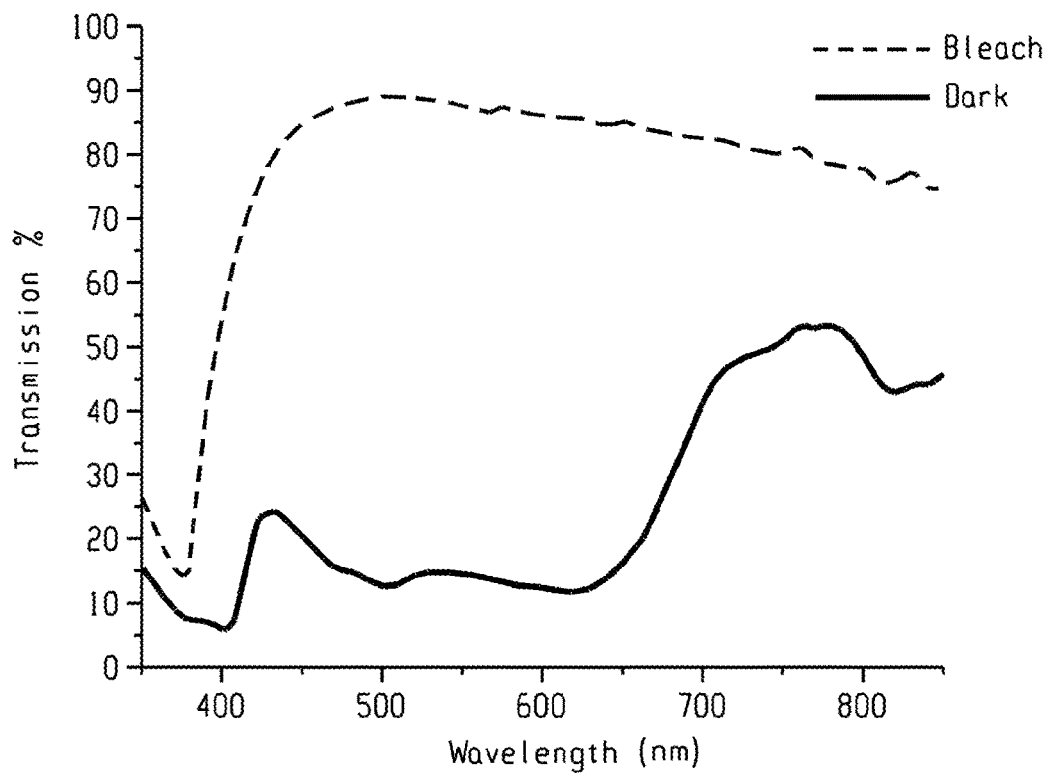
FIG. 11 illustrates transmission data in bleach state (0 V) and dark state (−4.5 V) versus ground potential for an electrochromic device using 2,6-naphthalenedicarbothioc acid, 2,6-diethyl ester and 1,4-benzenedicarbothioic acid, 1,4-diethyl ester as chromophores.
Figure 12:
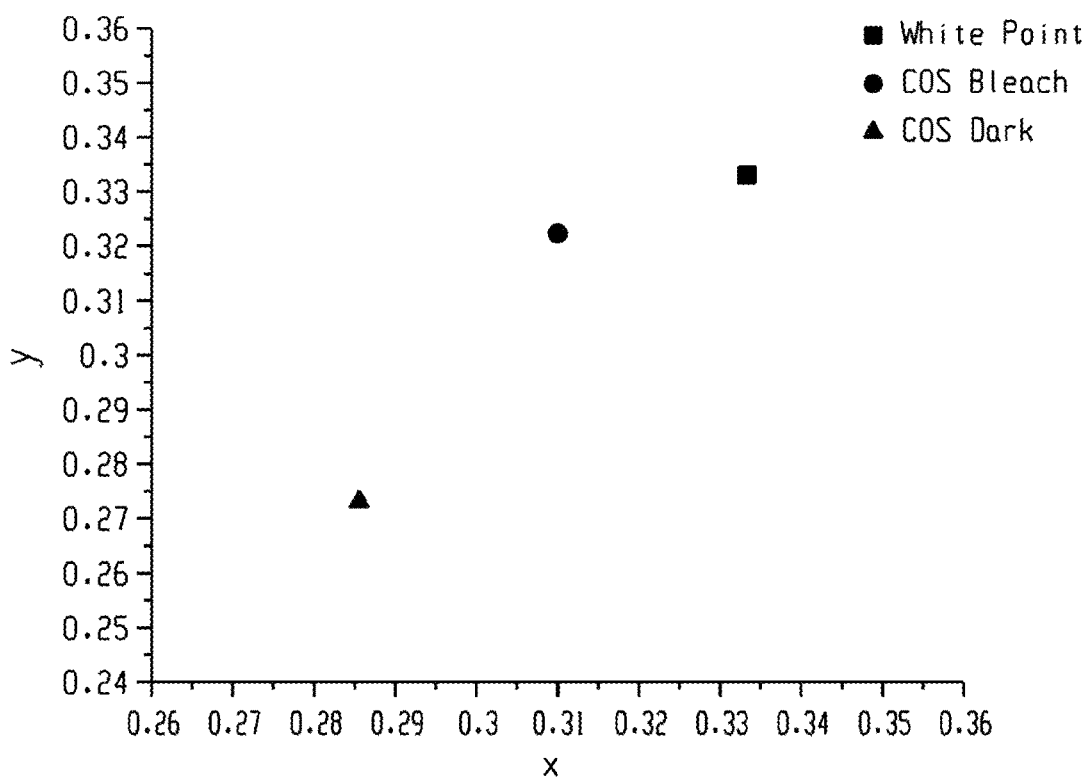
FIG. 12 illustrates a 1931 CIE plot showing the dark and bleach state values for an electrochromic device using 2,6-naphthalenedicarbothioc acid, 2,6-diethyl ester and 1,4-benzenedicarbothioic acid, 1,4-diethyl ester as chromophores.

Example 6. Small Molecule Organic (SMO) Electrochromic Dye—2,6-naphthalenedicarbothioc Acid, 2,6-diethyl Ester and 1,4-Benzenedicarbothioic Acid, 1,4-diethyl Ester as Chromophores A copper tape electrode was applied on the edge of a indium doped tin oxide glass slide with a rubber gasket of 0.8 mm thickness placed along the edges to form a square reservoir. A gel solution containing 15.0 mg 2,6-naphthalenedicarbothioc acid, 2,6-diethyl ester, 16.5 mg 1,4-Benzenedicarbothioic acid, 1,4-diethyl ester, 0.488 g propylene carbonate, 0.856 g poly(ethylene glycol) methyl ether acrylate (Mn=480 g/mol), 0.284 g poly(ethylene glycol) dimethacrylate (Mn=550 g/mol), 0.08 g tetrabutylammonium hexafluorophosphate, and 2.5 mg bis(2,4,6-trimethylbenzoyl)phenylphosphine oxide was sonicated for 10 minutes. The gel solution was then added to the reservoir on the glass slide until it was filled completely. Another indium doped tin oxide glass slide with copper tape attached was placed on top of the other glass slide and ultra-violet light cured for 10 minutes. Electrical leads were then placed on the copper electrodes. The resulting device was than activated using Chronocoulometry with a pulse of −4.5 Volts versus ground potential to observe the color change. Bleach state values (x,y) (0.310, 0.322) Tp=86.96; Dark state values (x,y) (0.285, 0.272) Tp=13.66; Tp contrast=73.29; and Delta E=52.66. FIG. 11 shows transmission data in bleach state (0 V) and dark state (−4.5 V) versus ground potential. FIG. 12 shows 1931 CIE plot showing the dark and bleach state values.

Figure 13:
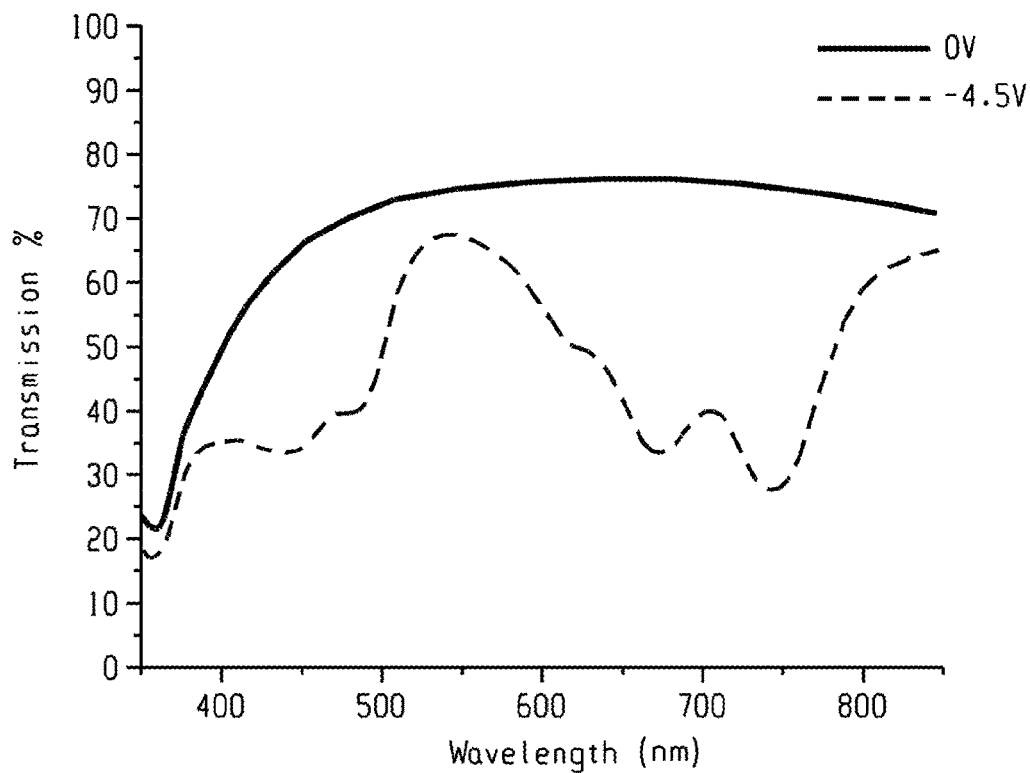
FIG. 13 illustrates transmission data in bleach state (0 V) and dark state (−4.5 V) versus ground potential for a solution processed electrochromic device using polyethylene naphthalate as chromophore.
Figure 14:
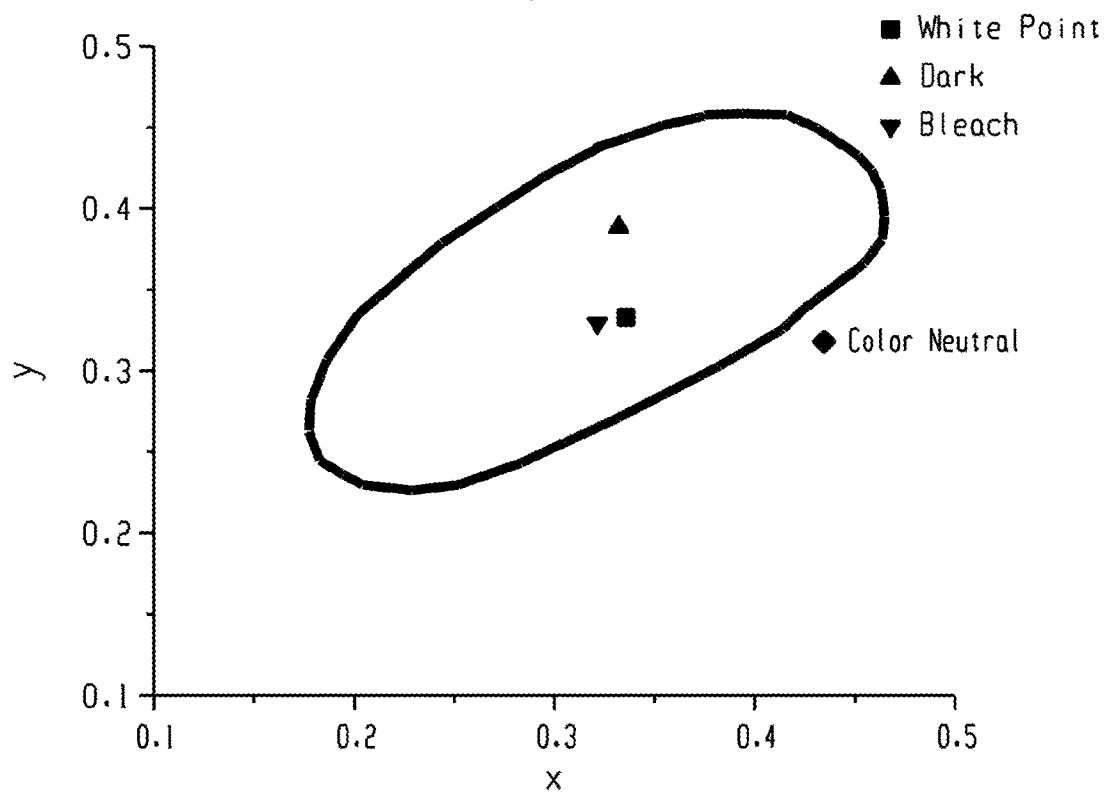
FIG. 14 illustrates a 1931 CIE plot showing the dark and bleach state values for a solution processed electrochromic device using polyethylene naphthalate as chromophore.

Example 7A. Solution Polymer Electrochromic Device—Polyethylene Naphthalate as Chromophore A scintillation vial was charged with 0.0216 g of Polyethylene naphthalate and 2.0 g of trifluoroacetic acid. The vial was then sealed with its cap and placed onto a hot plate at approximately 70° C. for about 3 hours until the polymer was dissolved. Once dissolved, the vial was removed and allowed to cool to room temperature. It was then charged with 0.010 g of dimethyl phthalate and 0.012 g of 1-Butyl-3-methylimidazolium hexafluorophosphate. The vial was sonicated for 5 minutes to mix the solution. A 0.25 inch mask of Kapton tape was placed on the edge of a 2.5 cm×2.5 cm indium doped tin oxide glass slide which as placed onto a spin coater. The polymer solution was then pipetted onto the glass slide until it was coated with the solution. The spin coater was then set to spin at 600 revolutions per minute for 20 seconds, 2,000 revolutions per minute for 15 seconds, and 4,000 revolutions per minute for 1 second. The glass slide was then place into an oven at 110° C. for 15 minutes. After heating, the glass slide was allowed to cool to room temperature. The Kapton tape mask was removed and replaced with a copper tape electrode. To a new indium doped tin oxide glass slide, a copper tape electrode was applied on the edge, with a rubber gasket of 0.8 mm thickness placed along the edges to form a square reservoir. A gel solution containing 0.488 g propylene carbonate, 0.856 g poly(ethylene glycol) methyl ether acrylate (Mn=480 g/mol), 0.284 g poly(ethylene glycol) dimethacrylate (Mn=550 g/mol), 0.08 g tetrabutylammonium hexafluorophosphate, and 2.5 mg bis(2,4,6-trimethylbenzoyl)phenylphosphine oxide was sonicated for 10 minutes. The gel solution was then added to the reservoir on the glass slide until it was filled completely. Then the polymer coated glass slide was placed on top of the other glass slide and ultraviolet light cured for 10 minutes. Electrical leads were then placed on the copper electrodes with the polymer coated substrate acting as the working electrode. The resulting device was than activated using Chronocoulometry with a pulse of −4.5 Volts versus ground potential to observe the color change. Bleach state values (x,y) (0.321,0.331) Tp=74.39; Dark state values (x,y) (0.331, 0.386) Tp=60.01; Tp contrast=14.38; and Delta E=26.00. FIG. 13 shows transmission data in bleach state (0 V) and dark state (−4.5 V) versus ground potential. FIG. 14 shows 1931 CIE plot showing the dark and bleach state values. Table 1 reports Chronocoulometry data.

TABLE 1

| | Dark | | Bleach |
|---|---|---|---|
| Tp | 60.01 | Tp | 74.39 |
| Ts | 51.35 | Ts | 71.79 |
| Neutrality | 16.00 | Neutrality | 2.39 |
| x | 0.331 | x | 0.321 |
| y | 0.386 | y | 0.331 |
| C*ab | 25.01 | C*ab | 3.45 |
| L* | 81.85 | L* | 89.13 |
| a* | −14.01 | a* | 2.69 |
| b* | 20.72 | b* | 2.16 |

Example 7B. Solution Polymer Electrochromic Device—Polyethylene Naphtalate as Chromophore Similar results were obtained for a device prepared from a polymer solution spun coated onto an ITO glass slide:

Polyethylene naphthalate: 0.0497 g

Hexafluoroisopropanol HFIP: 2.0 g

Dimethyl phthalate: 0.0163 g

1-Butyl-3-methylimidazolium hexafluorophosphate: 0.016 g

A regular sandwich style device was fabricated with the polymer coated ITO slide with a gel electrolyte containing:

propylene carbonate: 0.488 g poly(ethylene glycol) methyl ether acrylate PEGMA: 0.856 g poly(ethylene glycol) dimethacrylate PEGDMA: 0.284 g Tetrabutylammonium hexafluorophosphate: 0.08 g bis(2,4,6-trimethylbenzoyl)phenylphosphine oxide: 2.5 mg Table 2 reports Chronocoulometry data.

TABLE 2

| | Dark | | Light | Tp Contrast |
|---|---|---|---|---|
| Tp | 60.00669011 | Tp | 74.392 | 14.38563382 |
| Ts | 51.351723 | Ts | 71.789 | |
| Neutrality | 15.9973788 | Neutrality | 2.389 | |
| x | 0.331115837 | x | 0.321 | |
| y | 0.385538158 | y | 0.331 | |
| L* | 81.84552846 | L* | 89.127 | |
| a* | −14.0132218 | a* | 2.691 | |
| b* | 20.71696671 | b* | 2.164 | |

Example 7C. Solution Polymer Electrochromic Device—Polyethylene Terephthalate as Chromophore A polymer solution was spun coat onto an ITO glass slide:

polyethylene terephthalate: 0.0493 g trifluoroacetic acid: 2.0 g

Dimethyl phthalate: 0.0100 g

1-Butyl-3-methylimidazolium hexafluorophosphate: 0.012 g

A regular sandwich style device was fabricated with the polymer coated ITO slide with a gel electrolyte containing:

propylene carbonate: 0.488 g poly(ethylene glycol) methyl ether acrylate PEGMA: 0.856 g poly(ethylene glycol) dimethacrylate PEGDMA: 0.284 g Tetrabutylammonium hexafluorophosphate TBAPF6: 0.08 g bis(2,4,6-trimethylbenzoyl)phenylphosphine oxide BAPO: 2.5 mg Table 3 reports Chronocoulometry data.

TABLE 3

| | Dark | | Light | Tp Contrast |
|---|---|---|---|---|
| Tp | 30.13905934 | Tp | 76.329 | 46.1900386 |
| Ts | 23.3189428 | Ts | 75.726 | |
| Neutrality | 61.86178426 | Neutrality | 0.841 | |
| x | 0.374632052 | x | 0.314 | |
| y | 0.252899595 | y | 0.325 | |
| L* | 62.07166248 | L* | 90.016 | |
| a* | 53.64615462 | a* | 2.602 | |
| b* | −14.25864678 | b* | −1.150 | |

Figure 15:
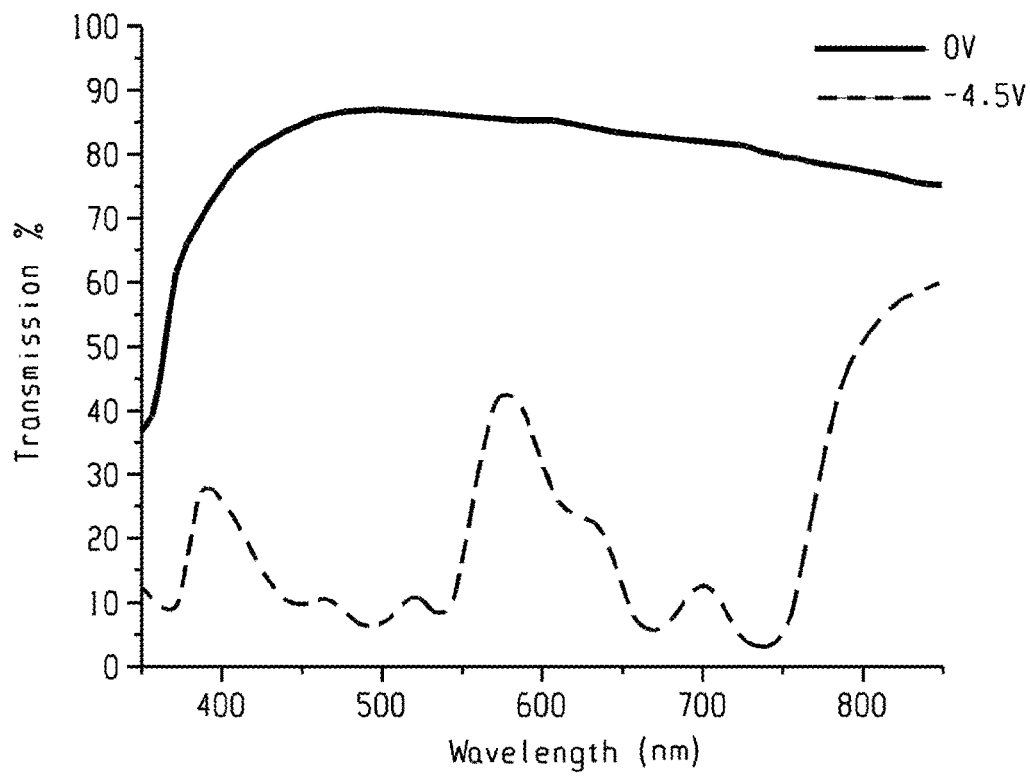
FIG. 15 illustrates transmission data in bleach state (0 V) and dark state (−4.5 V) versus ground potential for a solution processed electrochromic device using an 80:20 polyethylene naphthalate-co-polyethylene terephthalate copolymer as the chromophore.
Figure 16:
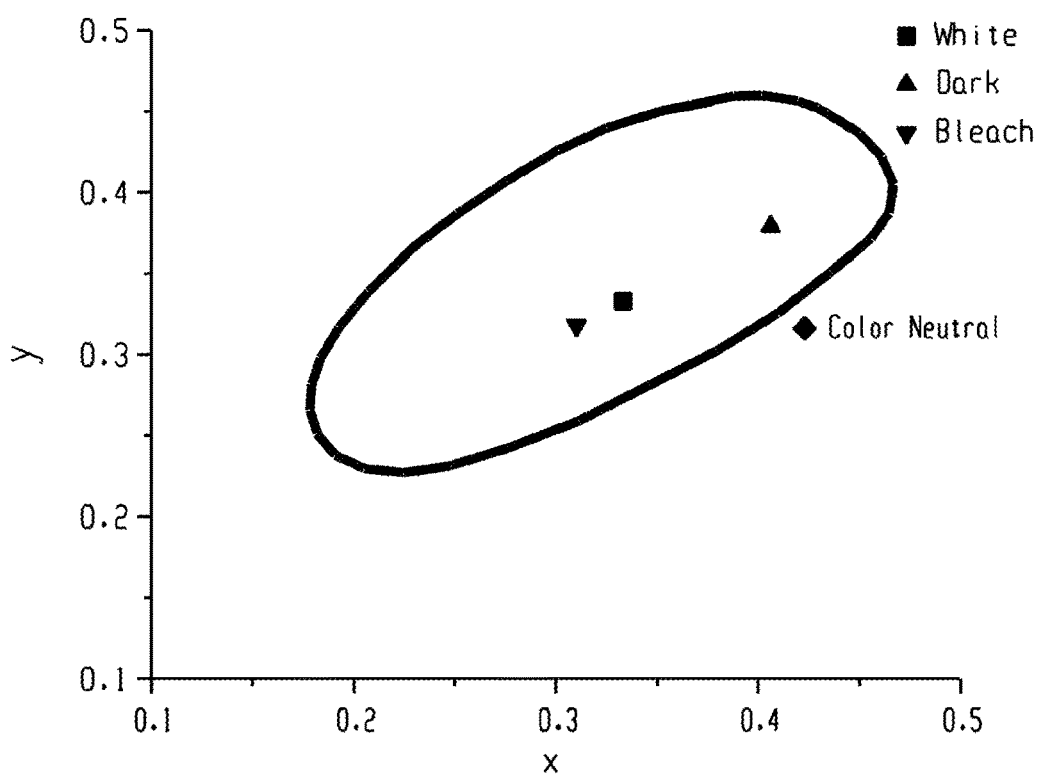
FIG. 16 illustrates a 1931 CIE plot showing the dark and bleach state values for a solution processed electrochromic device using an 80:20 polyethylene naphthalate-co-polyethylene terephthalate copolymer as the chromophore.

Example 8. Solution Polymer Electrochromic Device—80:20 Polyethylene naphthalate-co-polyethylene Terephthalate Copolymer as Chromophore Both polyethylene terephthalate and Polyethylene naphthalate were dried at 120° C. in a vacuum oven for 12 hours prior to use. A combination of 80 mol % Polyethylene naphthalate and 20 mol % polyethylene terephthalate were placed in the a flame dried two neck-round bottom flask equipped with magnetic stirring bar and connected to a reflux condenser and a Schlenk line filled with argon gas. Then, the flask was flame dried further while purging it with argon gas. Trifluoroacetic acid and o-chlorophenol were added to the flask and refluxed at 180° C. for 6-12 hours. The mixture was then precipitated in cold methanol, filtered and washed with methanol. The product was then dried in vacuum oven at 180° C. for 12 hours. A scintillation vial was charged with 0.057 g of the product and 2.0 g of trifluoroacetic acid. The vial was then sealed with its cap and placed onto a hot plate at approximately 70° C. for about 30 minutes until the polymer was dissolved. Once dissolved, the vial was removed and allowed to cool to room temperature. It was then charged with 0.010 g of dimethyl phthalate and 0.012 g of 1-Butyl-3-methylimidazolium hexafluorophosphate. The vial was sonicated for 5 minutes to mix the solution. A 0.25 inch mask of Kapton tape was placed on the edge of a 2.5 cm×2.5 cm indium doped tin oxide glass slide which as placed onto a spin coater. The polymer solution was then pipetted onto the glass slide until it was coated with the solution. The spin coater was then set to spin at 600 revolutions per minute for 20 seconds, 2,000 revolutions per minute for 15 seconds, and 4,000 revolutions per minute for 1 second. The glass slide was then place into an oven at 110° C. for 15 minutes. After heating, the glass slide was allowed to cool to room temperature. The Kapton tape mask was removed and replaced with a copper tape electrode. To a new indium doped tin oxide glass slide, a copper tape electrode was applied on the edge, with a rubber gasket of 0.8 mm thickness placed along the edges to form a square reservoir. A gel solution containing 0.488 g propylene carbonate, 0.856 g poly(ethylene glycol) methyl ether acrylate (Mn=480 g/mol), 0.284 g poly(ethylene glycol) dimethacrylate (Mn=550 g/mol), 0.08 g tetrabutylammonium hexafluorophosphate, and 2.5 mg bis(2,4,6-trimethylbenzoyl)phenylphosphine oxide was sonicated for 10 minutes. The gel solution was then added to the reservoir on the glass slide until it was filled completely. Then the polymer coated glass slide was placed on top of the other glass slide and ultraviolet light cured for 10 minutes. Electrical leads were then placed on the copper electrodes with the polymer coated substrate acting as the working electrode. The resulting device was than activated using Chronocoulometry with a pulse of −4.5 V versus ground potential to observe the color change. FIG. 15 shows transmission data in bleach state (0 V) and dark state (−4.5 V) versus ground potential. FIG. 16 shows 1931 CIE plot showing the dark and bleach state values. Table 4 reports Chronocoulometry data.

TABLE 4

| | Dark | | Bleach |
|---|---|---|---|
| Tp | 21.97 | Tp | 85.92 |
| Ts | 11.43 | Ts | 86.92 |
| Neutrality | 40.90 | Neutrality | 1.21 |
| x | 0.409 | x | 0.310 |
| y | 0.375 | y | 0.319 |
| C*ab | 27.08 | C*ab | 5.37 |
| L* | 54.20 | L* | 94.27 |
| a* | 14.01 | a* | 3.28 |
| b* | 23.18 | b* | −4.25 |

Example 9. Solution Polymer Electrochromic Device—Various Polyethylene naphthalate-co-polyethylene Terephthalate Copolymer as Chromophore A. Transesterification of polyethylene terephthalate (PET) and polyethylene naphthalate (PEN) produces a homogenous film of different color. Different ratios of the two polymers yield a different result. Devices demonstrate color neutrality, along with a large change in photopic contrast.

A polymer solution was spun coat onto an ITO glass slide:
40:60 PEN:PET 0.0495 g
trifluoroacetic acid: 2.03 g
Diethyl phthalate: 0.0160 g
1-Butyl-3-methylimidazolium hexafluorophosphate BMIMPF6: 0.0204 g A regular sandwich style device was fabricated with the polymer coated ITO slide with a gel electrolyte containing:
propylene carbonate PC: 0.488 g
poly(ethylene glycol) methyl ether acrylate PEGMA: 0.856 g
poly(ethylene glycol) dimethacrylate PEGDMA: 0.284 g
Tetrabutylammonium hexafluorophosphate TBAPF6: 0.08 g
bis(2,4,6-trimethylbenzoyl)phenylphosphine oxide BAPO: 2.5 mg Table 5 reports Chronocoulometry data.

TABLE 5

| | Dark | | Light | Tp Contrast |
|---|---|---|---|---|
| Tp | 17.61417711 | Tp | 82.679 | 65.06468396 |
| Ts | 9.399597371 | Ts | 83.003 | |
| Neutrality | 42.54616115 | Neutrality | 0.795 | |
| x | 0.411058008 | x | 0.312 | |
| y | 0.330090708 | y | 0.321 | |
| L* | 49.26174659 | L* | 92.869 | |
| a* | 26.50826922 | a* | 3.069 | |
| b* | 11.66086029 | b* | −3.018 | |

B. Both polyethylene terephthalate and Polyethylene naphthalate were dried at 120° C. in a vacuum oven for 12 hours prior to use. A combination of 43 mol % Polyethylene naphthalate and 57 mol % polyethylene terephthalate were placed in the a flame dried two neck-round bottom flask equipped with magnetic stirring bar and connected to a reflux condenser and a Schlenk line filled with argon gas. Then, the flask was flame dried further while purging it with argon gas. Trifluoroacetic acid and o-chlorophenol were added to the flask and refluxed at 180° C. for 6-12 hours. The mixture was then precipitated in cold methanol, filtered and washed with methanol. The product was then dried in vacuum oven at 280° C. for 3-6 hours. A scintillation vial was charged with 0.057 g of the product and 2.0 g of trifluoroacetic acid. The vial was then sealed with its cap and placed onto a hot plate at approximately 70° C. for about 30 minutes until the polymer was dissolved. Once dissolved, the vial was removed and allowed to cool to room temperature. It was then charged with 0.010 g of dimethyl phthalate and 0.012 g of 1-Butyl-3-methylimidazolium hexafluorophosphate. The vial was sonicated for 5 minutes to mix the solution. A 0.25 inch mask of Kapton tape was placed on the edge of a 2.5 cm×2.5 cm indium doped tin oxide glass slide which as placed onto a spin coater. The polymer solution was then pipetted onto the glass slide until it was coated with the solution. The spin coater was then set to spin at 600 revolutions per minute for 20 seconds, 2,000 revolutions per minute for 15 seconds, and 4,000 revolutions per minute for 1 second. The glass slide was then place into an oven at 110° C. for 15 minutes. After heating, the glass slide was allowed to cool to room temperature. The Kapton tape mask was removed and replaced with a copper tape electrode. To a new indium doped tin oxide glass slide, a copper tape electrode was applied on the edge, with a rubber gasket of 0.8 mm thickness placed along the edges to form a square reservoir. A gel solution containing 0.488 g propylene carbonate, 0.856 g poly(ethylene glycol) methyl ether acrylate (Mn=480 g/mol), 0.284 g poly(ethylene glycol) dimethacrylate (Mn=550 g/mol), 0.08 g tetrabutylammonium hexafluorophosphate, and 2.5 mg bis(2,4,6-trimethylbenzoyl)phenylphosphine oxide was sonicated for 10 minutes. The gel solution was then added to the reservoir on the glass slide until it was filled completely. Then the polymer coated glass slide was placed on top of the other glass slide and ultraviolet light cured for 10 minutes. Electrical leads were then placed on the copper electrodes with the polymer coated substrate acting as the working electrode. The resulting device was than activated using Chronocoulometry with a pulse of −4.5 V versus ground potential to observe the color change. White point and bleach are overlapped. Table 6 reports Chronocoulometry data.

TABLE 6

| | Dark | | Light | Tp Contrast |
|---|---|---|---|---|
| Tp | 21.96661767 | Tp | 85.922 | 63.95550386 |
| Ts | 11.43075994 | Ts | 86.918 | |
| Neutrality | 40.90149607 | Neutrality | 1.211 | |
| x | 0.408647284 | x | 0.310 | |
| y | 0.375371628 | y | 0.319 | |
| L* | 54.20068706 | L* | 94.274 | |
| a* | 14.00503892 | a* | 3.281 | |
| b* | 23.18177548 | b* | −4.250 | |

C. Data for additional solution processed PET:PEN electrochromic devices with 100% to 0% PET composition are provided in Table 7.

TABLE 7

| | | Photopic Transmission | Neutrality | l* | a* | b* | Photopic Contrast | Δ E |
|---|---|---|---|---|---|---|---|---|
| PEN | Neutral | 74.39 | 2.44 | 89.1 | 2.7 | 2.3 | | |
| PEN | Reduced | 60.01 | 15.94 | 81.9 | −13.6 | 20.9 | 14.38 | 25.76 |
| PET:PEN (10:90) | Neutral | 73.41 | 3.91 | 88.7 | 2.2 | 5.7 | | |
| PET:PEN (10:90) | Reduced | 40.49 | 25.97 | 69.8 | −7.8 | 44.3 | 32.92 | 44.01 |
| PET:PEN (20:80) | Neutral | 72.88 | 5.92 | 88.4 | 1.5 | 10.2 | | |
| PET:PEN (20:80) | Reduced | 30.84 | 38.35 | 62.4 | −14.8 | 40.0 | 42.04 | 42.76 |
| PET:PEN (30:70) | Neutral | 72.35 | 4.46 | 88.1 | 2.5 | 6.0 | | |
| PET:PEN (30:70) | Reduced | 19.03 | 45.40 | 50.7 | −0.5 | 40.3 | 53.32 | 50.79 |
| PET:PEN (40:60) | Neutral | 70.62 | 6.09 | 87.3 | 1.8 | 10.1 | | |
| PET:PEN (40:60) | Reduced | 23.43 | 42.68 | 55.5 | −5.0 | 38.8 | 47.18 | 43.35 |
| PET:PEN (50:50) | Neutral | 66.94 | 6.74 | 85.5 | 2.4 | 9.8 | | |
| PET:PEN (50:50) | Reduced | 20.14 | 40.93 | 52.0 | 11.3 | 28.9 | 46.79 | 39.56 |
| PET:PEN (60:40) | Neutral | 82.68 | 0.79 | 92.9 | 3 | −2.9 | | |
| PET:PEN (60:40) | Reduced | 17.61 | 43.32 | 49 | 27.6 | 10.8 | 65.06 | 52.1 |
| PET:PEN (76:24) | Neutral | 85.8 | 1.11 | 94.2 | 3.5 | −4.6 | | |
| PET:PEN (76:24) | Reduced | 18.98 | 54.31 | 50.6 | 38 | 8.8 | 66.82 | 57.1 |
| PET:PEN (84:16) | Neutral | 82.67 | 0.73 | 92.9 | 3.1 | −3 | | |
| PET:PEN (84:16) | Reduced | 20.76 | 34.97 | 52.7 | 34 | −7.5 | 61.91 | 50.9 |
| PET:PEN (91:9) | Neutral | 81.88 | 0.83 | 92.5 | 2.7 | −1.8 | | |
| PET:PEN (91:9) | Reduced | 20.94 | 74.72 | 52.9 | 61.3 | −24.9 | 60.94 | 74.4 |
| PET | Neutral | 76.33 | 0.85 | 90 | 2.5 | −1 | | |
| PET | Reduced | 30.14 | 62.37 | 61.8 | 54.1 | −15.3 | 46.19 | 60.5 |

Figure 17:
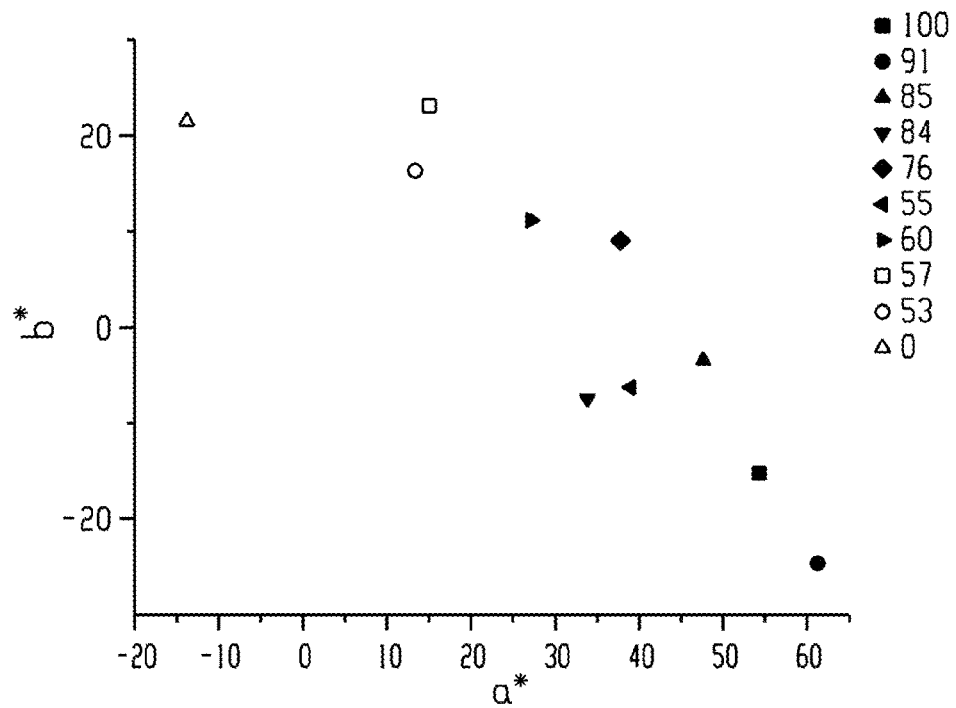
FIG. 17 illustrates a 1931 CIE plot showing the dark state values for solution processed PET:PEN devices with 100% to 0% PET composition.

FIG. 17 1931 CIE plot showing the dark state values for solution processed PET:PEN devices with 100% to 0% PET composition.

Example 10. Solution Polymer Electrochromic Device—Copolythioester as Chromophore

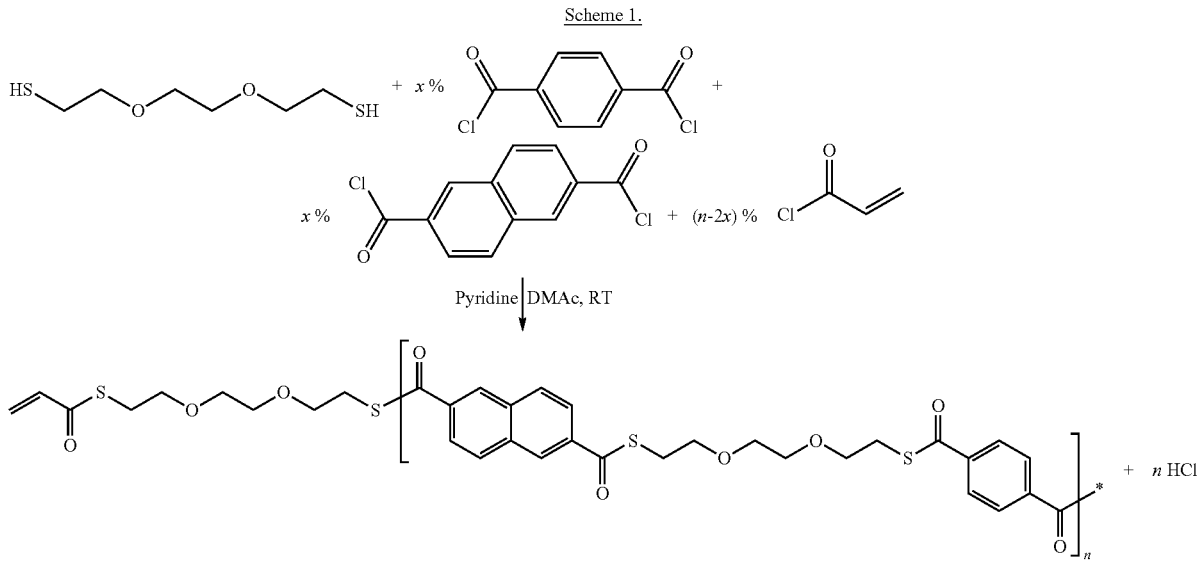

Scheme 1.

Figure 20:
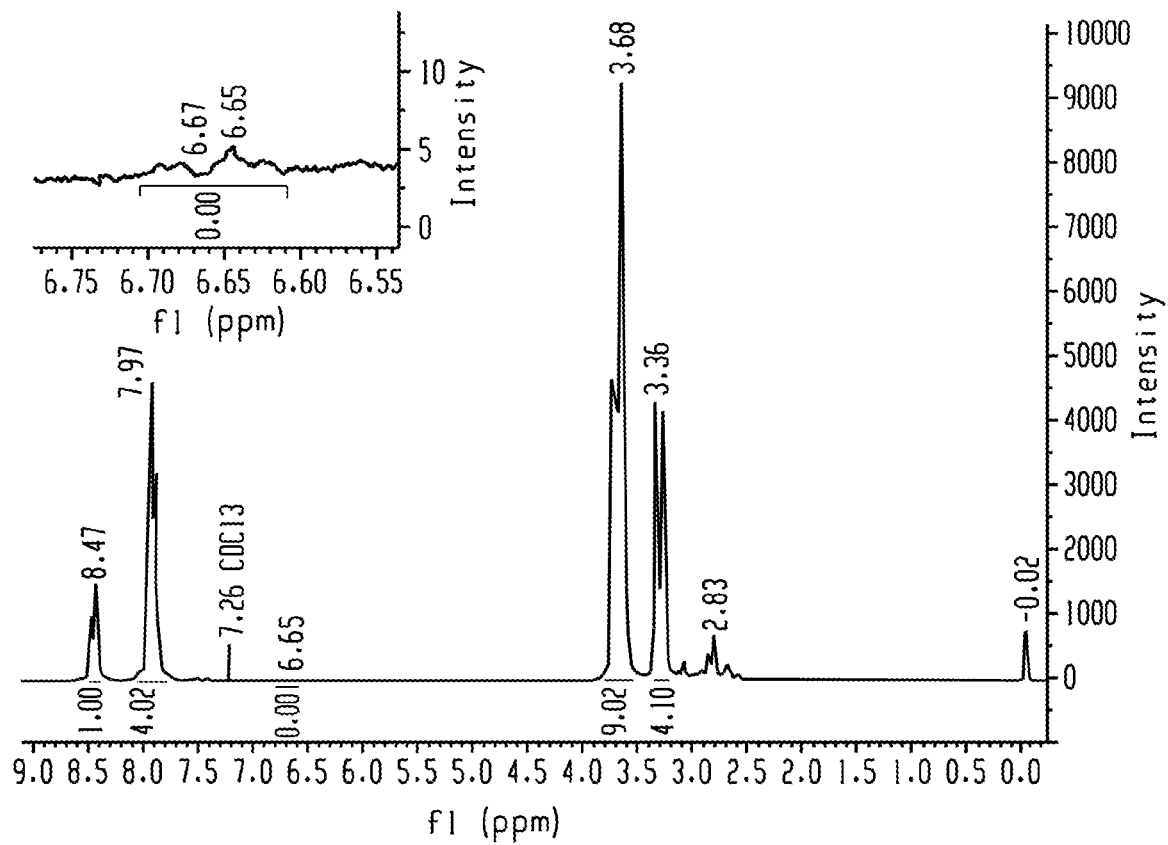
FIG. 20 is the $^1$H NMR spectrum of the copolythioester of Example 10.

Copolythioester of Scheme 1 comprises thionaphthalate and thiobenzoate electrochromophores and a crosslinkable endcap. (1.055 g 5.2 mmol) of Terephthaloyl chloride and (1.316 g, 5.2 mmol) of 2,6-Naphthalenedicarboxylic diacid chloride were charged to a flame dried single neck round bottom flask. Purged with argon gas and DMAc was added to dissolve it at room temp. The 2,6-Naphthalenedicarboxylic diacid chloride was not completely soluble. Pyridine was added dropwise to the flask and stirred at room temperature. After 20 min, a yellow suspension formed. This shows the pyridine reacted with the acid chlorides to form pyridinium salt. Then, acroylyl chloride was added to the flask followed by (10.94 mmol, 1.875 mL) of 2,2'-(Ethylenedioxy)diethanethiol. The yellow turbid suspension was cleared off after addition of the thiol to give an orangish solution and then turned yellow suspension solution after few minutes. The reaction left stirring at room temperature for 72 hrs. The reaction mixture turned to off-white to pale yellow suspension. The mixture was precipitated in cold methanol and filtered to give a pale yellow solid. Then the solid was crashed and suspended in water to remove the pyridinium salt. Then, filtered to give pale yellow solid. Then, re-suspended in methanol and filtered to give pale yellow solid. Finally washed with diethyl ether to facilitate air drying. A dry pale yellow solid was collected. The solid was dried in a vacuum oven at 150° C. for 24 hours and $^1$H NMR was obtained in CDCl$_3$ and the spectrum is provided in FIG. 20.

Figure 18:
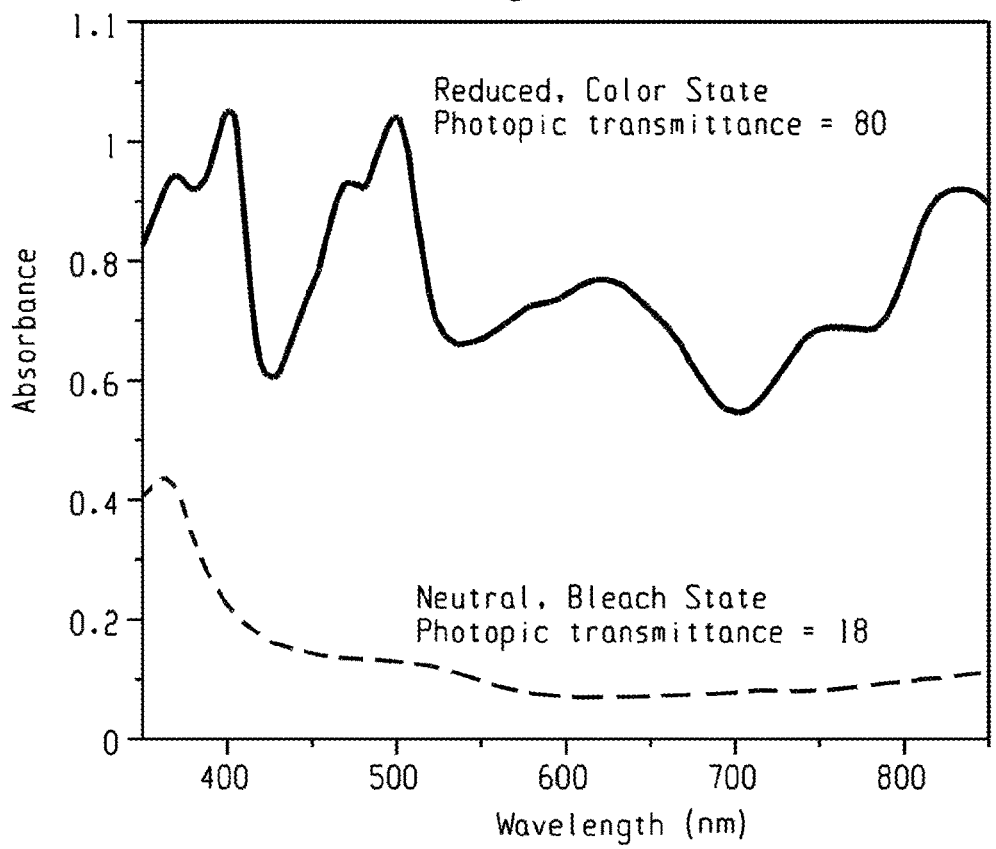
FIG. 18 illustrates visible spectroscopy of the electrochromic device of a copolythioester in the colored and bleached states.
Figure 19:
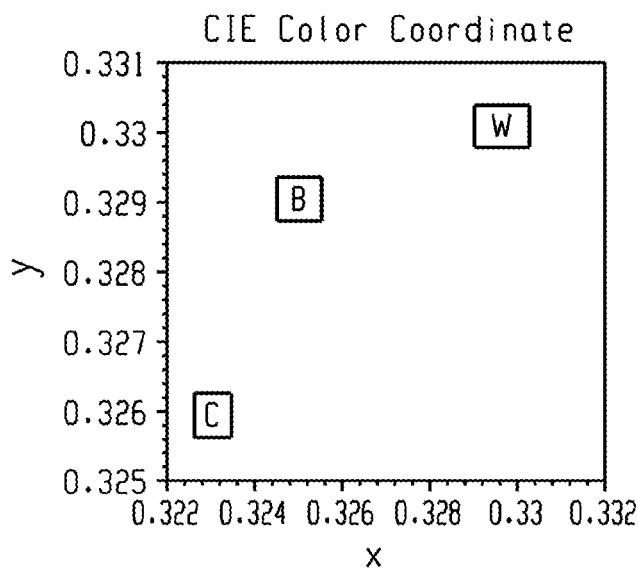
FIG. 19 illustrates a CIE x,y color coordinates graph showing proximity of the colors generated to the white point for an electrochromic device of a copolythioester of Example 10.

The copolythioester (0.0516 g) along with 0.1 wt % bis(2,4,6-trimethylbenzoyl)phenylphosphine oxide BAPO photoinitiator was dissolved in dichloromethane (2.13 g). This solution was then spun coat onto an indium doped tin oxide glass slide at 500 rpm for 20 seconds, 2000 rpm for 20 s and 4000 rpm for 2 s. The substrate was then UV cured for 10 minutes. The coated substrate was then dried at 130° C. for 20 minutes. A gel electrolyte was made using propylene carbonate (1.35 g), poly(ethylene glycol) methyl ether acrylate PEGMA (1.08 g), Polyethyleneglycol monoacrylate (0.27 g), tetrabutylammonium hexafluorophosphate (0.27 g), and BAPO photoinitiator (3 mg) was dropped onto the other piece of ITO glass. Device was crosslinked/polymerized under ultraviolet light for 10 minutes. Potentials of −4.4 V and +3.0 V vs. ground were used to switch between the color and bleach state, respectively. Photopic Contrast=62%; Military Neutrality=12% color state, 5% bleach state. FIG. 18 visible spectroscopy of the electrochromic device of a copolythioester in the colored and bleached states. FIG. 19 along CIE x,y color coordinates graph showing proximity of the colors generated to the white point.

Figure 21:
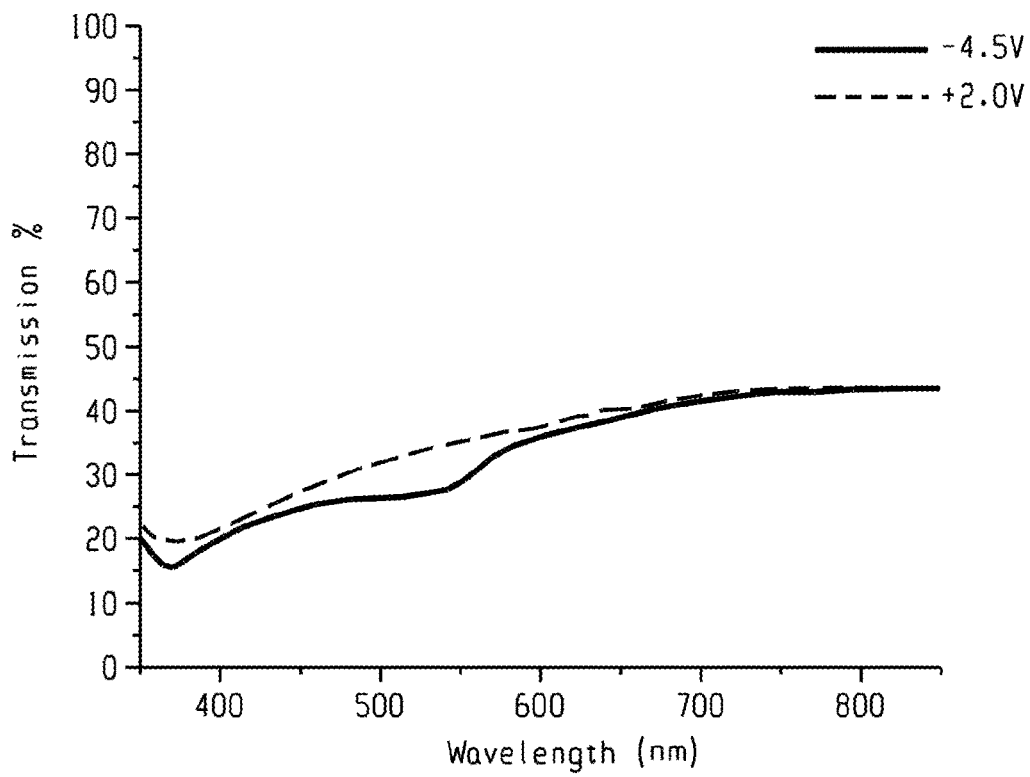
FIG. 21 illustrates a transmission data in bleach state (0 V) and dark state (−4.5 V) versus ground potential for a melt processed electrochromic device using polyethylene terephthalate as chromophore.
Figure 22:
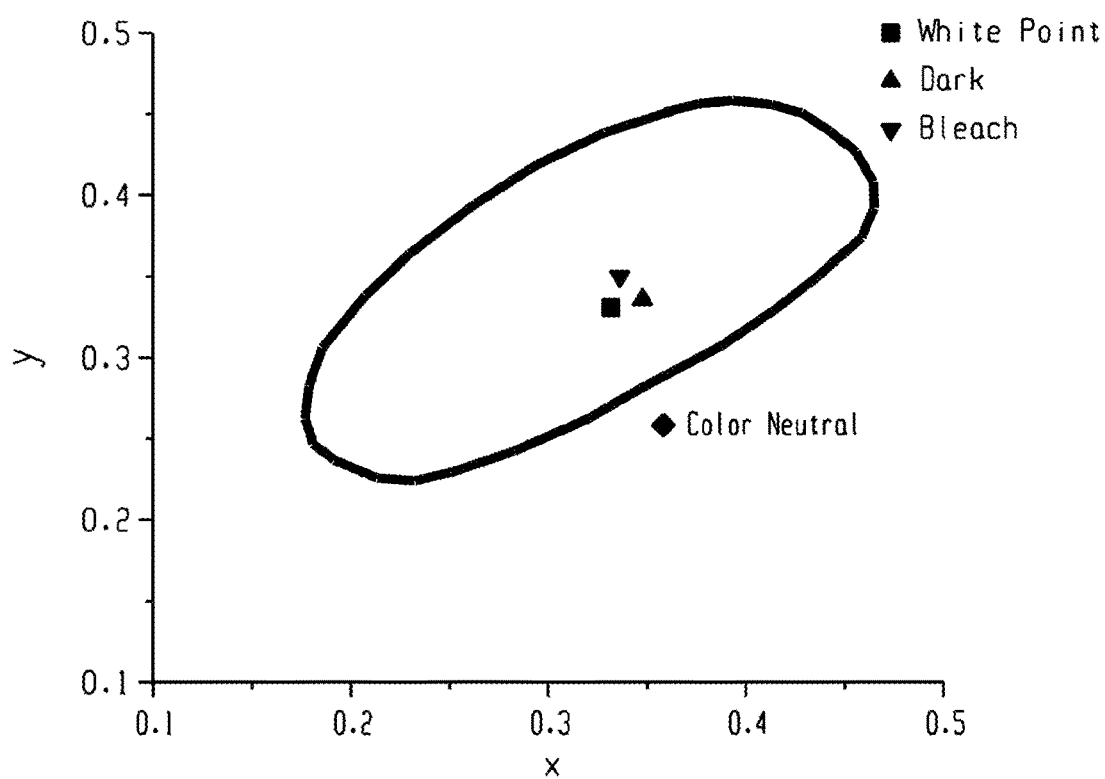
FIG. 22 illustrates a 1931 CIE plot showing the dark and bleach state values for a melt processed electrochromic device using polyethylene terephthalate as chromophore.

Example 11. Melt Processed Polymer Electrochromic Device—Polyethylene Terephthalate as Chromophore 0.2 g of Polyethylene terephthalate was placed onto a 2.5 cm×2.5 cm indium doped tin oxide glass slide which was on top of a heating plate at approximately 260° C. for 3 minutes until the polymer melted onto the substrate. 0.15 ml of 1-Butyl-3-methylimidazolium hexafluorophosphate was then dropped onto the substrate and mixed into the polyethylene terephthalate melt with a spatula. Another indium doped tin oxide glass slide was then placed slightly offset on top of the melted composite and pressed down to form a uniform film. The device was then removed from the hotplate and allowed to cool to room temperature. Copper tape leads were then pressed onto the exposed, indium doped tin oxide glass slide forming electrodes. The resulting device was than activated using Chronocoulometry with a pulse of −4.5 Volts versus ground potential to observe the color change. Bleach state values (x,y) (0.337,0.344) Tp=35.42; Dark state values (x,y) (0.347, 0.335) Tp=30.93; Tp contrast 4.49; and Delta E=7.12. FIG. 21 melt processed electrochromic device using polyethylene terephthalate as chromophore transmission data in bleach state (0 V) and dark state (−4.5 V) versus ground potential. FIG. 22 1931 CIE plot showing the dark and bleach state values. Table 8 reports Chronocoulometry data.

TABLE 8

| Dark | | Bleach | |
|---|---|---|---|
| Tp | 30.93 | Tp | 35.42 |
| Ts | 26.91 | Ts | 31.89 |
| Neutrality | 15.79 | Neutrality | 8.90 |
| x | 0.347 | x | 0.337 |
| y | 0.335 | y | 0.344 |
| C*ab | 11.68 | C*ab | 8.29 |
| L* | 62.54 | L* | 66.13 |
| a* | 9.89 | a* | 3.84 |
| b* | 6.21 | b* | 7.34 |

Figure 23:
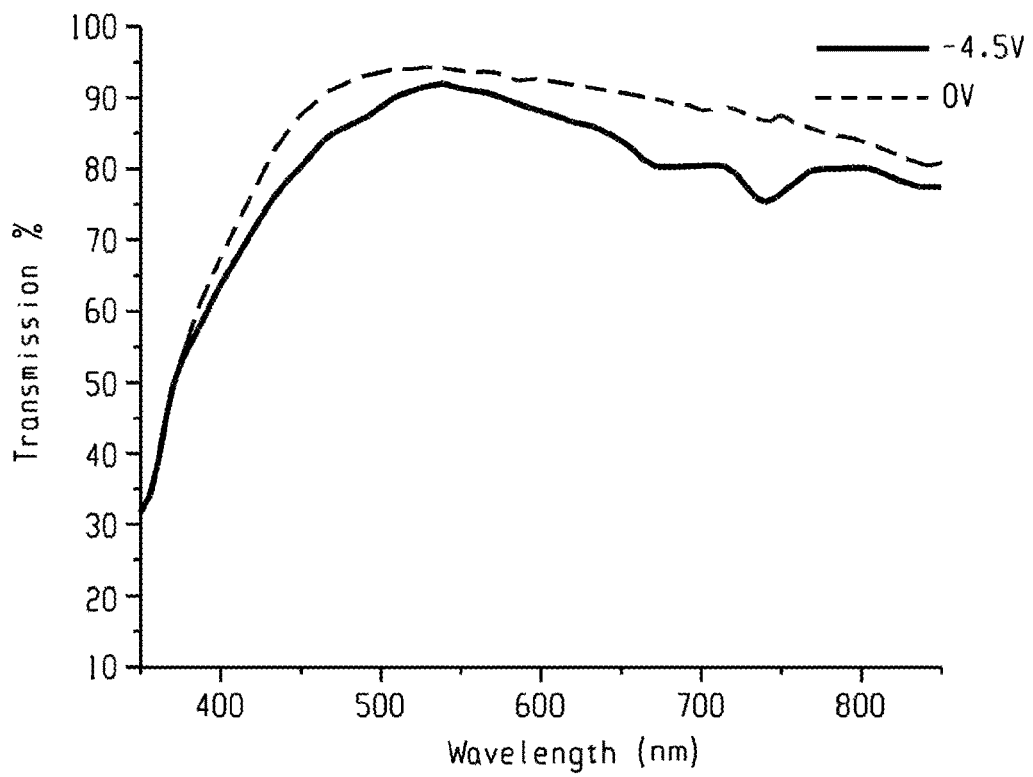
FIG. 23 illustrates transmission data in bleach state (0 V) and dark state (−4.5 V) versus ground potential for a melt processed electrochromic device using polyethylene naphthalate as chromophore.
Figure 24:
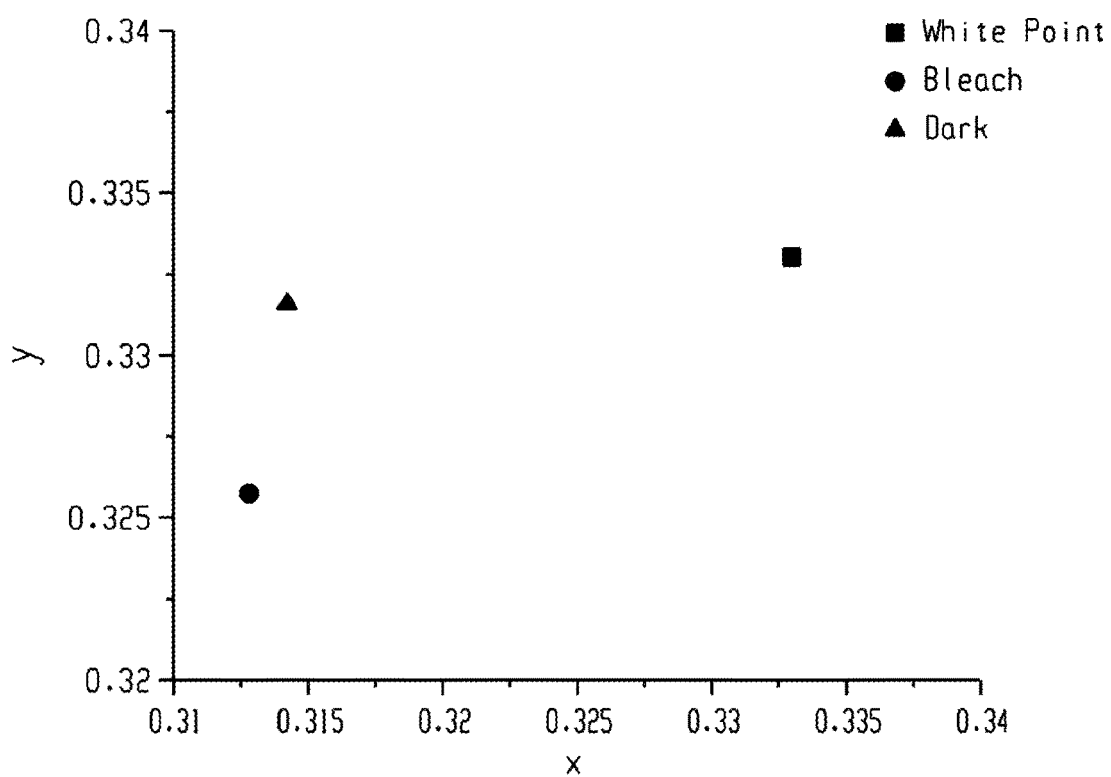
FIG. 24 illustrates a 1931 CIE plot showing the dark and bleach state values for a melt processed electrochromic device using polyethylene naphthalate as chromophore.

Example 12. Melt Processed Polymer Electrochromic Device—Polyethylene Naphthalate as Chromophore 0.2 g of Polyethylene naphthalate was placed onto a 2.5 cm×2.5 cm indium doped tin oxide glass slide which was on top of a heating plate at approximately 260° C. for 3 minutes until the polymer melted onto the substrate. 0.15 ml of 1-Butyl-3-methylimidazolium tetrafluoroborate was then dropped onto the substrate and mixed into the polyethylene naphthalate melt with a spatula. Another indium doped tin oxide glass slide was then placed slightly offset on top of the melted composite and pressed down to form a uniform film. The device was then removed from the hotplate and allowed to cool to room temperature. Copper tape leads were then pressed onto the exposed, indium doped tin oxide glass slide forming electrodes. The resulting device was than activated using Chronocoulometry with a pulse of −4.5 Volts versus ground potential to observe the color change. Bleach (x,y) (0.312, 0.325) Tp=92.92; Dark (x,y) (0.314, 0.331) Tp=89.24; Tp contrast=3.69; and Delta E=3.577. FIG. 23 Melt processed electrochromic device using Polyethylene naphthalate with transmission data in bleach state (0 V) and dark state (−4.5 V) versus ground potential. FIG. 24 1931 CIE plot showing the dark and bleach state values. Table 9 reports Chronocoulometry data.

TABLE 9

| Dark-4.5 V | | Bleach | 0 V | |
|---|---|---|---|---|
| Tp | 89.24238 | Tp | 92.92957 | Delta E 3.577632 |
| Ts | 87.95035 | Ts | 92.77078 | |
| Neutrality | 3.179515 | Neutrality | 1.443554 | TP 3.687194 |
| x | 0.314211 | x | 0.312814 | |
| y | 0.331496 | y | 0.325707 | |
| c*ab | 1.269255 | c*ab | 2.104954 | |
| L* | 95.686 | L* | 97.20016 | |
| a* | −0.44153 | a* | 1.695992 | |
| b* | 1.189984 | b* | −1.24667 | |

Figure 25:
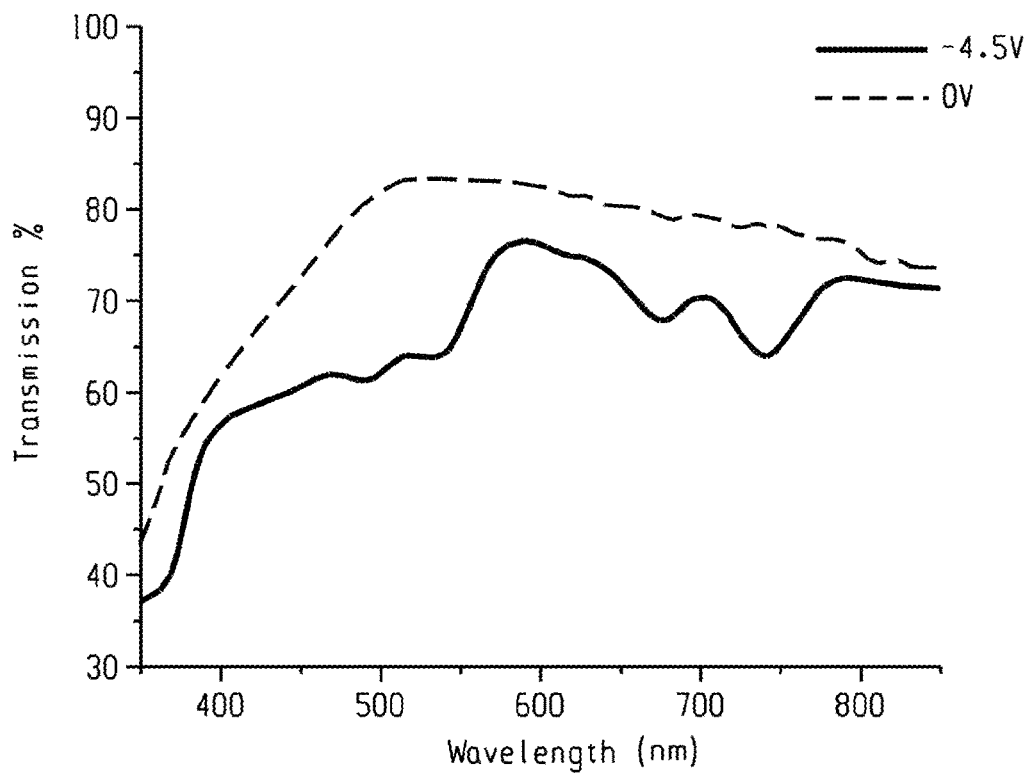
FIG. 25 illustrates a transmission data in bleach state (0 V) and dark state (−4.5 V) versus ground potential for a melt processed electrochromic device using 50:50 polyethylene naphthalate-co-polyethylene terephthalate copolymer as chromophore.
Figure 26:
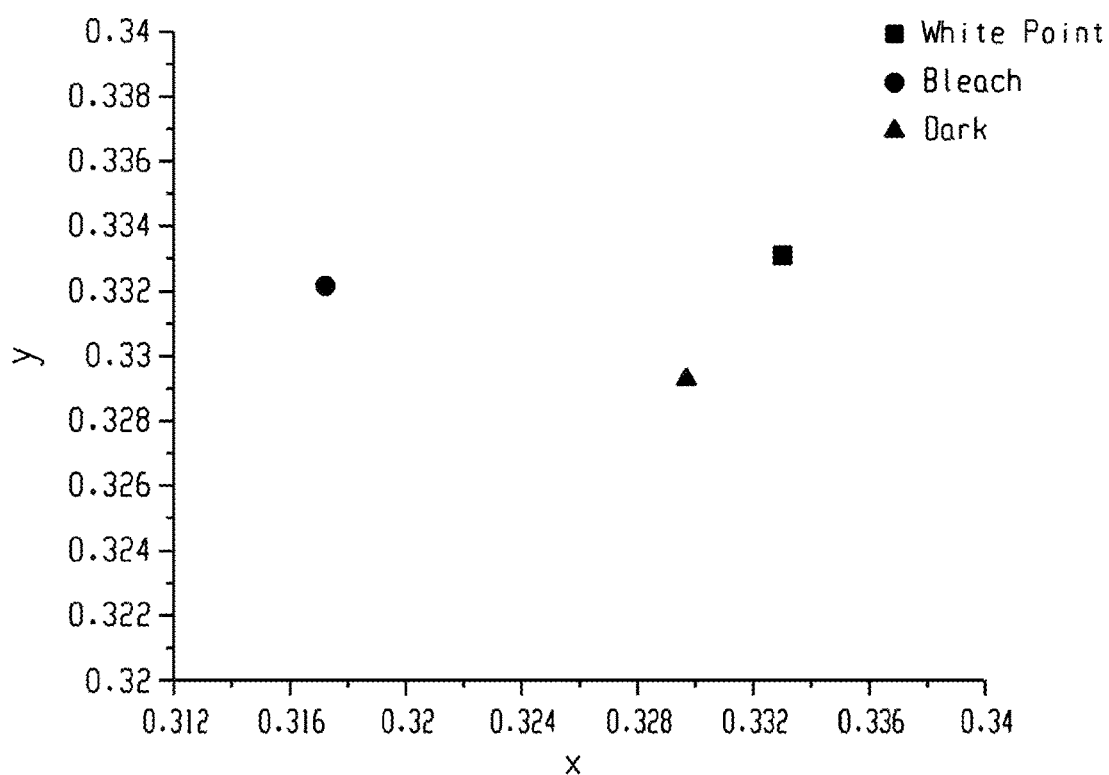
FIG. 26 illustrates a 1931 CIE plot showing the dark and bleach state values for an electrochromic device using 50:50 polyethylene naphthalate-co-polyethylene terephthalate copolymer as chromophore.

Example 13. Melt Processed Polymer Electrochromic Device—45:55 Polyethylene Naphthalate-co-Polyethylene Terephthalate Copolymer as Chromophore Both polyethylene terephthalate and Polyethylene naphthalate were dried at 120° C. in a vacuum oven for 12 hours prior to use. A combination of 50 mol % Polyethylene naphthalate and 50 mol % polyethylene terephthalate were placed in the a flame dried two neck-round bottom flask equipped with magnetic stirring bar and connected to a reflux condenser and a Schlenk line filled with argon gas. Then, the flask was flame dried further while purging it with argon gas. Trifluoroacetic acid were added to the flask and is was stirred at 290° C. for 12 hours. The mixture was then precipitated in cold methanol, filtered and washed with methanol. The product was then dried in vacuum oven at 180° C. for 12 hours. 0.2 g of a 50:50 Polyethylene naphthalate-co-polyethylene terephthalate copolymer was placed onto a 2.5 cm×2.5 cm indium doped tin oxide glass slide which was on top of a heating plate at approximately 260° C. for 3 minutes until the polymer melted onto the substrate. 0.15 ml of 1-Butyl-3-methylimidazolium tetrafluoroborate was then dropped onto the substrate and mixed into the copolymer melt with a spatula. Another indium doped tin oxide glass slide was then placed slightly offset on top of the melted composite and pressed down to form a uniform film. The device was then removed from the hotplate and allowed to cool to room temperature. Copper tape leads were then pressed onto the exposed, indium doped tin oxide glass slide forming electrodes. The resulting device was than activated using chronocoulometry with a pulse of −4.5 Volts versus ground potential to observe the color change. Bleach (x,y) (0.317, 0.332) Tp=82.63; Dark (x,y) (0.329, 0.329) Tp=69.61; Tp contrast=13.02; and Delta E=9.29. FIG. 25 Melt processed electrochromic device using 50:50 Polyethylene naphthalate-co-polyethylene terephthalate copolymer transmission data in bleach state (0 V) and dark state (−4.5 V) versus ground potential. FIG. 26 1931 CIE plot showing the dark and bleach state values. Table 10 reports Chronocoulometry data.

TABLE 10

| Dark-4.5 V | | Bleach | 0 V | |
|---|---|---|---|---|
| Tp | 69.61 | Tp | 82.63 | Delta E 9.299 |
| Ts | 64.102 | Ts | 80.71 | |
| Neutrality | 6.588 | Neutrality | 1.895 | TP 13.020 |
| x | 0.330 | x | 0.317 | |
| y | 0.329 | y | 0.332 | |
| c*ab | 8.342 | c*ab | 2.095 | |
| L* | 86.80 | L* | 92.850 | |
| a* | 7.79 | a* | 0.807 | |
| b* | 2.98 | b* | 1.93 | |

Figure 27:
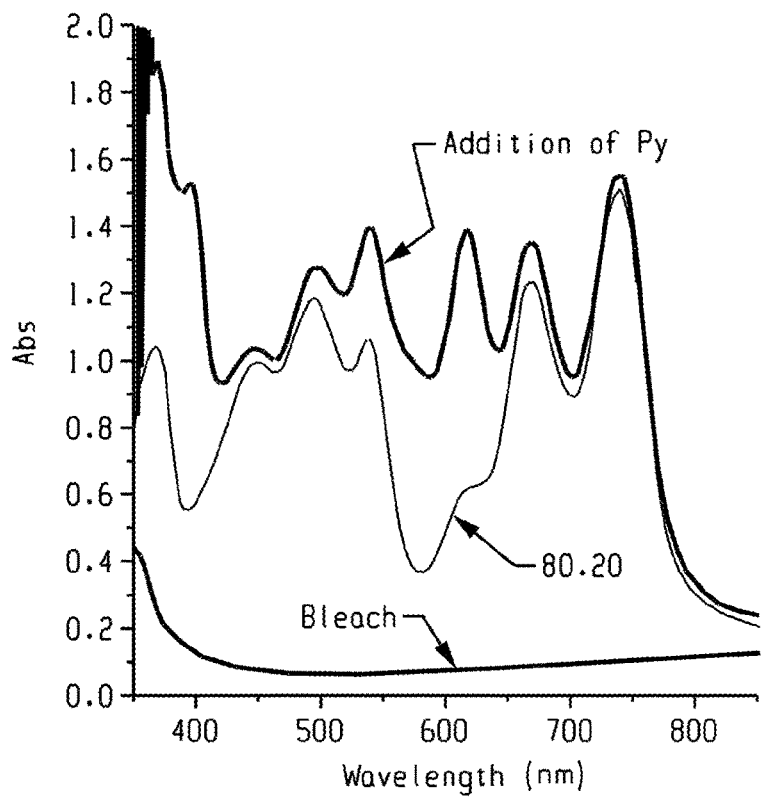
FIG. 27 illustrates an absorbance spectrum including a middle trace in the dark state (−4.4 V) for experimentally obtained 80:20 polyethylene naphthalate-co-polyethylene terephthalate copolymer prepared by transesterification in solution, the bottom trace in the bleach state (0 V), and the top trace is a simulation of Py-DiBTE added to the polyethylene naphthalate-co-polyethylene terephthalate copolymer blend or added to the copolymer melt.

Example 14. Formation of a "Perfect" Electrochromic Device with Polyethylene naphthalate-co-polyethylene Terephthalate Copolymer and Py-DiBTE as Chromophores FIG. 27 is an absorbance spectrum illustrating by the middle trace in the dark state (−4.4 V) for experimentally obtained 80:20 polyethylene naphthalate-co-polyethylene terephthalate copolymer prepared by transesterification in solution (similar to Example 9B) and the bottom trace in the bleach state (0 V). The top trace is a simulation with Py-DiBTE added to the Polyethylene naphthalate-co-polyethylene terephthalate copolymer blend or added to the melt.

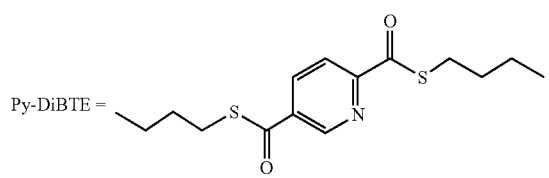 [SMILES: CCCCSC(=O)c1ccc(C(=O)SCCCC)nc1]

Py-DiBTE =

Data for the simulation are provided in the Table 11 below.

TABLE 11

|  | Dark |  | Light | Tp Contrast |
|---|---|---|---|---|
| Tp | 7.118080141 | Tp | 85.922 | 78.80404139 |
| Ts | 7.012938899 | Ts | 86.918 |  |
| Neutrality | 12.30557904 | Neutrality | 1.211 |  |
| x | 0.306095189 | x | 0.310 |  |
| y | 0.277807547 | y | 0.319 |  |
| L* | 32.13497319 | L* | 94.274 |  |
| a* | 10.47529374 | a* | 3.281 |  |
| b* | −9.307523719 | b* | −4.250 |  |

Figure 28:
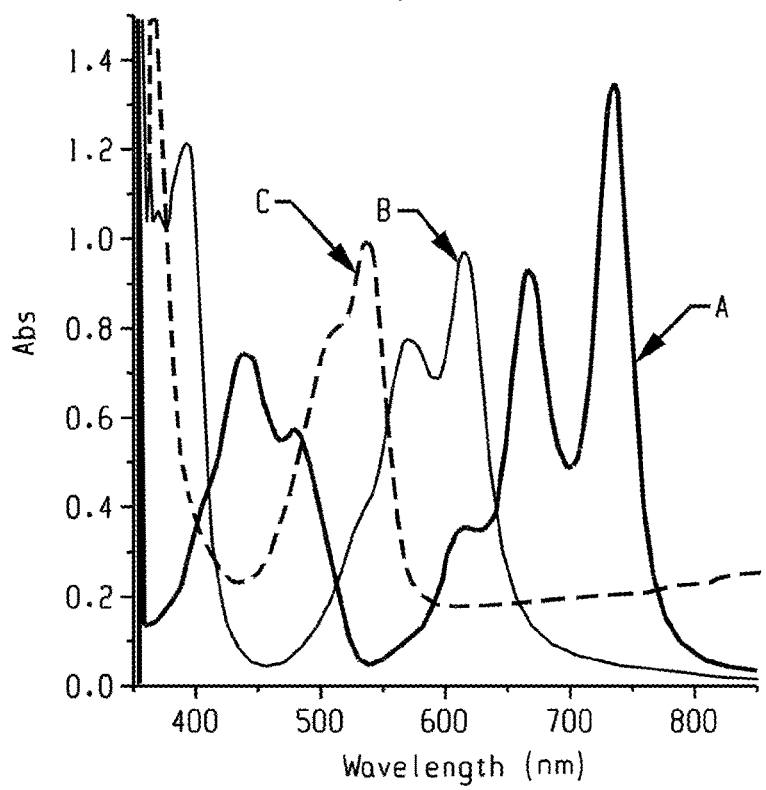
FIG. 28 illustrates absorbance spectra of three electrochromophores overlaid one another.

FIG. 28 illustrates absorbance spectra of each of the three electrochromophores A, B, and C overlaid one another.

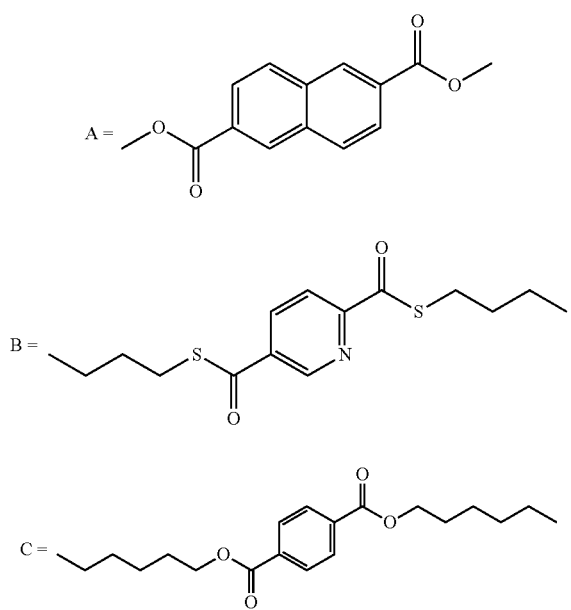

Each of the three electrochromophores undergo electrochemical reductions at approximately the same potential.

Example 15. New Thioester Electrochromophores

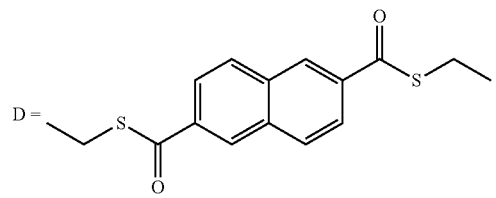

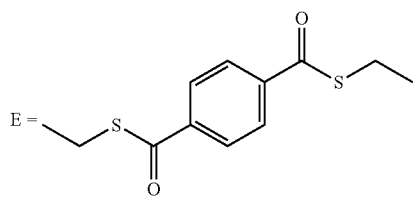

Figure 29:
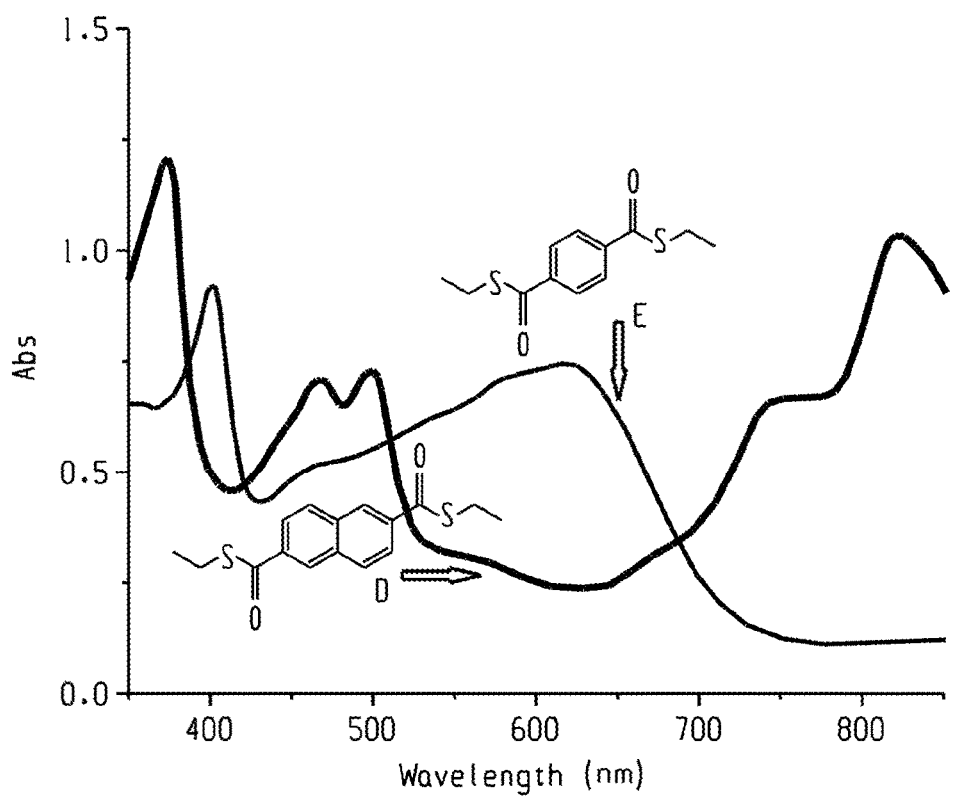
FIG. 29 illustrates the absorbance spectra for new thioester dyes.
Figure 30:
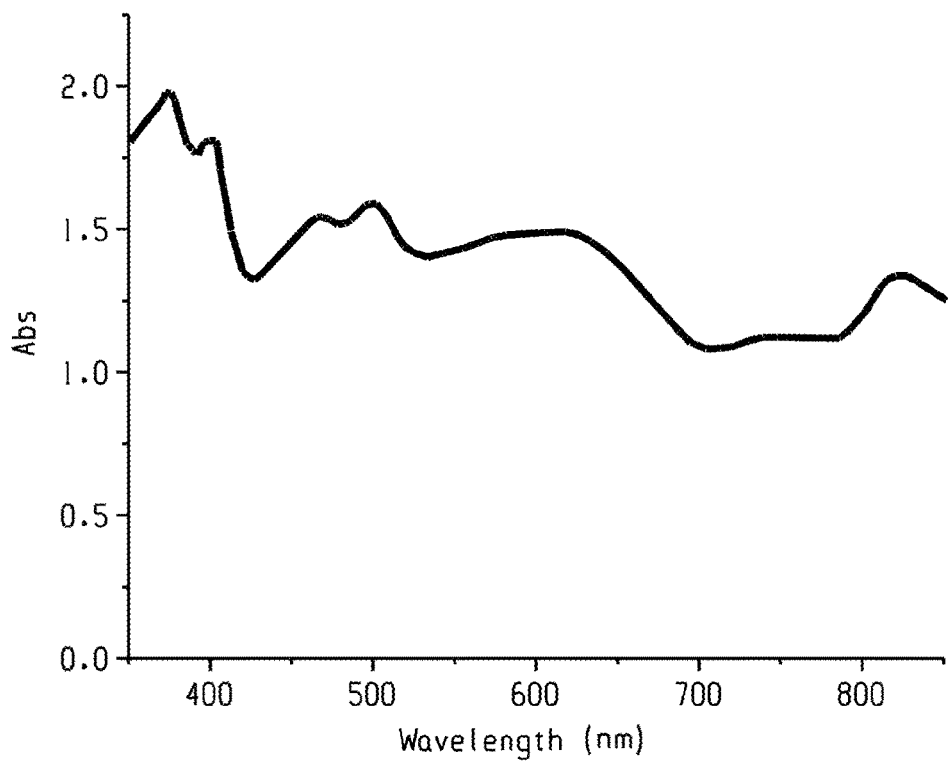
FIG. 30 illustrates a combination of both chromophore spectra for the thioester dyes.
Figure 31:
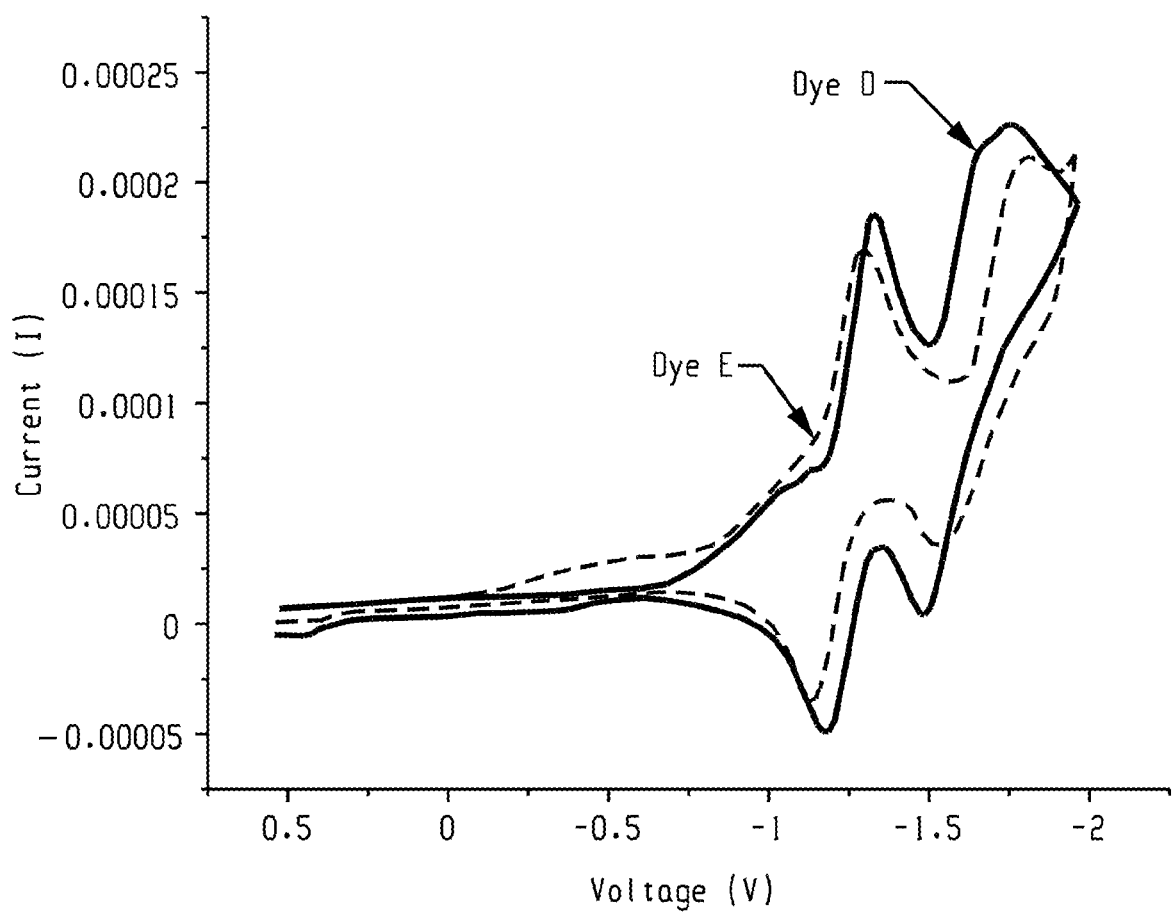
FIG. 31 illustrates the cyclic voltammetry of thioester dye D and thioester Dye E, voltage versus normal hydrogen electrode (NHE).

FIG. 29 illustrates the absorbance spectra for new thioester dyes D and E. FIG. 30 illustrates a combination of both chromophore spectra; polythioesters of these two would produce a fairly broad and flat absorbance resulting in military neutrality meaning no substantial shift in how color is perceived through this filter. Both polymers of dyes D and E have nearly identical reduction potentials See FIG. 31, cyclic voltammetry of dye D and dye E, voltage versus normal hydrogen electrode (NHE). Separate studies showed the plasticizer diethyl terephthalate DET does not undergo redox within the redox potential of the chromophore (not shown).

Example 16. New Electrochromophores

Table 12 provides a number of aromatic structures that can be prepared as dicarboxylic acids, and in turn, can be prepared as polyesters, specifically polymerized as a homopolymer, copolymerized with each other, or copolymerized with polyethylene naphthalate, polyethylene terephthalate, or both to produce electrochromic polymers of different colors. Included herein are homopolymer polyesters of the aromatics in the table (specifically those starred) and copolymers of each of these aromatics with at least one of another in the Table or with PEN or PET or with both PEN and PET.

Utilizing sodium as a reducing agent (to do a 1 electron reduction on an aromatic) the aromatics set out in Table 12 exhibit a color change from colorless to the color reported in the table header.

TABLE 12

Approximation of color for aromatic electrochromophores

| Blue | Green | Red |
|---|---|---|
| 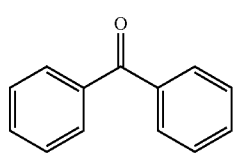 *Benzophenone |  *Naphthalene | 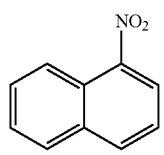 *1-Nitronaphthalene |

TABLE 12-continued
Approximation of color for aromatic electrochromophores
| Blue | Green | Red |
|---|---|---|
| 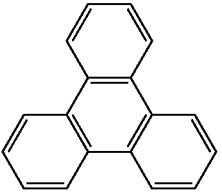 *Triphenylene |  *Phenanthrene | 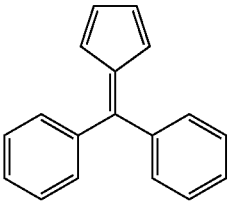 *Diphenylfulvene |
| 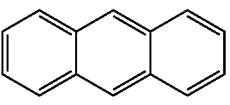 *Anthracene | 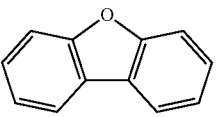 *Dibenzofuran | 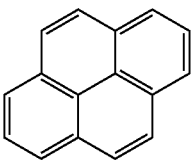 *Pyrene |
| 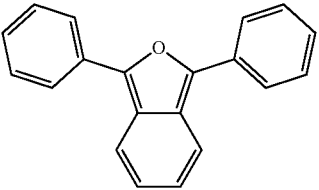 *1,3-Diphenylisobenzofuran | 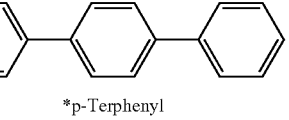 *p-Terphenyl | 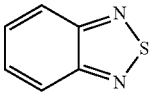 *2,1,3-Benzothiadiazole |
| 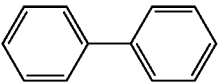 Biphenyl | | 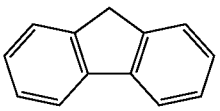 *Fluorene |
| 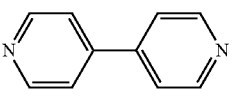 4,4'-Bipyridyl | | 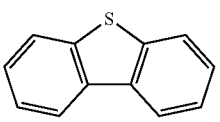 *Dibenzothiophene |
| | | 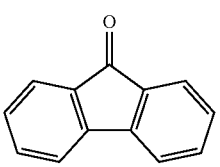 *9-Fluorenone |

TABLE 12-continued

Approximation of color for aromatic electrochromophores

| Blue | Green | Red |
|---|---|---|
| | | 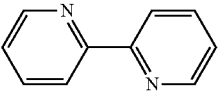<br>*2,2'-Bipyridyl |
| | | 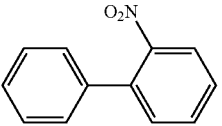<br>*2-Nitrobiphenyl |

Color data for 18 dyes can be found in Table 13. Table 13 data is all in reduced state.

TABLE 13

| | Tp | Ts | Neutrality | x | y | c*ab | l* | a* | b* |
|---|---|---|---|---|---|---|---|---|---|
| Triphenylene_reduced state | 17.10038 | 10.66033 | 47.24888189 | 0.429937 | 0.38695 | 30.73608 | 48.3871 | 14.82714 | 26.92327 |
| Dibenzofuran_reduced state | 25.89309 | 15.49314 | 36.39278777 | 0.372571 | 0.490024 | 51.71439 | 57.95908 | −22.8599 | 46.38751 |
| Biphenyl_reduced state | 10.74558 | 17.26276 | 56.67207927 | 0.197751 | 0.346348 | 37.65187 | 39.14676 | −37.1367 | −6.20737 |
| 4,4'-Bipyridyl_reduced state | 7.182714 | 14.47652 | 114.1939438 | 0.231513 | 0.160006 | 53.13456 | 32.19922 | 31.23764 | −42.9825 |
| 1,3-Diphenyliso-benzofuran_reduced state | 9.129417 | 3.883034 | 51.66278971 | 0.423158 | 0.509998 | 46.68076 | 36.24732 | −9.9715 | 45.60332 |
| Naphthalene_reduced state | 24.32055 | 14.52894 | 27.26973013 | 0.417683 | 0.502639 | 60.73398 | 56.41885 | −13.6707 | 59.1754 |
| Phenanthrene_reduced state | 5.859918 | 3.259105 | 35.68346189 | 0.444824 | 0.474837 | 35.93181 | 29.05682 | −0.93607 | 35.91961 |
| Benzophenone_reduced state | 18.70589 | 37.94223 | 79.7154184 | 0.172238 | 0.228337 | 44.37599 | 50.32561 | −21.1998 | −38.9846 |
| Anthracene_reduced state | 14.49169 | 7.989917 | 29.77950169 | 0.422989 | 0.487488 | 47.66842 | 44.93802 | −7.85801 | 47.01627 |
| p-Terphenyl_reduced state | 28.83269 | 11.54499 | 51.84688571 | 0.498805 | 0.460835 | 76.50805 | 60.63891 | 14.62642 | 75.09694 |
| Pyrene_reduced state | 15.27073 | 4.118595 | 166.3905301 | 0.58243 | 0.319172 | 74.55341 | 45.99076 | 64.89603 | 36.69763 |
| 1-Nitronaphthalene_reduced state | 1.210747 | 0.921432 | 89.60871228 | 0.361735 | 0.273548 | 13.74283 | 10.64241 | 13.36308 | −3.20833 |
| Diphenylfulvene_reduced state | 15.72418 | 7.177597 | 98.48142588 | 0.496862 | 0.405689 | 48.90128 | 46.60817 | 23.79693 | 42.7205 |
| Dibenzothiophene_reduced state | 58.48808 | 26.61503 | 48.16824025 | 0.461351 | 0.409413 | 61.60618 | 81.01322 | 24.41434 | 56.56202 |
| Fluorene_reduced state | 75.575 | 60.4427 | 21.25639015 | 0.355358 | 0.32457 | 22.76506 | 89.65674 | 21.98272 | 5.916779 |
| 9-Fluorenone_reduced state | 1.472208 | 0.521936 | 72.89509457 | 0.459688 | 0.305142 | 21.01428 | 12.41955 | 20.32677 | 5.331279 |
| 2,2'-Bipyridyl_reduced state | 24.26663 | 5.034601 | 116.7448755 | 0.580453 | 0.374133 | 85.1309 | 56.34463 | 55.32712 | 64.70069 |
| 2-Nitrobiphenyl_reduced state | 63.7251 | 47.14021 | 21.53870876 | 0.381573 | 0.382196 | 30.44492 | 83.82478 | 7.109935 | 29.60307 |

Example 17. Synthesis of Electrochromic Macromonomers

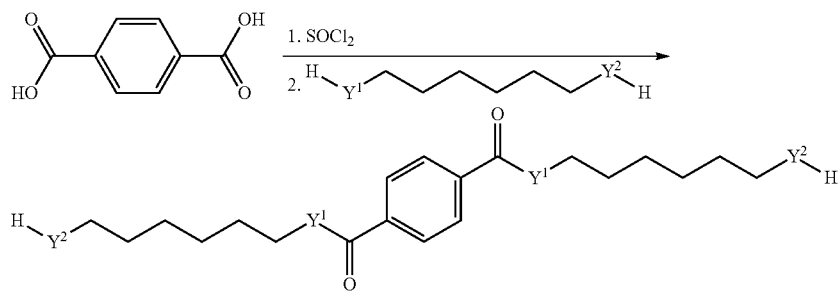

| Group | Atom | |
|---|---|---|
| Y¹ | O | S |
| Y² | O | S |

In a typical synthesis, 5.0 grams of aromatic diacid is refluxed for 6 hours in a stirring solution of 25 mL thionyl chloride with a catalytic amount (1 drop) of N,N-Dimethylformamide (DMF). After refluxing, thionyl chloride is removed via vacuum distillation, resulting in the respective aromatic diacid chloride. 50 mL of a 3:1 mixed solution of anhydrous dichloromethane (DCM): pyridine is then added to the reaction flask and the diacid chloride allowed to dissolve while stirring at room temperature (25° C.). After several minutes, excess 1,6 hexanediol or 1,6 hexanedithiol is added to the solution and the reaction allowed to stir for 12 hours at 40° C. Once finished, the solvent is stripped via rotary evaporation leaving a white to light yellow waxy solid. The solid is then redissolved in DCM and washed with water (3×20 mL), brine (3×20 mL), and dilute HCl (3×20 mL). Organic fractions are collected, dried with magnesium sulfate, filtered, and concentrated using rotary evaporation to yield white solids (yields 90-95%).

The following Electrochromic Macromonomers in Table 14. were prepared and characterized by $^1$H-NMR (500 MHz, CDCl$_3$):

TABLE 14

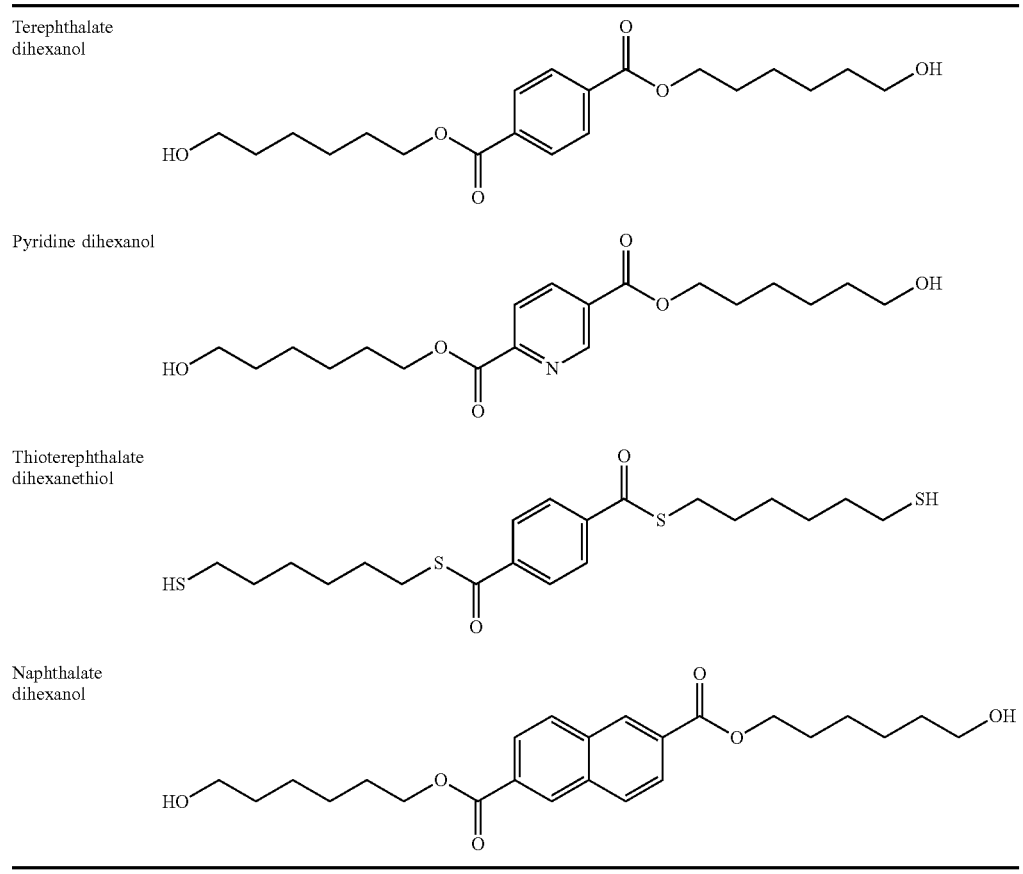

Example 18. Synthesis of Electrochromic Homopolymers

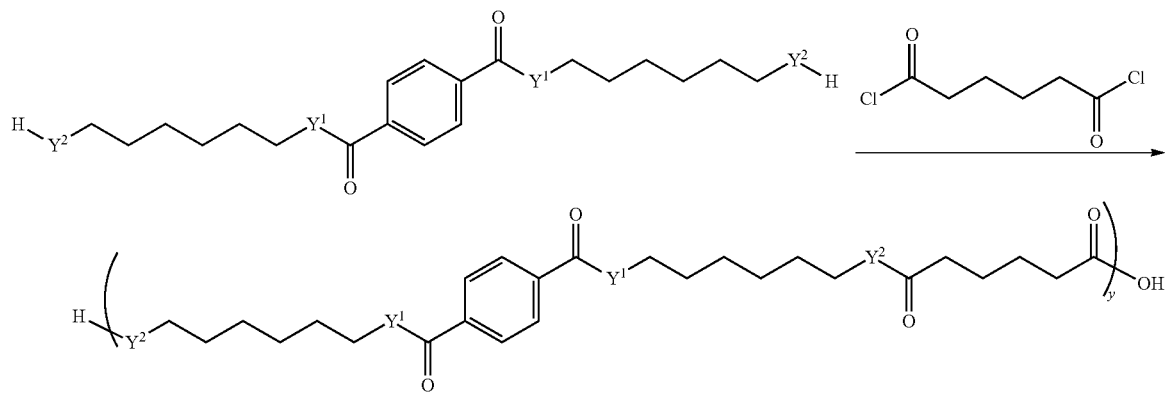

| Group | Atom | |
|---|---|---|
| $Y^1$ | O | S |
| $Y^2$ | O | S |

In a typical synthesis, 3.0 grams of a previously synthesized electrochromic macromonomer is dissolved into 50 mL of a 3:1 mixed solution of anhydrous dichloromethane (DCM): pyridine and chilled in an ice water bath. An equimolar amount of adipoyl chloride is then added dropwise over 30 minutes. The reaction is brought to room temperature slowly and allowed to stir for an additional 48 hours. Once finished, the reaction is concentrated using rotary evaporation and precipitated into cold methanol to yield white polymer strands with molecular weights between 20-30 kDa (yields 82-88%).

The following Electrochromic polymers in Table 15. were prepared and characterized by $^1$H-NMR (500 MHz, CDCl$_3$):

TABLE 15

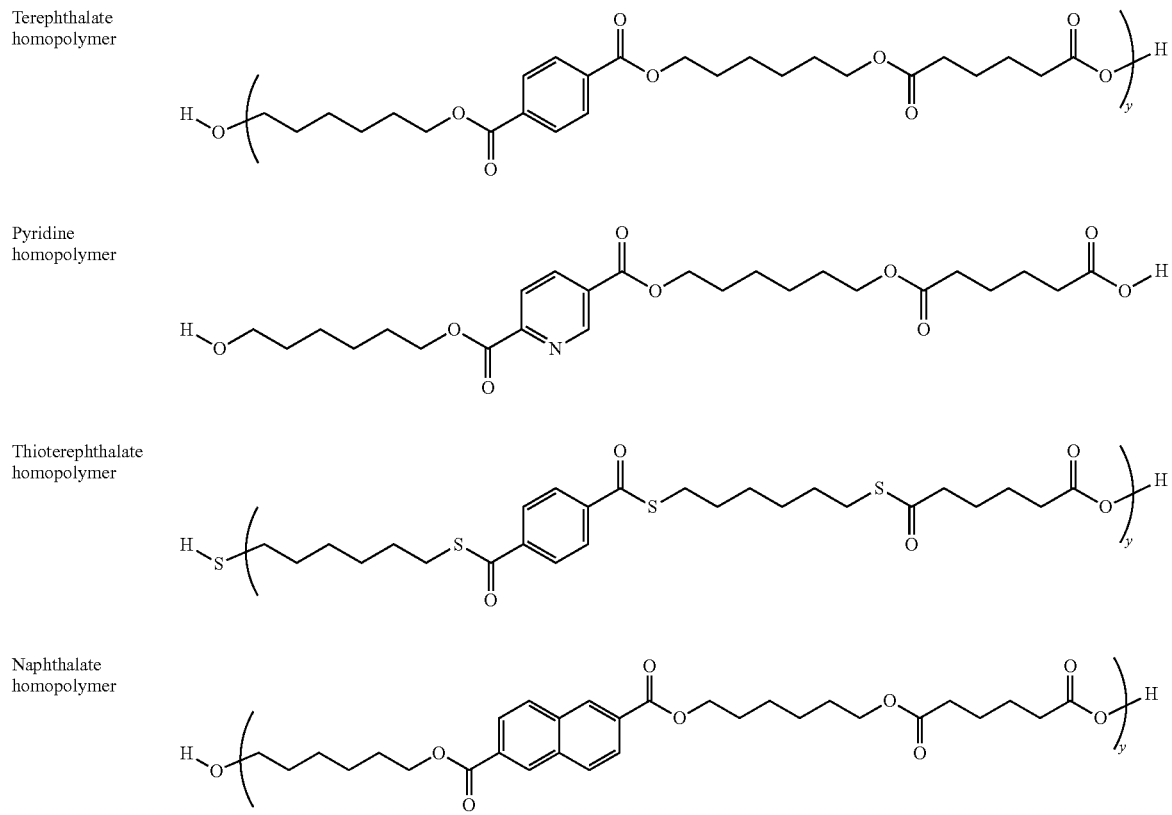

Figure 32:
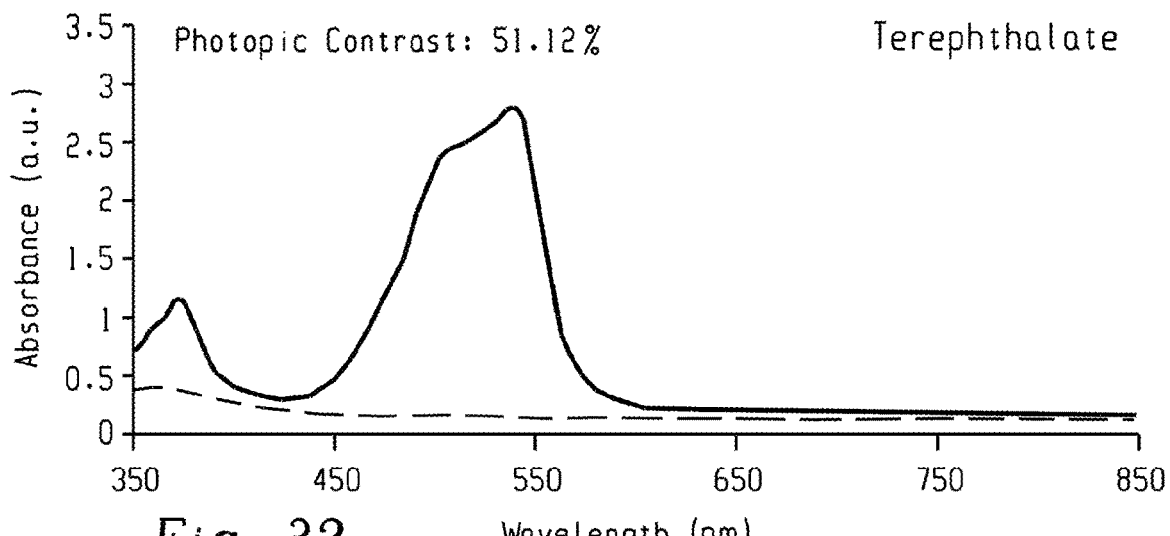
FIG. 32 illustrates the visible spectrum for the Terephthalate homopolymer device of Example 18.
Figure 33:
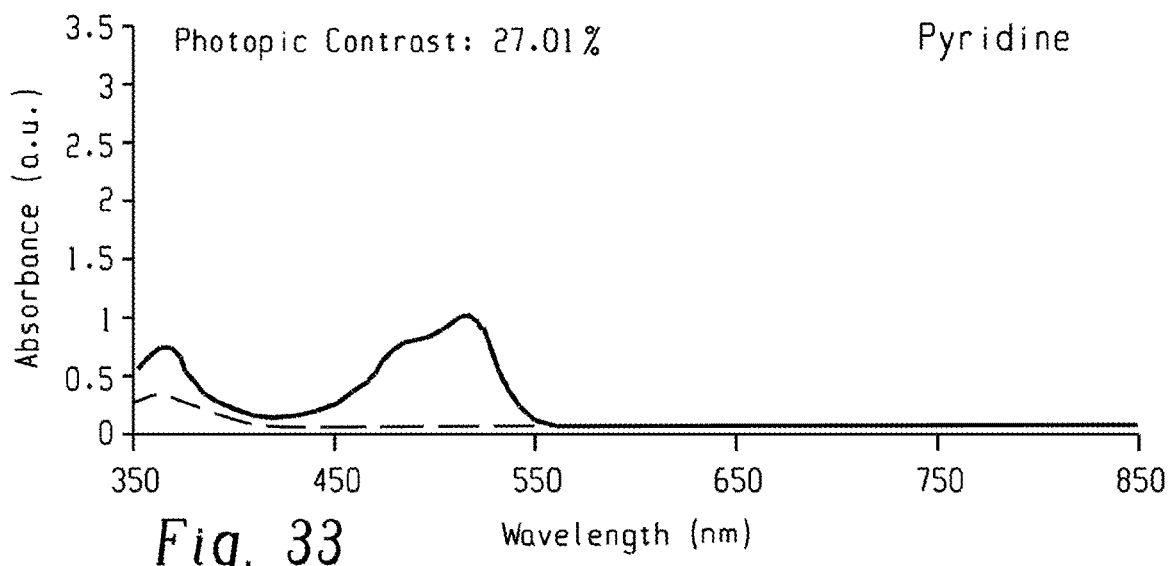
FIG. 33 illustrates the visible spectrum for the Pyridine homopolymer device of Example 18.
Figure 34:
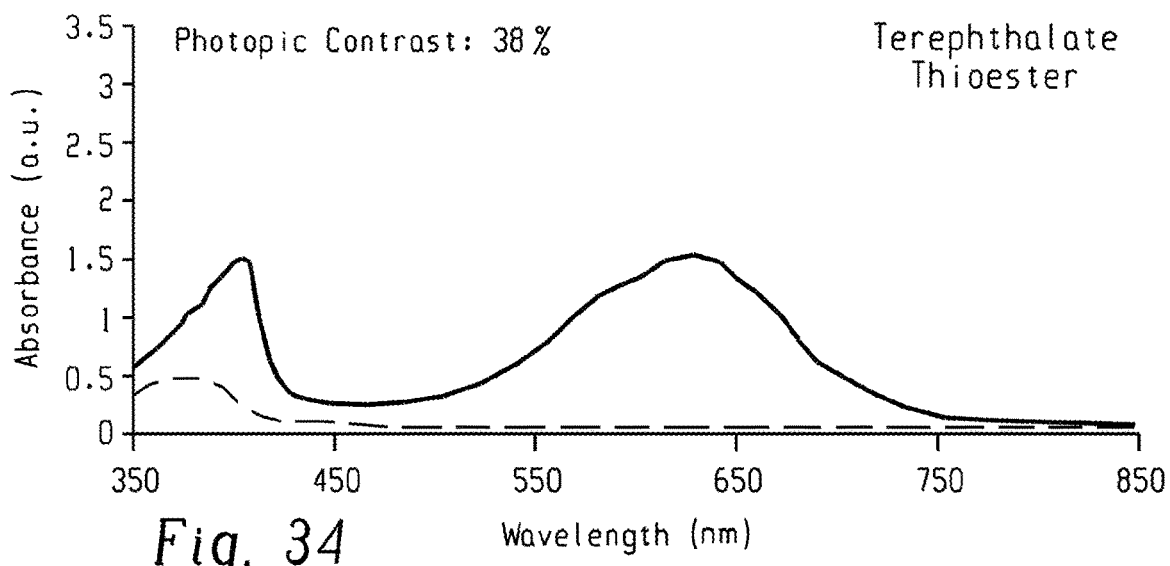
FIG. 34 illustrates the visible spectrum for the Thioterephthalate homopolymer device of Example 18.
Figure 35:
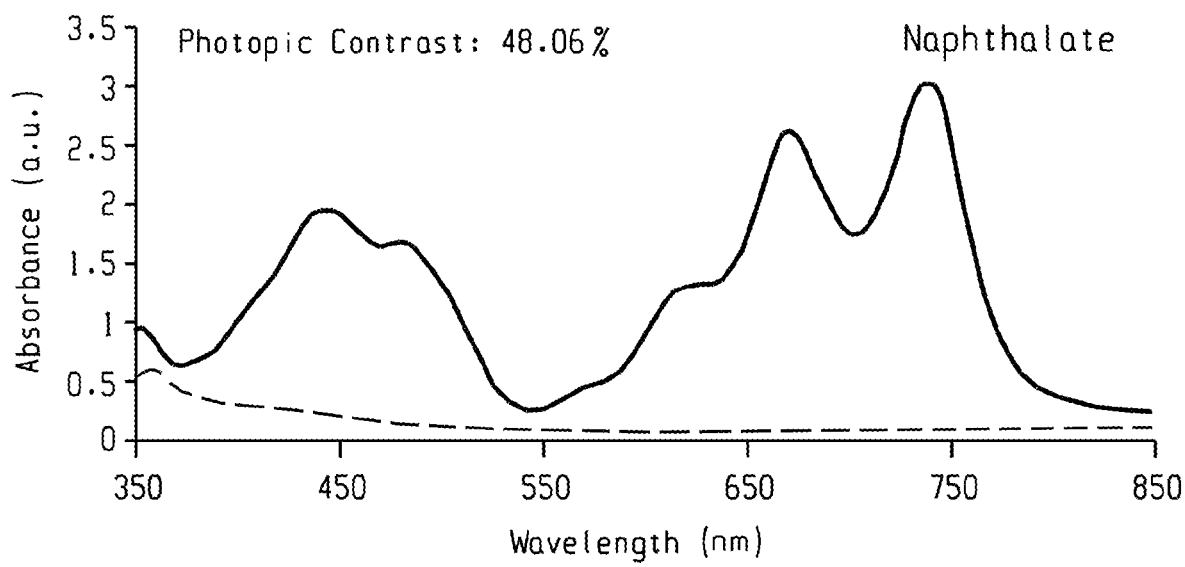
FIG. 35 illustrates the visible spectrum for the Naphthalate homopolymer device of Example 18.
Figure 36:
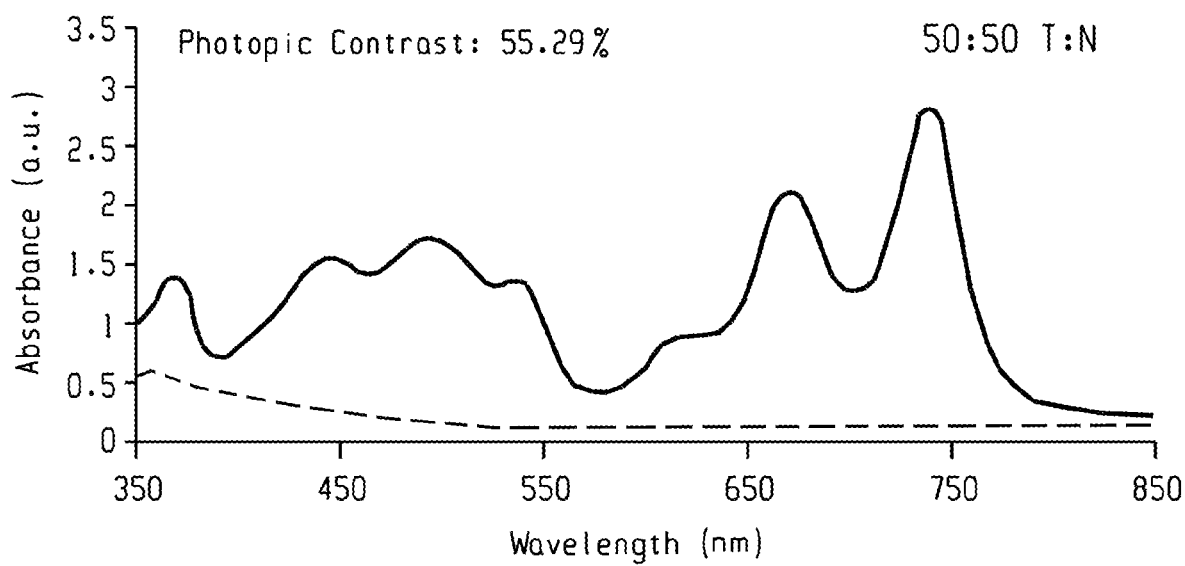
FIG. 36 illustrates the visible spectrum for the 50:50 blend of Terephthalate homopolymer:Naphthalate homopolymer device of Example 18.
Figure 37:
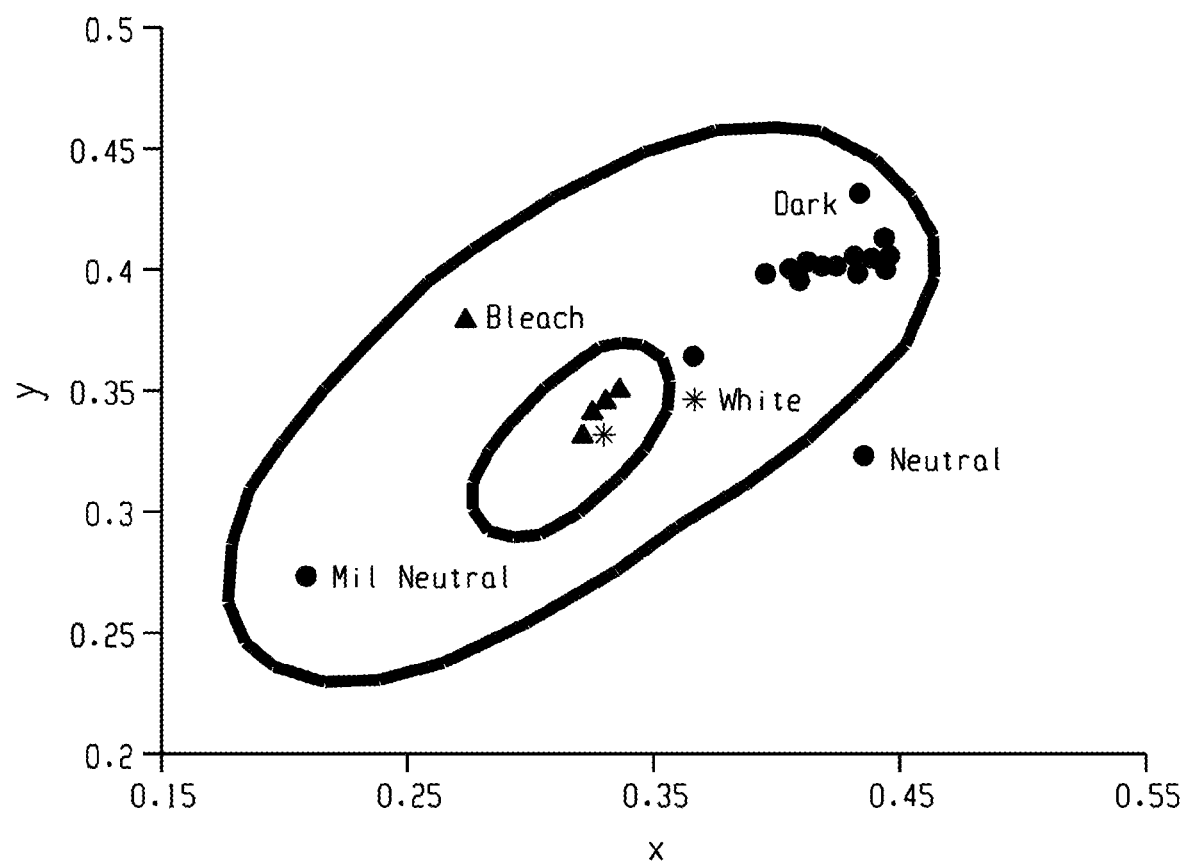
FIG. 37 illustrates the CIE color coordinates of dark and bleached states for the 50:50 blend of Terephthalate homopolymer:Naphthalate homopolymer device of Example 18.

The visible spectrum of devices fabricated using the Electrochromic homopolymers of this Example as well as a 50:50 blend of Terephthalate:Naphthalate Electrochromic homopolymers are shown in FIG. 32 to FIG. 36: FIG. 32, visible spectrum for the Terephthalate homopolymer device; FIG. 33, visible spectrum for the Pyridine homopolymer device; FIG. 34, visible spectrum for the Thioterephthalate homopolymer device; FIG. 35, visible spectrum for the Naphthalate homopolymer device; and FIG. 36, visible spectrum for the 50:50 blend of Terephthalate homopolymer:Naphthalate homopolymer device. FIG. 37 illustrates the CIE color coordinates of dark and bleached states for the 50:50 blend of Terephthalate homopolymer:Naphthalate homopolymer device.

Example 19. Synthesis of Electrochromic Copolymers

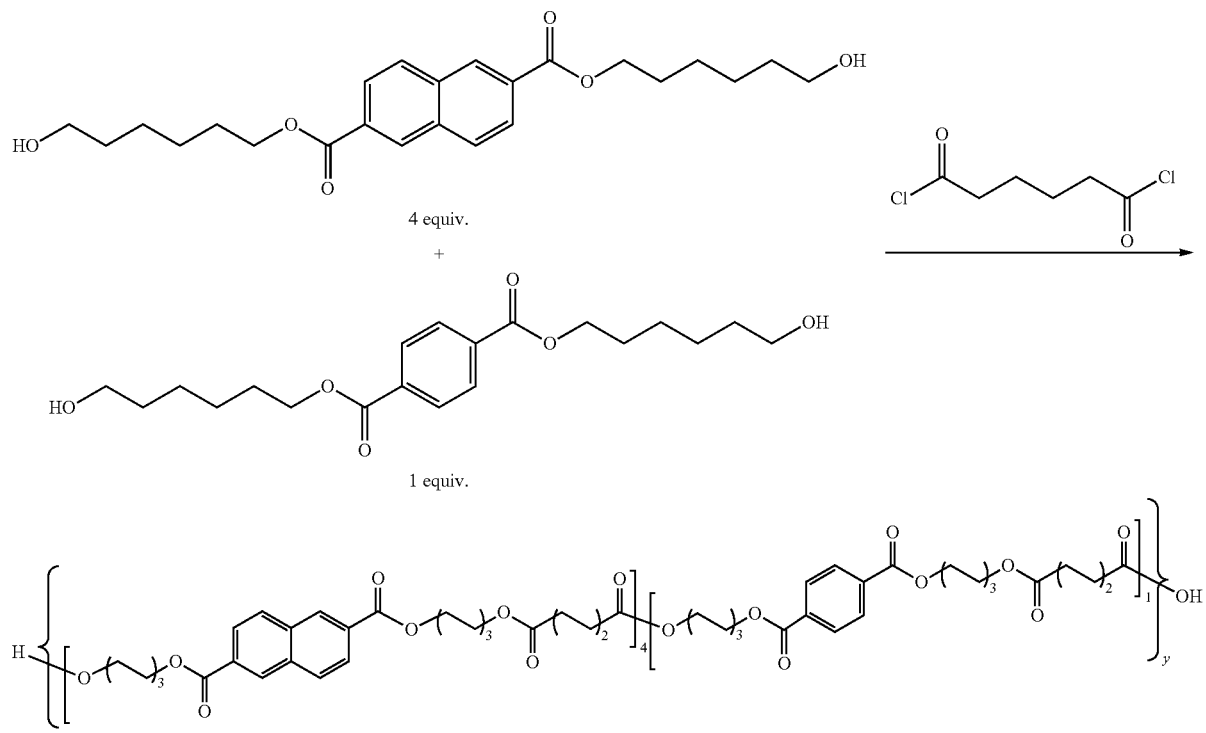

In a typical synthesis, 4 equivalents of the naphthalate macromonomer and 1 equivalent of the terephthalate macromonomer were dissolved into 50 mL of a 3:1 mixed solution of anhydrous dichloromethane (DCM): pyridine and chilled in an ice water bath. 5 equivalents of adipoyl chloride was then added dropwise over 30 minutes. The reaction was brought to room temperature slowly and allowed to stir for an additional 48 hours at 40° C. Once finished, the reaction was concentrated using rotary evaporation and precipitated into cold methanol to yield white polymer strands with molecular weights between 20-30 kDa (yields 75-80%). The 4:1 Naphthalate:Terephthalate copolymer was prepared and characterized by $^1$H-NMR (500 MHz, CDCl$_3$).

Figure 38:
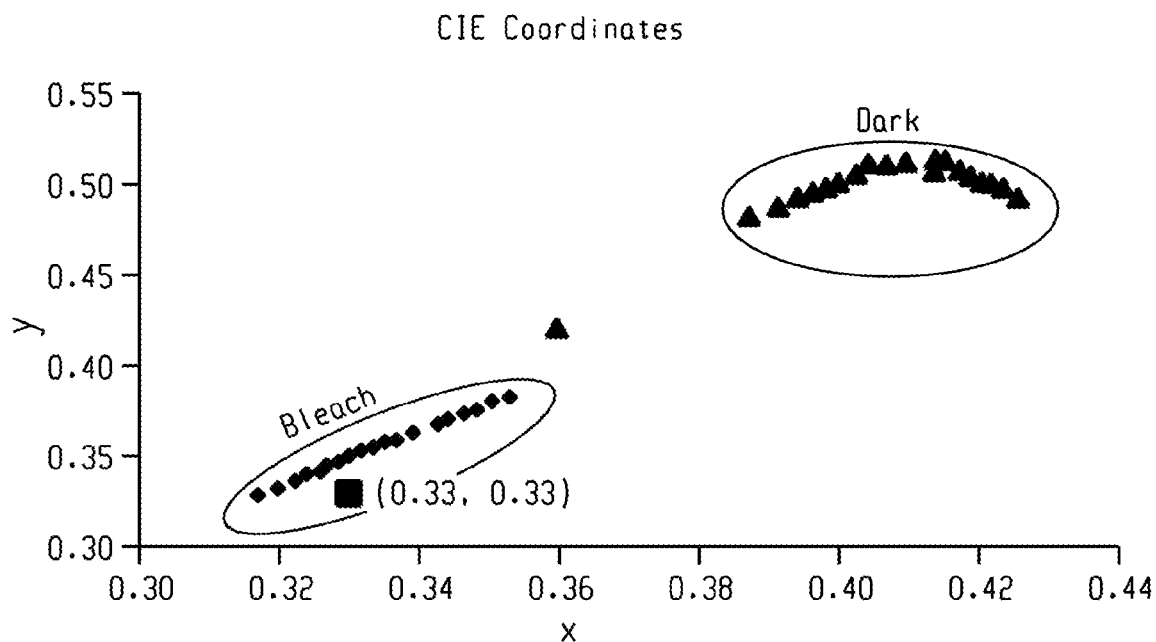
FIG. 38 illustrates the CIE coordinates of dark and colored states for the 4:1 Naphthalate:Terephthalate copolymer device of Example 19.
Figure 39:
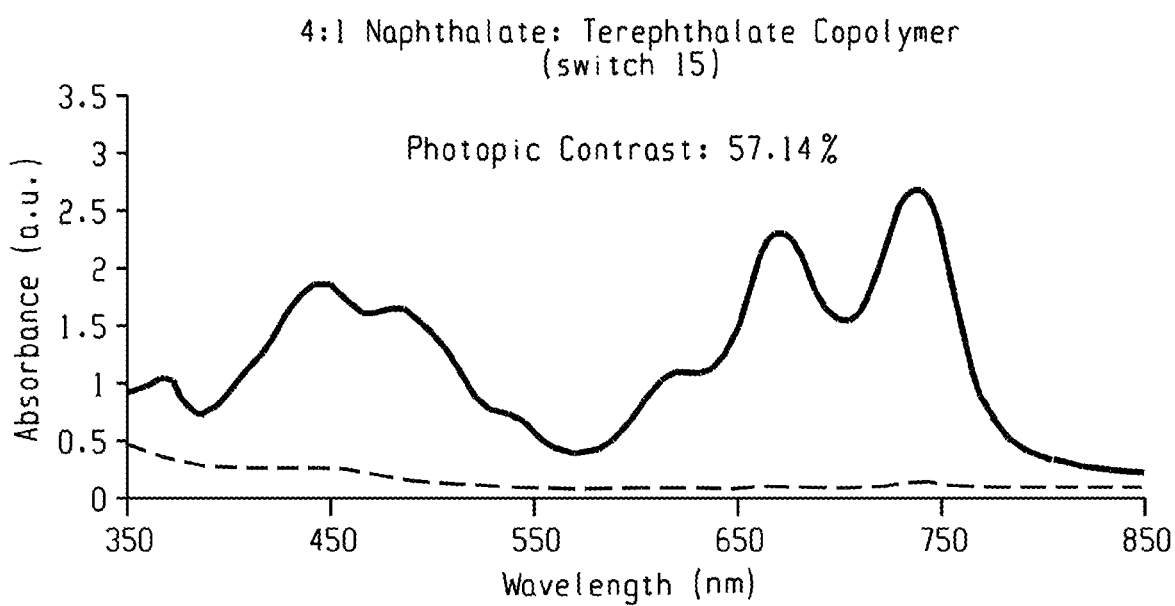
FIG. 39 illustrates the visible spectrum of cycle 15 colored and bleached states for the 4:1 Naphthalate:Terephthalate copolymer device of Example 19.

Spectral results of a device fabricated using the 4:1 Naphthalate:Terephthalate copolymer are shown in FIG. 38 CIE coordinates of dark and colored states and FIG. 39 visible spectrum of cycle 15 colored and bleached states.

The singular forms "a," "an," and "the" include plural referents unless the context clearly dictates otherwise. The endpoints of all ranges directed to the same characteristic or component are independently combinable and inclusive of the recited endpoint.

While the invention has been described in detail in connection with only a limited number of embodiments, it should be readily understood that the invention is not limited to such disclosed embodiments. Rather, the invention can be modified to incorporate any number of variations, alterations, substitutions, or equivalent arrangements not heretofore described, but which are commensurate with the spirit and scope of the invention. Additionally, while various embodiments of the invention have been described, it is to be understood that aspects of the invention can include only some of the described embodiments. Accordingly, the invention is not to be seen as limited by the foregoing description, but is only limited by the scope of the appended claims.

What is claimed is:
1. An electrochromic material composition, comprising
   a salt, wherein the salt comprises an alkali metal ion M, wherein the salt if MClO$_4$, MPF$_6$, MBF$_4$, MAsF$_6$, MSbF$_6$, MCF$_3$SO$_3$, MCF$_3$CO$_2$, M$_2$C$_2$F$_4$(SO$_3$)$_2$, MN(CF$_3$SO$_2$)$_2$, MN(C$_2$F$_5$SO$_2$)$_2$, MC(CF$_3$SO$_2$)$_3$, MC$_n$F$_{2n+1}$SO$_3$ wherein 2≤n≤3, MN(RfOSO$_2$)$_2$ wherein Rf is a fluoroalkyl group, or a combination thereof, or wherein the salt is an ionic liquid based on imidazolium, pyridinium, phosphonium or tetraalkyl ammonium;
   a small molecule organic electrochromic material of formula (I), (I-A), (II), (II-A), (III), or a combination thereof;
   a polymer or copolymer electrochromic of formula (IV), (V), (V-A), (VI), (VI-A), or a combination thereof; and
   optionally a plasticizer, a solvent, or a combination thereof;

wherein

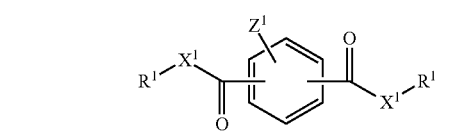
(I)

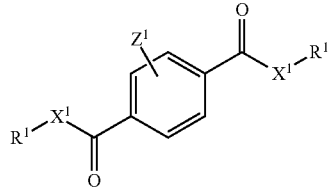
(I-A)

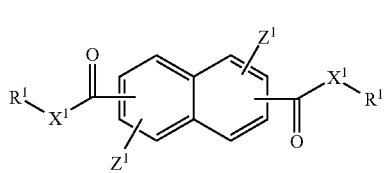
(II)

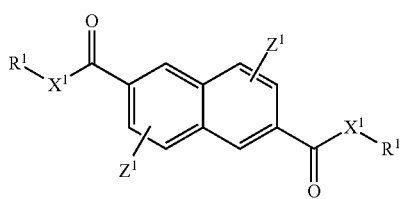
(II-A)

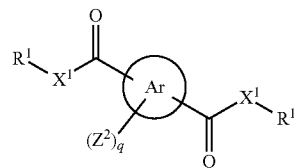
(III)

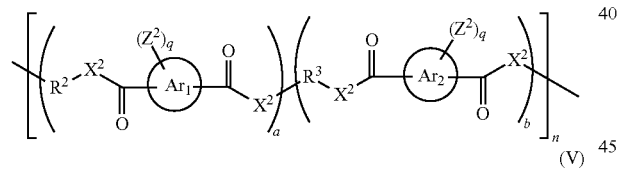
(IV)

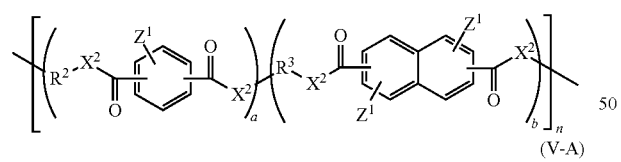
(V)

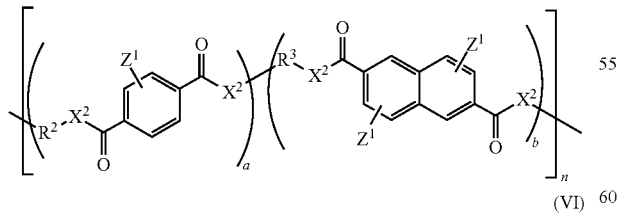
(V-A)

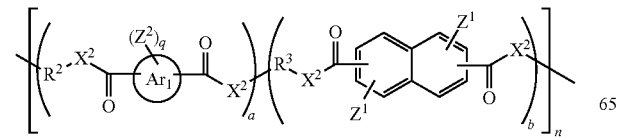
(VI)

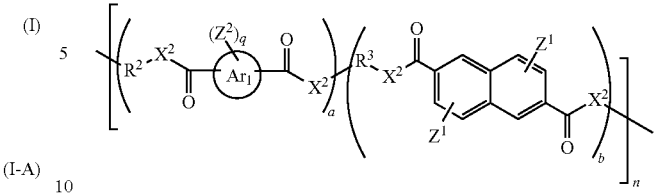
(VI-A)

wherein
each $X^1$ independently is O, S, or NR; R is H, $C_{1-20}$ alkyl;
each $R^1$ independently is $C_{1-20}$ alkyl;
each $Z^1$ independently is H, $C_{1-20}$ alkyl, halogen, nitro, cyano, hydroxyl, $C_6$-$C_{12}$ aryl, $C_3$-$C_{20}$ cycloalkyl, $C_1$-$C_{20}$ alkyl, $C_1$-$C_{20}$ alkoxy, $C_1$-$C_{20}$ alkylthio, $C_1$-$C_{20}$ haloalkyl, amino, $C_1$-$C_{12}$ alkylamino, or $C_1$-$C_{12}$ diaminoalkyl;
Ar is anthracene, benzophenone, 2,1,3-benzothiadiazole, dibenzofuran, dibenzothiophene, diphenylfulvene, 1,3-diphenylisobenzofuran, 2,2'-dipyridyl, 4,4'-dipyridyl, fluorene, fluorenone, naphthyl, 2-nitrobiphenyl, phenanthrene, phenyl, pyrene, terphenyl, or triphenylene;
each $Z^2$ independently is $C_{1-20}$ alkyl, halogen, nitro, cyano, hydroxyl, $C_6$-$C_{12}$ aryl, $C_3$-$C_{20}$ cycloalkyl, $C_1$-$C_{20}$ alkyl, $C_1$-$C_{20}$ alkoxy, $C_1$-$C_{20}$ alkylthio, $C_1$-$C_{20}$ haloalkyl, amino, $C_1$-$C_{12}$ alkylamino, or $C_1$-$C_{12}$ diaminoalkyl;
q is 0, 1, 2, 3, or 4;
Ar1 and Ar2 each independently is an aromatic group;
each $X^2$ independently is O, S, or NR;
each $R^2$ and $R^3$ independently is
$C_{1-20}$ alkylene, or
a poly(alkylene ether), a poly(alkylene glycol) comprising ethyleneoxy, propyleneoxy, and butyleneoxy repeating units containing 2-20 carbon atoms, or
a $C_{4-40}$ alkylene chain wherein the chain comprises 1, 2, 3, or 4 $Q^1$ groups within the backbone of the chain, wherein each $Q^1$ independently is O, S, —O(C=O)—, —(O=C)O—, —S(C=O)—, or —(O=C)S—;
a is about 1 to about 99 mol %;
b is about 1 to about 99 mol %; and
n is an integer resulting in a polymer or copolymer molecular weight of about 10,000 to about 100,000 g/mol.

2. The electrochromic material composition according to claim 1, comprising a small molecule organic electrochromic material of formula (I-A), (II), (II-A), (III), or a combination thereof.

3. The electrochromic material composition according to claim 1, comprising a polymer or copolymer electrochromic of formula (V), (V-A), (VI), (VI-A), or a combination thereof.

4. The electrochromic material composition according to claim 1, comprising a polymer or copolymer electrochromic of formula (IV), (V), (V-A), (VI), (VI-A), or a combination thereof wherein Ar1 or Ar2 is naphthyl.

5. The electrochromic material composition according to claim 1, comprising the polymer or copolymer electrochromic of formula (IV), (V), (V-A), (VI), (VI-A), or a combination thereof, and wherein the electrochromic material composition is melt processable.

6. The electrochromic material composition according to claim 1, wherein the polymer or copolymer electrochromic of formula (IV), (V), (V-A), (VI), (VI-A), or a combination thereof comprises a polymerizable end group.

7. The electrochromic material composition of claim 1, wherein each $X^1$ and $X^2$ independently is O or S.

8. The electrochromic material composition according to claim 1, wherein each $X^1$ and $X^2$ independently is S.

9. The electrochromic material composition according to claim 1, wherein the salt is 1-ethyl-3-methylimidazolium tosylate, 1-butyl-3-methylimidazolium octyl sulfate; 1-butyl-3-methylimidazolium 2-(2-methoxyethoxy)ethyl sulfate; 1-ethyl-3-methylimidazolium bis(pentafluoroethylsulfonyl)imide; 1-ethyl-3-methylimidazolium bis(trifluoromethylsulfonyl)imide; 1-ethyl-3-methylimidazolium bromide; 1-ethyl-3-methylimidazolium hexafluorophosphate; 1-butyl-3-methylimidazolium bromide; 1-butyl-3-methylimidazolium trifluoromethane sulfonate; 1,2-dimethyl-3-propylimidazolium tris(trifluoromethylsulfonyl)methide; 1,2-dimethyl-3-propylimidazolium bis(trifluoromethylsulfonyl)imide; 3-methyl-1-propylpyridinium bis(trifluormethylsulfonyl)imide; 1-butyl-3-methylpyridinium bis(trifluormethylsulfonyl)imide; 1-butyl-4-methylpyridinium chloride; 1-butyl-4-methylpyridinium hexafluorophosphate; 1-butyl-4-methylpyridinium tetrafluoroborate; 1-n-butyl-3-methylimidazolium hexafluorophosphate; 1-butyl-3-methylimidazolium tetrafluoroborate; phosphonium dodecylbenzenesulfonate; phosphonium methanesulfonate; or a combination thereof.

10. An electrochromic device, comprising the electrochromic material composition according to claim 1.

11. An article comprising the electrochromic material composition according to claim 1, wherein the article is eyewear including glasses, goggles, visor, sunglasses, laser protection, automotive mirror, automotive window, automotive sunroof, automotive car panels, windows, smart glass, displays, billboards, signs, video monitors, flat panel displays, flexible displays, sensors, OLEDs, LCDS, solar cells, electrochromic fabric, electrochromic textile, adaptive camouflage, electrochromic plastic wrap for food, household goods, packaging, a container, luggage tag, or flooring.

12. A method comprising, heating the electrochromic material composition according to claim 1, to form a melt; and
extruding or molding the melt to form a melt processed electrochromic material composition,
wherein the molding is injection molding, blow molding, rotational molding, or compression molding and the extruding is cast film extrusion.

13. The method of claim 12, wherein the salt is 1-ethyl-3-methylimidazolium tosylate, 1-butyl-3-methylimidazolium octyl sulfate; 1-butyl-3-methylimidazolium 2-(2-methoxyethoxy)ethyl sulfate; 1-ethyl-3-methylimidazolium bis(pentafluoroethylsulfonyl)imide; 1-ethyl-3-methylimidazolium bis(trifluoromethylsulfonyl)imide; 1-ethyl-3-methylimidazolium bromide; 1-ethyl-3-methylimidazolium hexafluorophosphate; 1-butyl-3-methylimidazolium bromide; 1-butyl-3-methylimidazolium trifluoromethane sulfonate; 1,2-dimethyl-3-propylimidazolium tris(trifluoromethylsulfonyl)methide; 1,2-dimethyl-3-propylimidazolium bis(trifluoromethylsulfonyl)imide; 3-methyl-1-propylpyridinium bis(trifluormethylsulfonyl)imide; 1-butyl-3-methylpyridinium bis(trifluormethylsulfonyl)imide; 1-butyl-4-methylpyridinium chloride; 1-butyl-4-methylpyridinium hexafluorophosphate; 1-butyl-4-methylpyridinium tetrafluoroborate; 1-n-butyl-3-methylimidazolium hexafluorophosphate (n-BMIM $PF_6$); 1-butyl-3-methylimidazolium tetrafluoroborate (BMIM $BF_4$); phosphonium dodecylbenzenesulfonate; phosphonium methanesulfonate; or a combination thereof.

14. A film formed by the method of claim 12.

15. A method of preparing a copolymer electrochromic material, comprising
reacting a first polyester with a second polyester in a transesterification process to form a copolymer electrochromic material, wherein the copolymer electrochromic material is of formula (IV), (V), (V-A), (VI), or (VI-A) according to claim 1.

16. A method of forming an electrochromic film, comprising,
providing a solution or homogeneous suspension comprising a salt; a solvent; a small molecule organic electrochromic material of formula (I), (I-A), (II), (II-A), (III), or a combination thereof; a polymer or copolymer electrochromic of formula (IV), (V), (V-A), (VI), (VI-A), or a combination thereof; and optionally a plasticizer; and
forming an electrochromic film from the solution or suspension,
wherein the small molecule organic electrochromic material of formula (I), (I-A), (II), (II-A), (III), and polymer or copolymer electrochromic of formula (IV), (V), (V-A), (VI), (VI-A) have the structures:

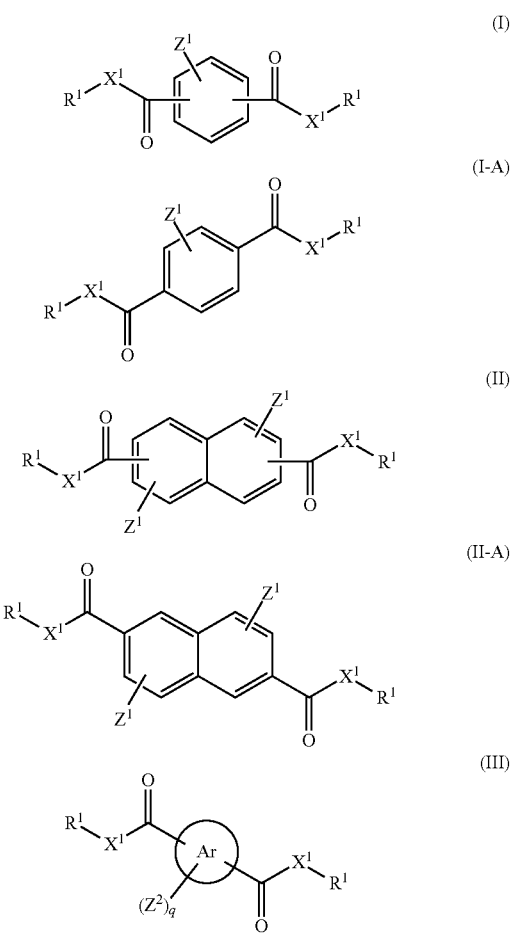

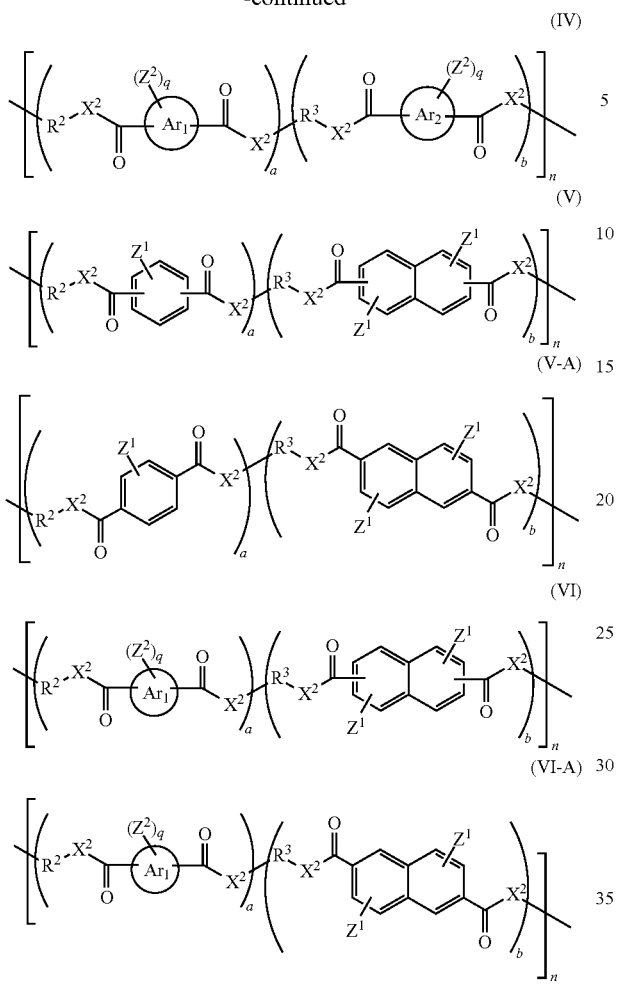

wherein
- each $X^1$ independently is O, S, or NR; R is H, $C_{1-20}$ alkyl;
- each $R^1$ independently is $C_{1-20}$ alkyl;
- each $Z^1$ independently is H, $C_{1-20}$ alkyl, halogen, nitro, cyano, hydroxyl, $C_6$-$C_{12}$ aryl, $C_3$-$C_{20}$ cycloalkyl, $C_1$-$C_{20}$ alkyl, $C_1$-$C_{20}$ alkoxy, $C_1$-$C_{20}$ alkylthio, $C_1$-$C_{20}$ haloalkyl, amino, $C_1$-$C_{12}$ alkylamino, or $C_1$-$C_{12}$ diaminoalkyl;
- Ar is anthracene, benzophenone, 2,1,3-benzothiadiazole, dibenzofuran, dibenzothiophene, diphenylfulvene, 1,3-diphenylisobenzofuran, 2,2'-dipyridyl, 4,4'-dipyridyl, fluorene, fluorenone, naphthyl, 2-nitrobiphenyl, phenanthrene, phenyl, pyrene, terphenyl, or triphenylene;
- each $Z^2$ independently is $C_{1-20}$ alkyl, halogen, nitro, cyano, hydroxyl, $C_6$-$C_{12}$ aryl, $C_3$-$C_{20}$ cycloalkyl, $C_1$-$C_{20}$ alkyl, $C_1$-$C_{20}$ alkoxy, $C_1$-$C_{20}$ alkylthio, $C_1$-$C_{20}$ haloalkyl, amino, $C_1$-$C_{12}$ alkylamino, or $C_1$-$C_{12}$ diaminoalkyl;
- q is 0, 1, 2, 3, or 4;
- Ar1 and Ar2 each independently is an aromatic group;
- each $X^2$ independently is O, S, or NR;
- each $R^2$ and $R^3$ independently is
  - $C_{1-20}$ alkylene, or
  - a poly(alkylene ether), a poly(alkylene glycol) comprising ethyleneoxy, propyleneoxy, and butyleneoxy repeating units containing 2-20 carbon atoms, or
  - a $C_{4-40}$ alkylene chain wherein the chain comprises 1, 2, 3, or 4 $Q^1$ groups within the backbone of the chain, wherein each $Q^1$ independently is O, S, —O(C=O)—, —(O=C)O—, —S(C=O)—, or —(O=C)S—;
- a is about 1 to about 99 mol %;
- b is about 1 to about 99 mol %;
- n is an integer resulting in a polymer or copolymer molecular weight of about 10,000 to about 100,000 g/mol; and
- wherein the salt comprises an alkali metal ion M, wherein the salt is is $MClO_4$, $MPF_6$, $MBF_4$, $MAsF_6$, $MSbF_6$, $MCF_3SO_3$, $MCF_3CO_2$, $M_2C_2F_4(SO_3)_2$, $MN(CF_3SO_2)_2$, $MN(C_2F_5SO_2)_2$, $MC(CF_3SO_2)_3$, $MC_nF_{2n+1}SO_3$ wherein $2 \le n \le 3$, $MN(RfOSO_2)_2$ wherein Rf is a fluoroalkyl group, or a combination thereof, or wherein the salt is an ionic liquid based on imidazolium, pyridinium, phosphonium or tetraalkyl ammonium.

17. The method of claim 16, wherein the forming comprises ink jet printing, screen printing, roll to roll printing, reel to reel processing, spin coating, meniscus and dip coating, spray coating, brush coating, flow coating, doctor blade application, solution casting, curtain casting, or drop casting.

18. An electrochromic device comprising:
- an electrochromic layer comprising an electrochromic material composition, and
- an electrolyte layer,
- wherein the electrochromic layer is adjacent to the electrolyte layer;
- wherein the electrochromic material composition comprises a salt, wherein the salt comprises an alkali metal ion M, wherein the salt is $MClO_4$, $MPF_6$, $MBF_4$, $MAsF_6$, $MSbF_6$, $MCF_3SO_3$, $MCF_3CO_2$, $M_2C_2F_4(SO_3)_2$, $MN(CF_3SO_2)_2$, $MN(C_2F_5SO_2)_2$, $MC(CF_3SO_2)_3$, $MC_nF_{2n+1}SO_3$ wherein $2 \le n \le 3$, $MN(RfOSO_2)_2$ wherein Rf is a fluoroalkyl group, or a combination thereof, or wherein the salt is an ionic liquid based on imidazolium, pyridinium, phosphonium or tetraalkyl ammonium; a small molecule organic electrochromic material of formula (I), (I-A), (II), (II-A), or (III), or a combination thereof; and a polymer or copolymer electrochromic of formula (IV), (V), (V-A), (VI), or (VI-A), or a combination thereof;

wherein

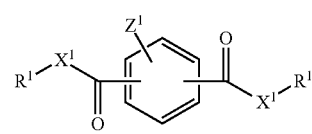

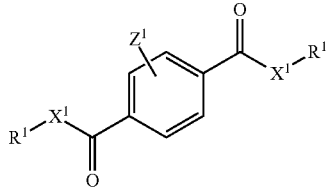

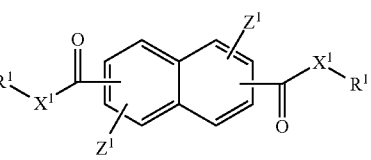

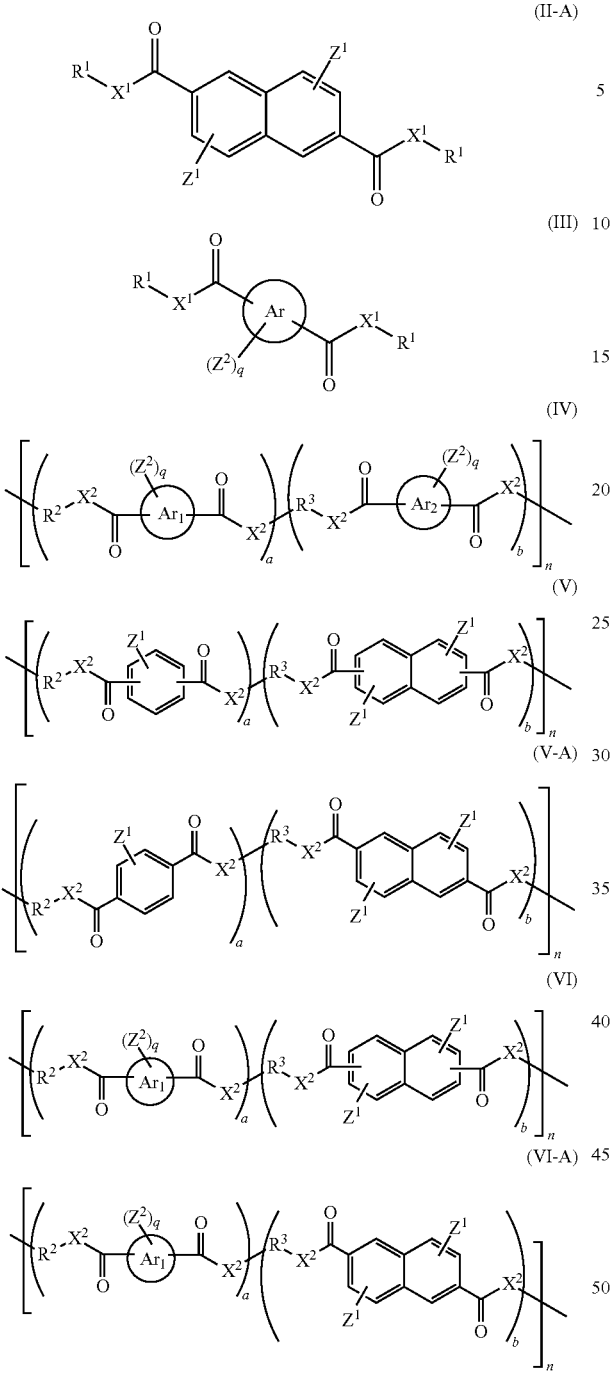

wherein each $X^1$ independently is O, S, or NR; R is H, $C_{1-20}$ alkyl;

each $R^1$ independently is $C_{1-20}$ alkyl;

each $Z^1$ independently is H, $C_{1-20}$ alkyl; halogen, nitro, cyano, hydroxyl, $C_6$-$C_{12}$ aryl, $C_3$-$C_{20}$ cycloalkyl, $C_1$-$C_{20}$ alkyl, $C_1$-$C_{20}$ alkoxy, $C_1$-$C_{20}$ alkylthio, $C_1$-$C_{20}$ haloalkyl, amino, $C_1$-$C_{12}$ alkylamino, or $C_1$-$C_{12}$ diaminoalkyl;

Ar is an aromatic group, specifically anthracene, benzophenone, 2,1,3-benzothiadiazole, dibenzofuran, dibenzothiophene, diphenylfulvene, 1,3-diphenylisobenzofuran, 2,2'-dipyridyl, 4,4'-dipyridyl, fluorene, fluorenone, naphthyl, 2-nitrobiphenyl, phenanthrene, phenyl, pyrene, terphenyl, or triphenylene;

each $Z^2$ independently is $C_{1-20}$ alkyl, halogen, nitro, cyano, hydroxyl, $C_6$-$C_{12}$ aryl, $C_3$-$C_{20}$ cycloalkyl, $C_1$-$C_{20}$ alkyl, $C_1$-$C_{20}$ alkoxy, $C_1$-$C_{20}$ alkylthio, $C_1$-$C_{20}$ haloalkyl, amino, $C_1$-$C_{12}$ alkylamino, or $C_1$-$C_{12}$ diaminoalkyl;

q is 0, 1, 2, 3, or 4;

Ar1 and Ar2 each independently is an aromatic group;

each $X^2$ independently is O, S, or NR;

each $R^2$ and $R^3$ independently is $C_{1-20}$ alkylene, or a poly(alkylene ether), a poly(alkylene glycol) comprising ethyleneoxy, propyleneoxy, and butyleneoxy repeating units containing 2-20 carbon atoms, or a $C_{4-40}$ alkylene chain wherein the chain comprises 1, 2, 3, or 4 $Q^1$ groups within the backbone of the chain, wherein each $Q^1$ independently is O, S, —O(C=O)—, —(O=C)O—, —S(C=O)—, or —(O=C)S—;

a is about 1 to about 99 mol %;

b is about 1 to about 99 mol %; and n is an integer resulting in a polymer or copolymer molecular weight of about 10,000 to about 100,000 g/mol; and wherein the electrochromic material composition optionally further comprises a plasticizer, a solvent, or a combination thereof.

19. The electrochromic device of claim 18, wherein the the salt is $MClO_4$, $MPF_6$, $MBF_4$, $MAsF_6$, $MSbF_6$, $MCF_3SO_3$, $MCF_3CO_2$, $M_2C_2F_4(SO_3)_2$, $MN(CF_3SO_2)_2$, $MN(C_2F_5SO_2)_2$, $MC(CF_3SO_2)_3$, $MC_nF_{2n+1}SO_3$ wherein $2 \leq n \leq 3$, $MN(RfOSO_2)_2$.

20. The electrochromic device of claim 18, wherein the sald is the ionic liquid based on imidazolium, pyridinium, phosphonium or tetraalkyl ammonium.

\* \* \* \* \*